(12) United States Patent
Jang et al.

(10) Patent No.: US 7,952,140 B2
(45) Date of Patent: May 31, 2011

(54) METHODS OF FABRICATING SEMICONDUCTOR DEVICES HAVING MULTIPLE CHANNEL TRANSISTORS AND SEMICONDUCTOR DEVICES FABRICATED THEREBY

(75) Inventors: Se-Myeong Jang, Anyang-si (KR); Makoto Yoshida, Suwon-si (KR); Jae-Rok Kahng, Seoul (KR); Hyun-Ju Sung, Seoul (KR); Hui-Jung Kim, Seoul (KR); Chang-Hoon Jeon, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/705,011

(22) Filed: Feb. 12, 2010

(65) Prior Publication Data

US 2010/0140692 A1    Jun. 10, 2010

Related U.S. Application Data

(62) Division of application No. 11/486,343, filed on Jul. 13, 2006, now Pat. No. 7,691,689.

(30) Foreign Application Priority Data

Nov. 4, 2005   (KR) .................. 10-2005-0105646

(51) Int. Cl.
    H01L 29/66   (2006.01)
(52) U.S. Cl. .......... 257/331; 257/E21.41; 257/E29.028; 257/E29.262
(58) Field of Classification Search .......... 257/331, 257/E21.41, E29.028, E29.262
    See application file for complete search history.

(56) References Cited

U.S. PATENT DOCUMENTS

| 6,872,647 | B1 | 3/2005 | Yu et al. |
| 6,970,372 | B1 | 11/2005 | Furukawa et al. |
| 7,071,048 | B2 | 7/2006 | Son et al. |
| 7,265,059 | B2 | 9/2007 | Rao et al. |
| 7,355,253 | B2 | 4/2008 | Cohen |
| 7,670,909 | B2 * | 3/2010 | Cho .......................... 438/268 |

(Continued)

FOREIGN PATENT DOCUMENTS

KR   1020050035712   4/2005

OTHER PUBLICATIONS

"Methods of Fabricating Semiconductor Devices Having Multiple Channels Transistors and Semiconductor Devices Fabricated Thereby" Specification, Drawings, and Prosecution History of U.S. Appl. No. 11/486,343, filed Jul. 13, 2006 by Se-Myeong Jang, et al., which is stored in the United States Patent and Trademark Office (USPTO) Image File Wrapper (IFW) system.

*Primary Examiner* — Alexander G Ghyka
*Assistant Examiner* — Seahvosh J Nikmanesh
(74) *Attorney, Agent, or Firm* — Mills & Onello, LLP

(57) ABSTRACT

In methods of fabricating a semiconductor device having multiple channel transistors and semiconductor devices fabricated thereby, the semiconductor device includes an isolation region disposed within a semiconductor substrate and defining a first region. A plurality of semiconductor pillars self-aligned with the first region and spaced apart from each other are disposed within the first region, and each of the semiconductor pillars has at least one recessed region therein. At least one gate structure may be disposed across the recessed regions, which crosses the semiconductor pillars and extends onto the isolation region.

20 Claims, 50 Drawing Sheets

U.S. PATENT DOCUMENTS

| | | |
|---|---|---|
| 2005/0056888 A1 | 3/2005 | Youn et al. |
| 2005/0077553 A1 | 4/2005 | Kim et al. |
| 2005/0121412 A1 | 6/2005 | Beintner et al. |
| 2005/0239254 A1 | 10/2005 | Chi et al. |
| 2006/0046407 A1 | 3/2006 | Juengling |
| 2006/0081895 A1 | 4/2006 | Lee et al. |
| 2006/0088967 A1 | 4/2006 | Hsiao et al. |
| 2007/0105334 A1 | 5/2007 | Jang et al. |

* cited by examiner

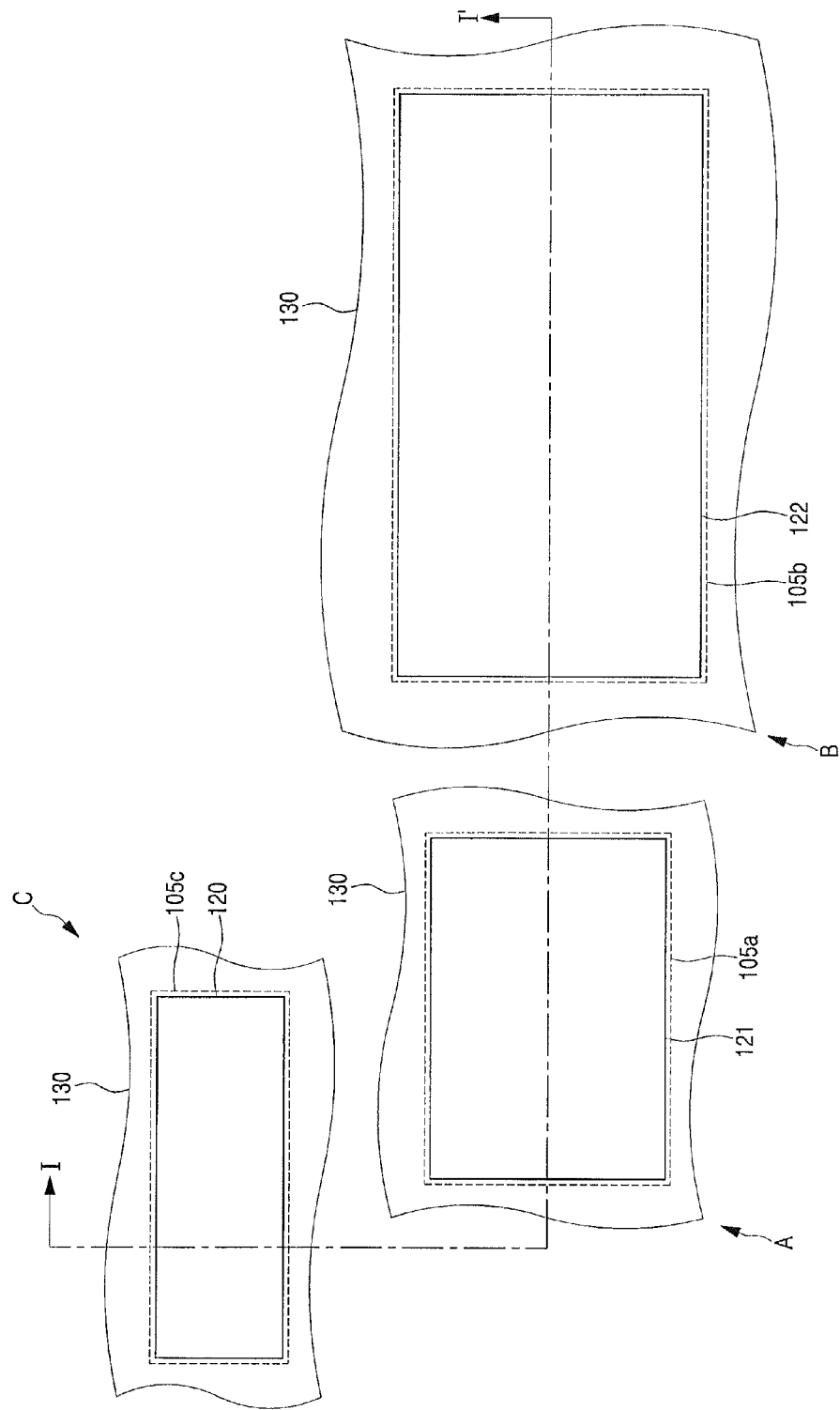

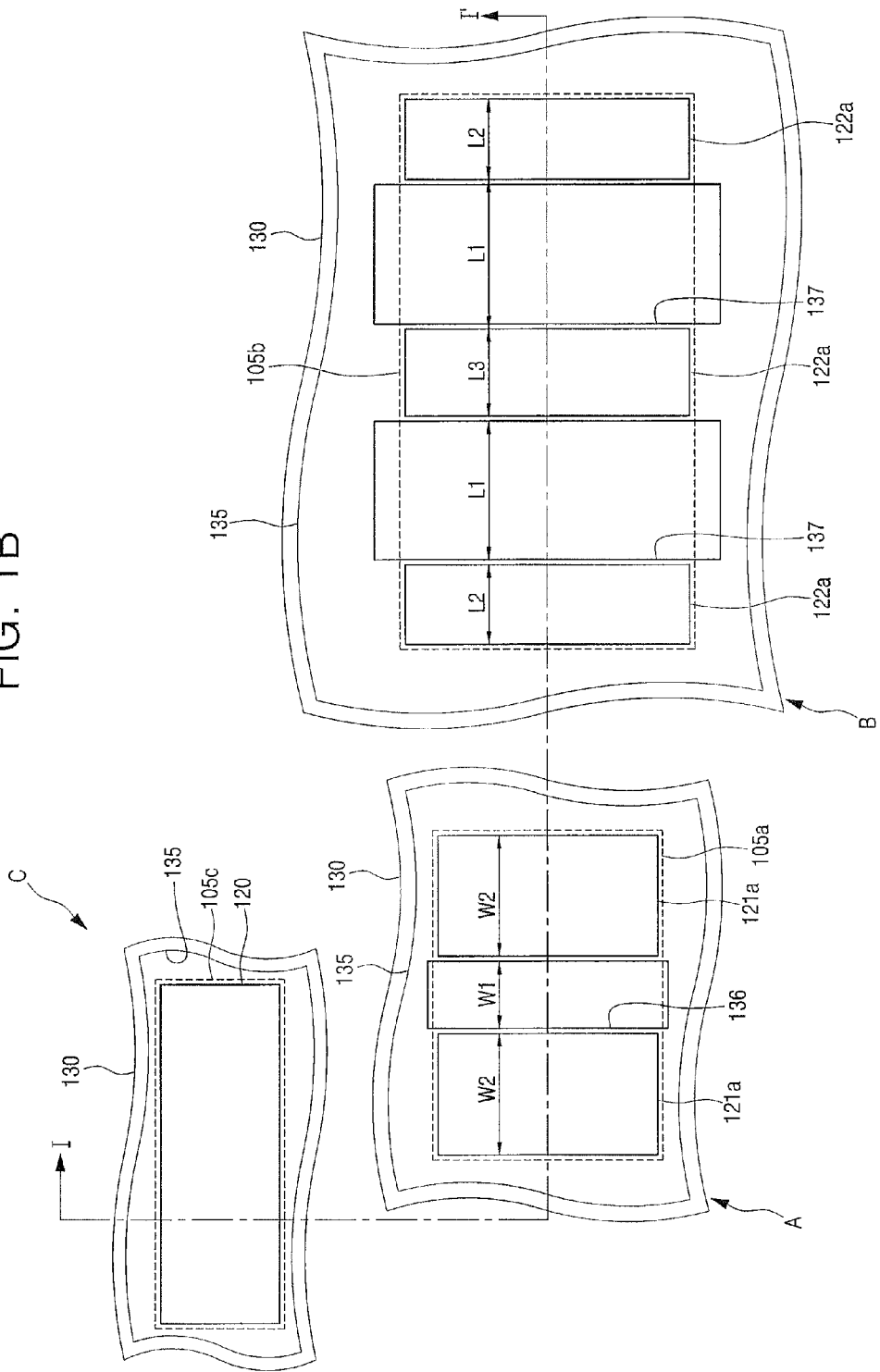

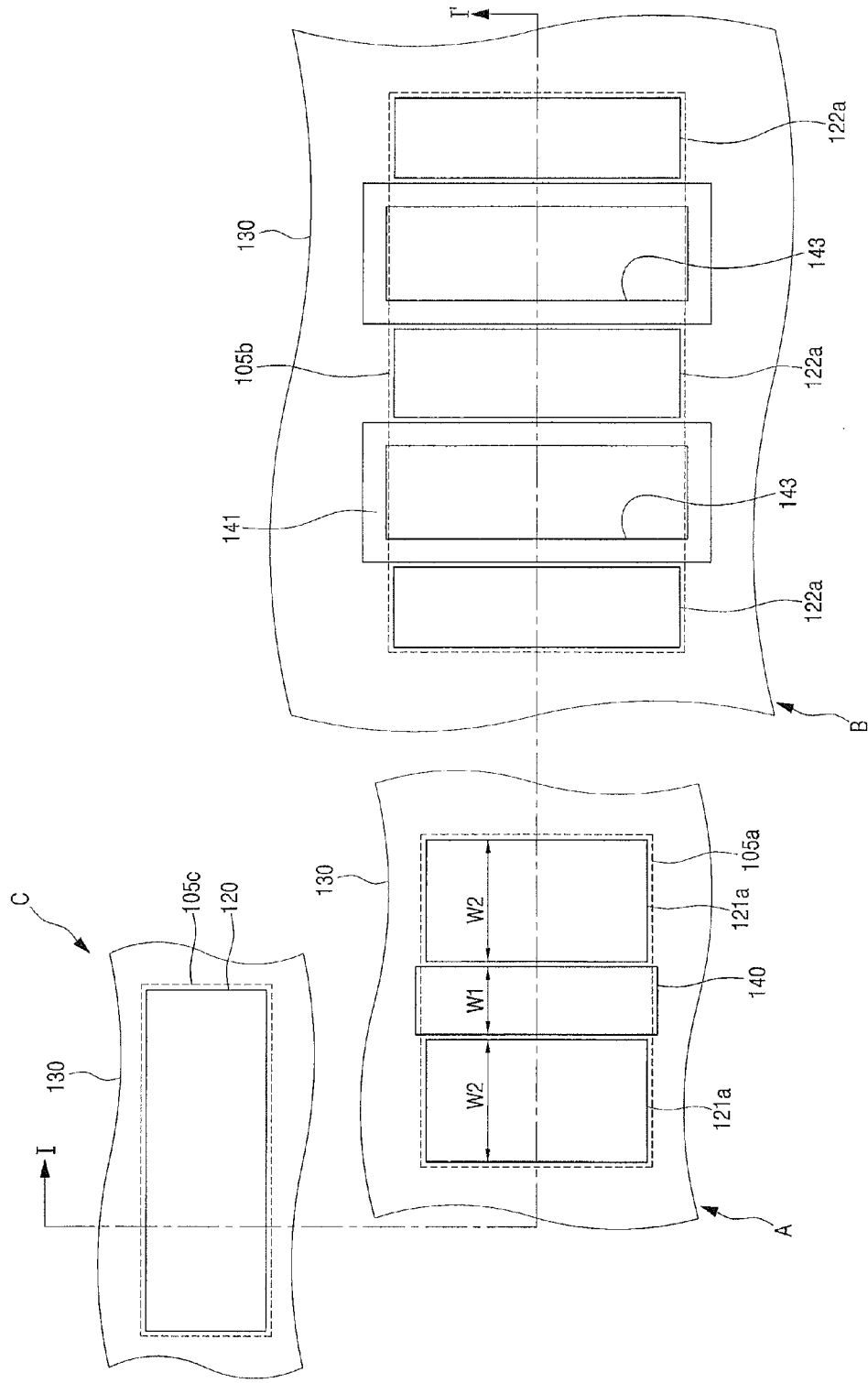

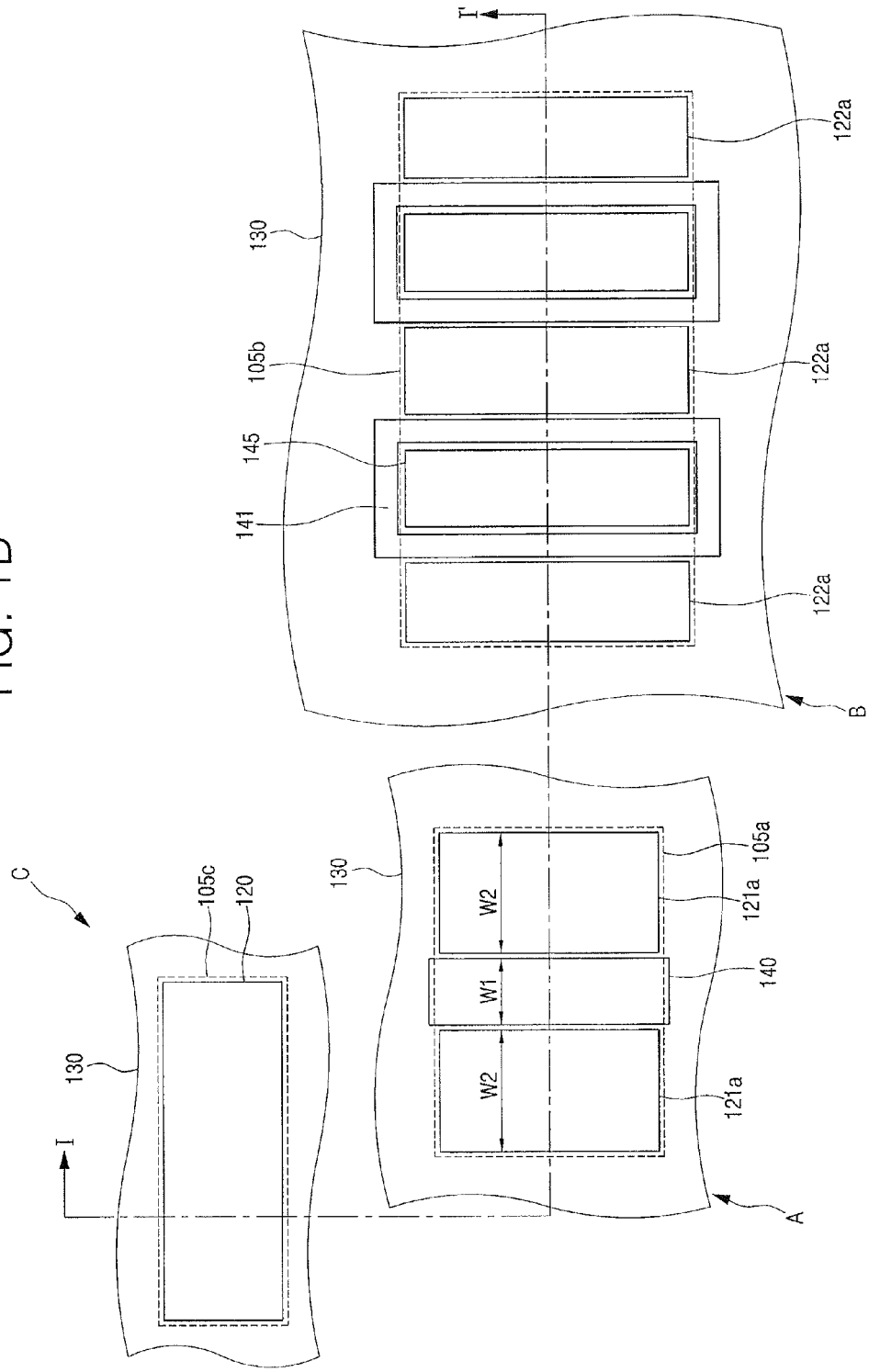

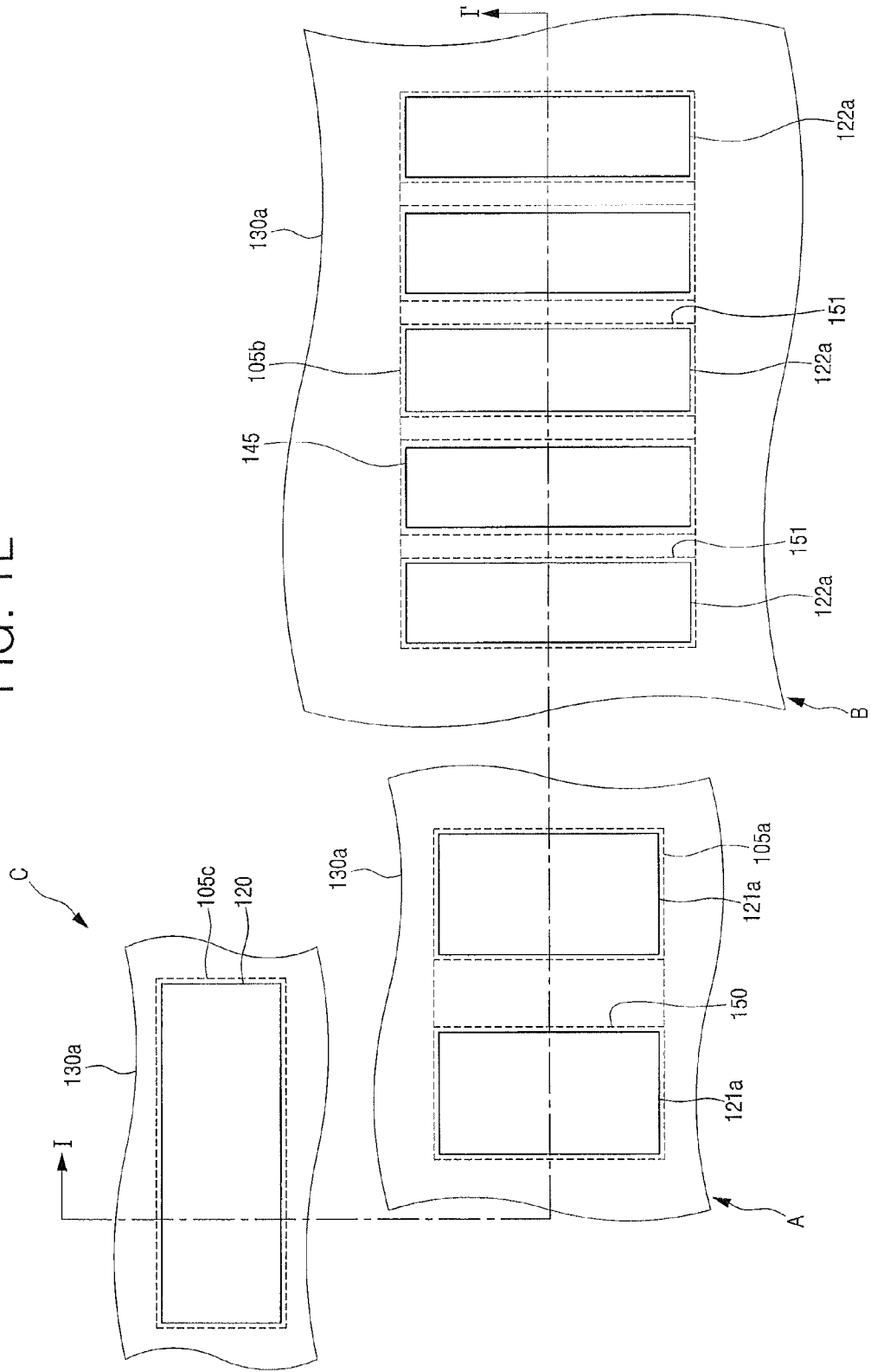

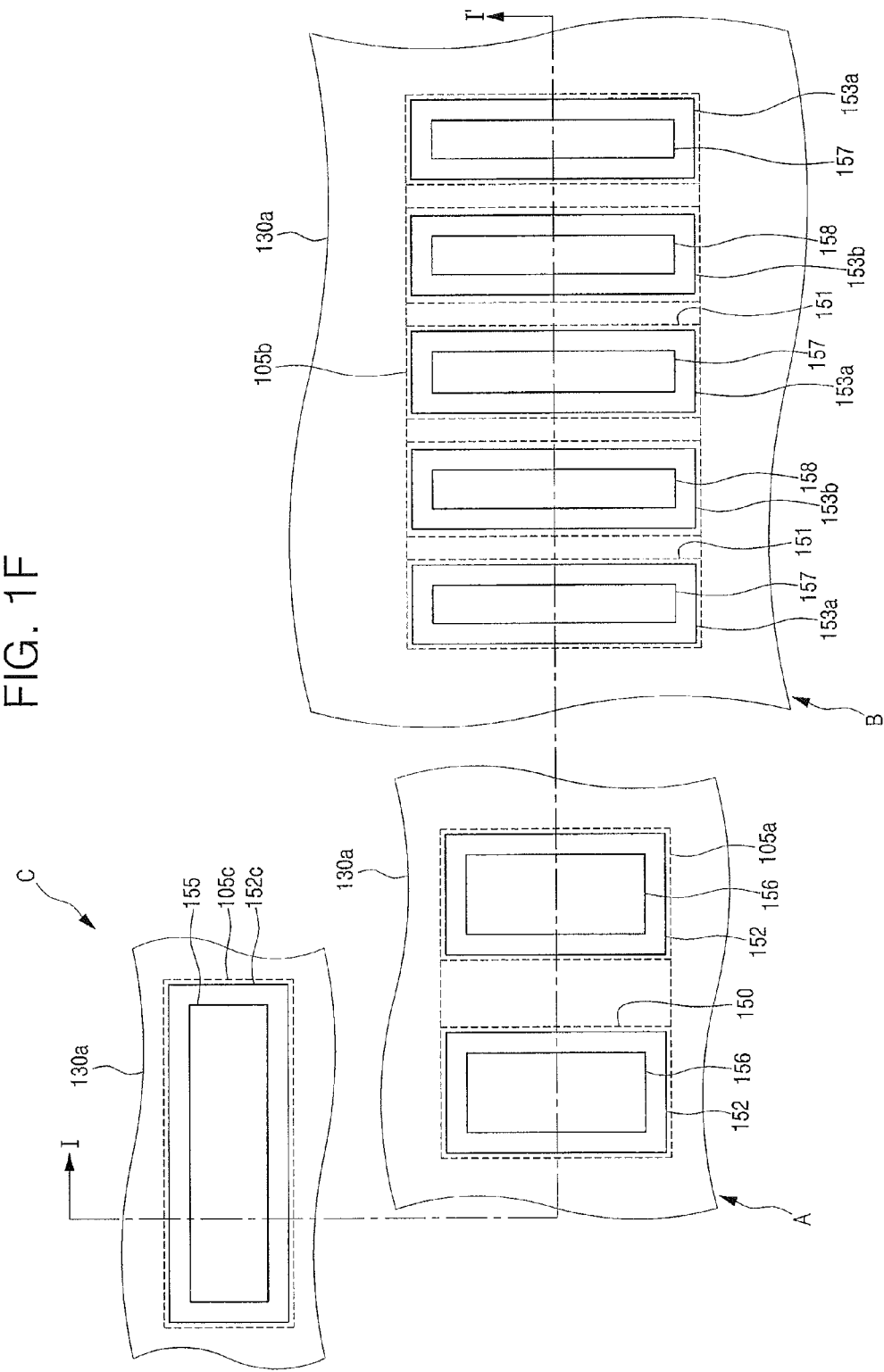

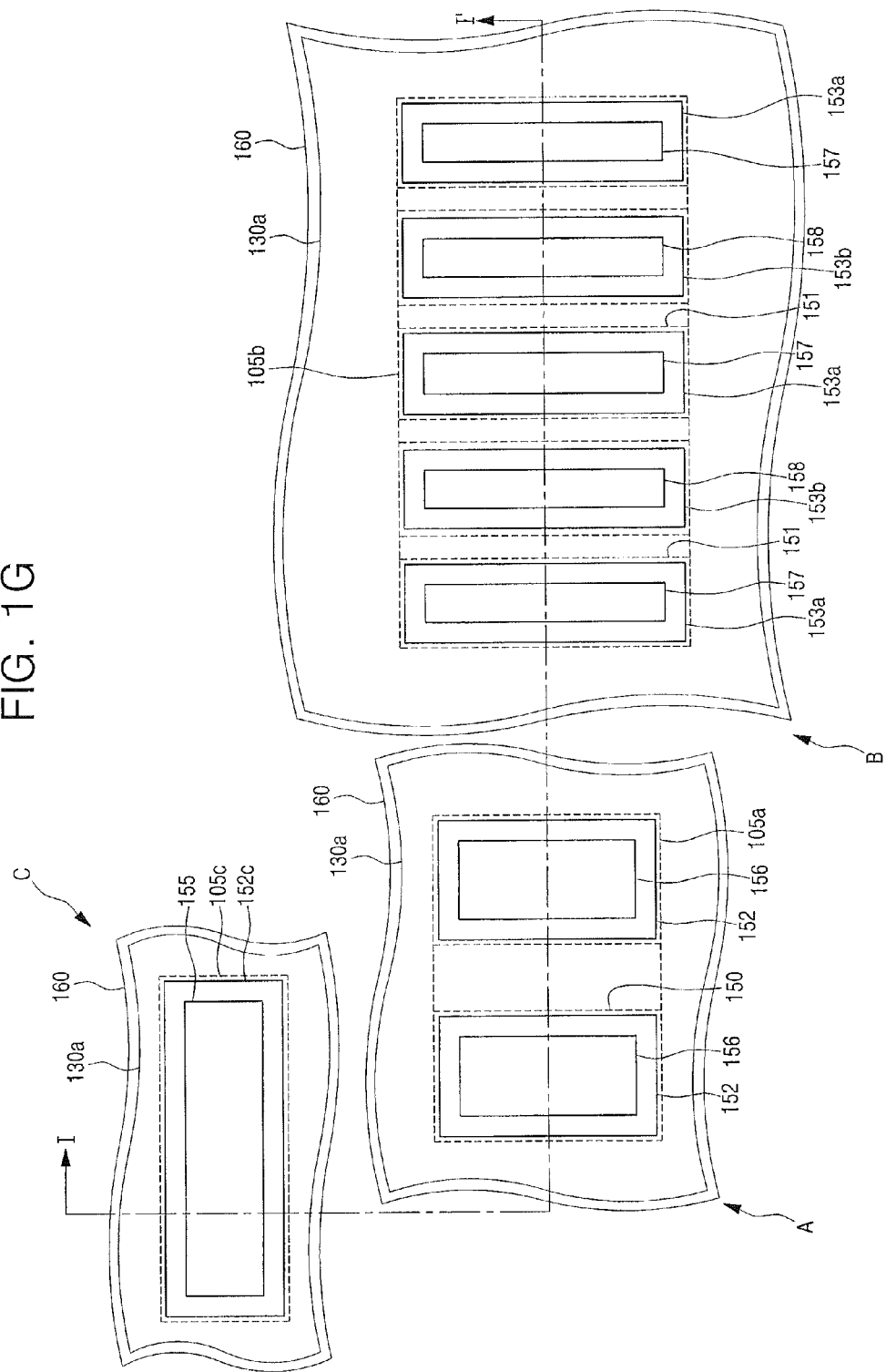

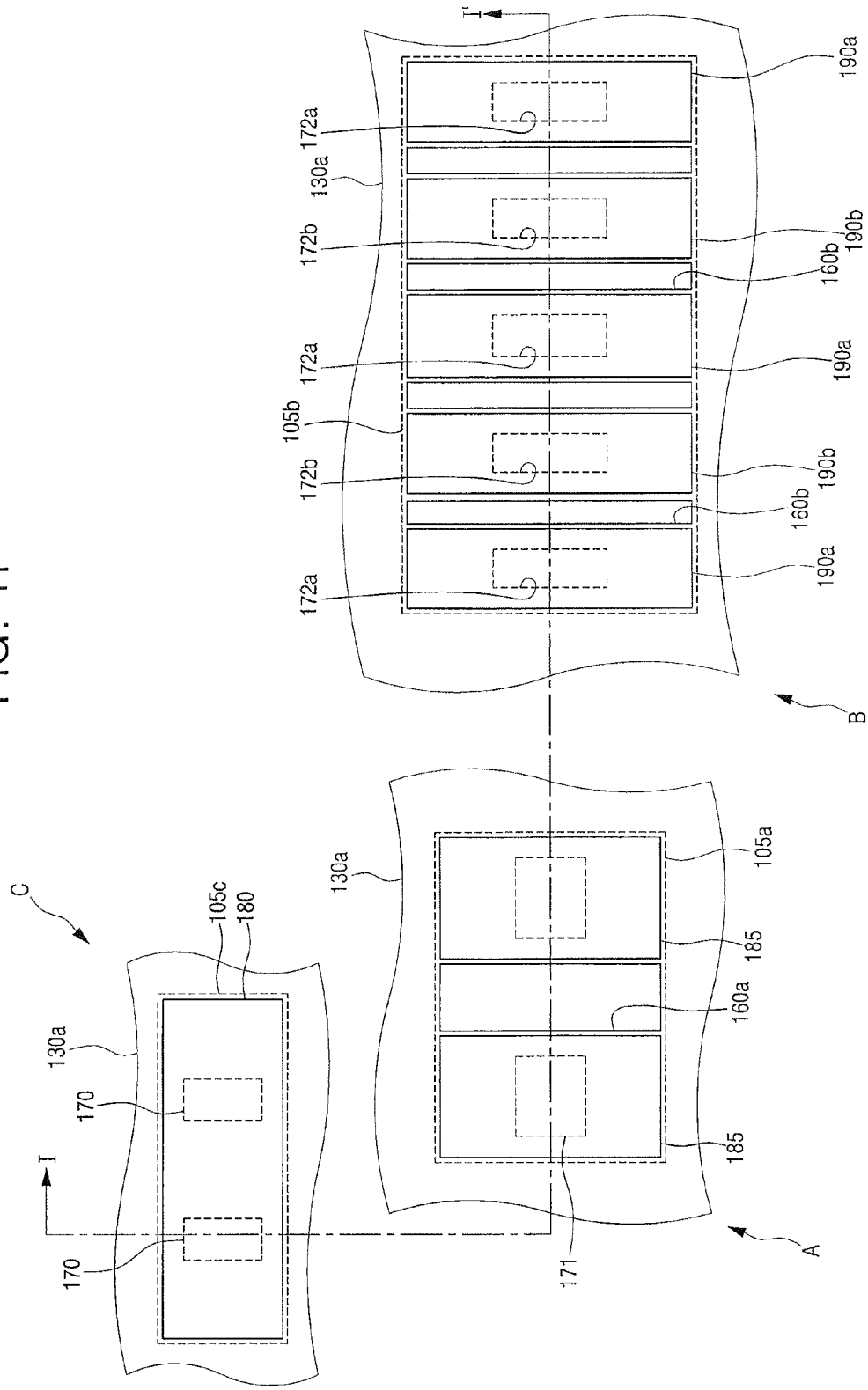

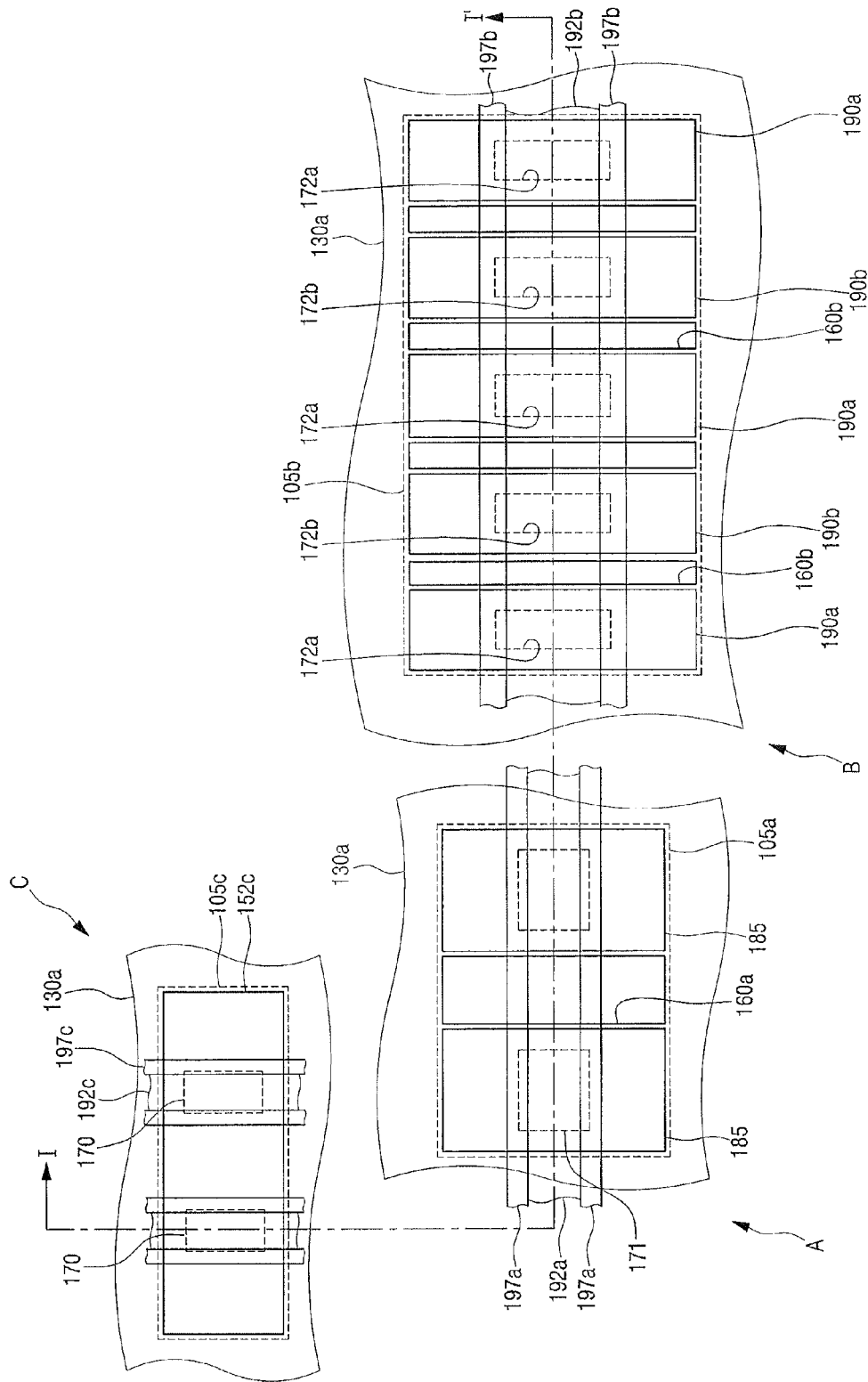

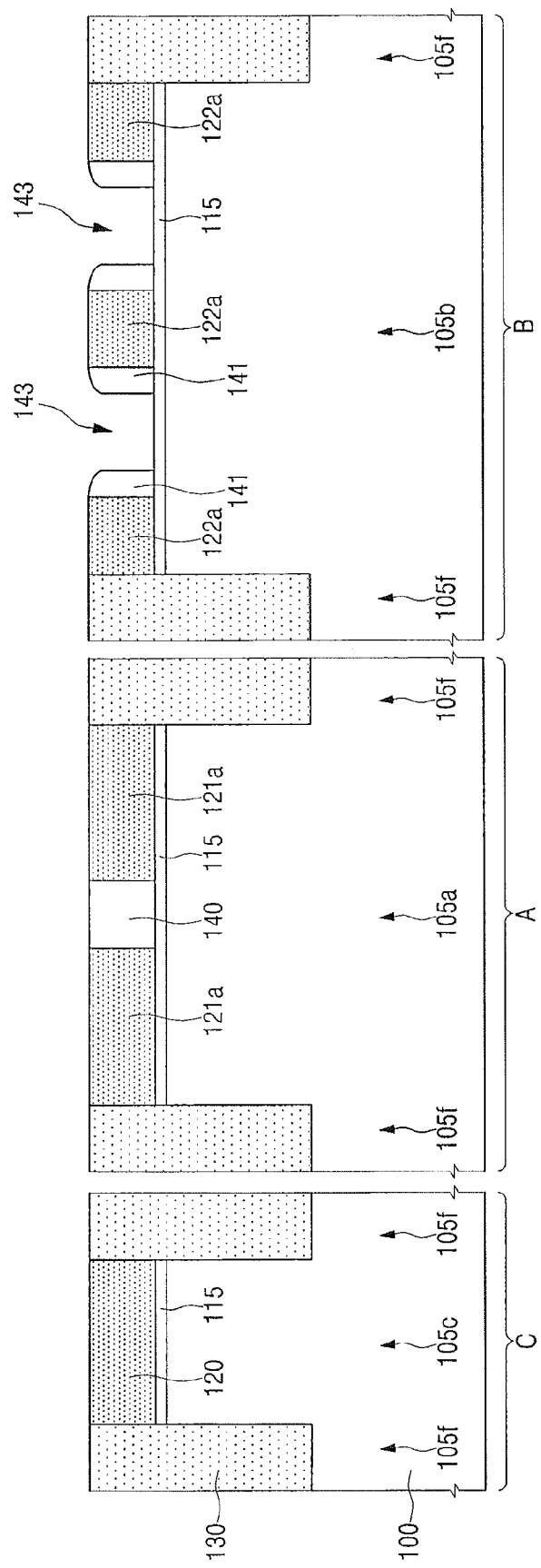

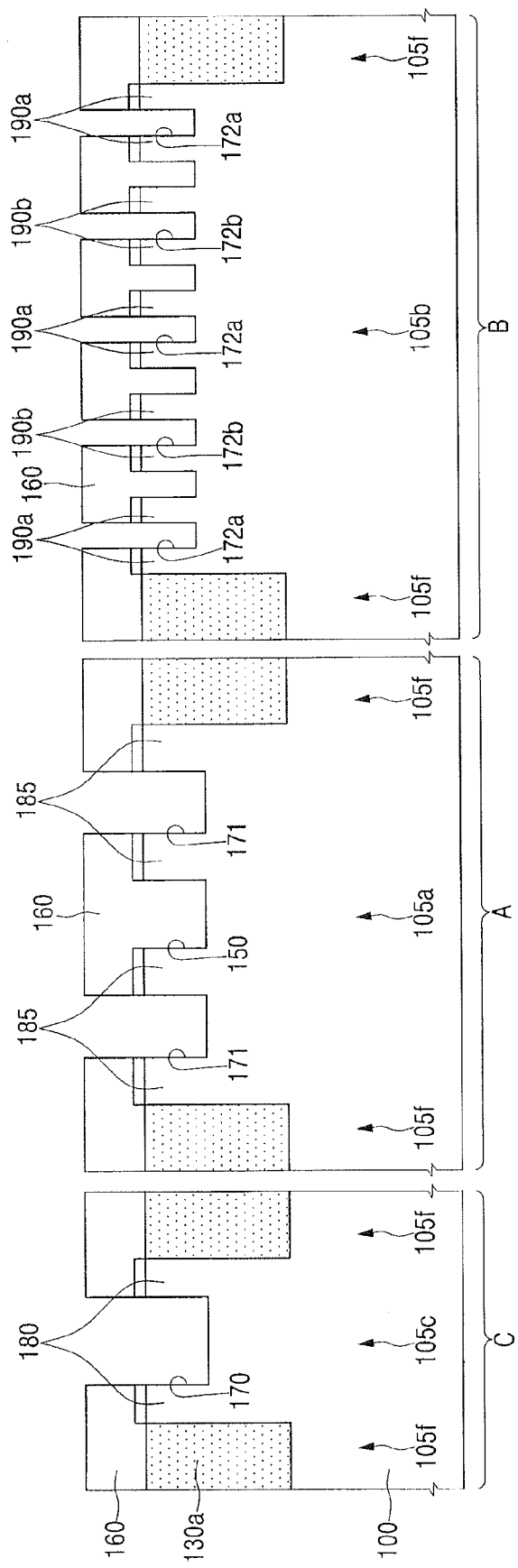

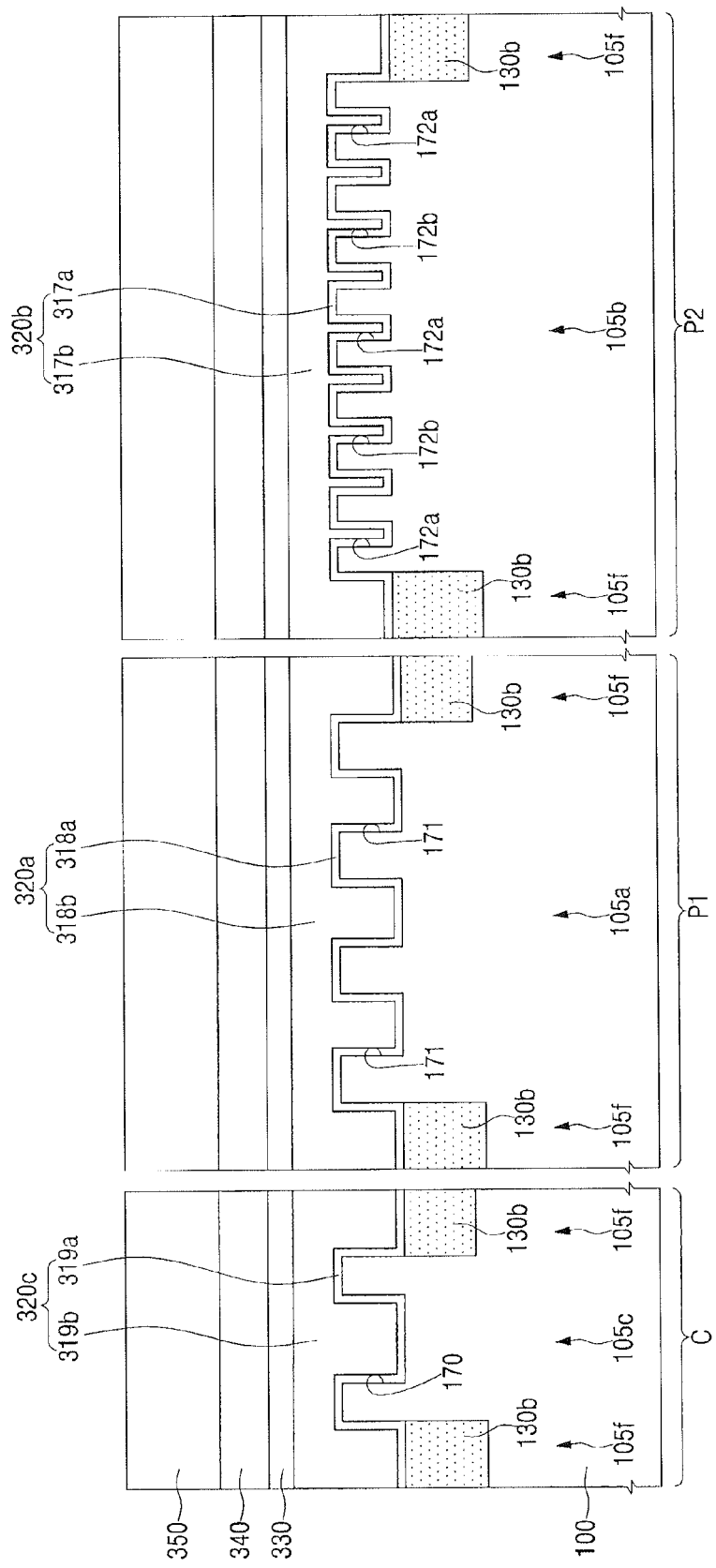

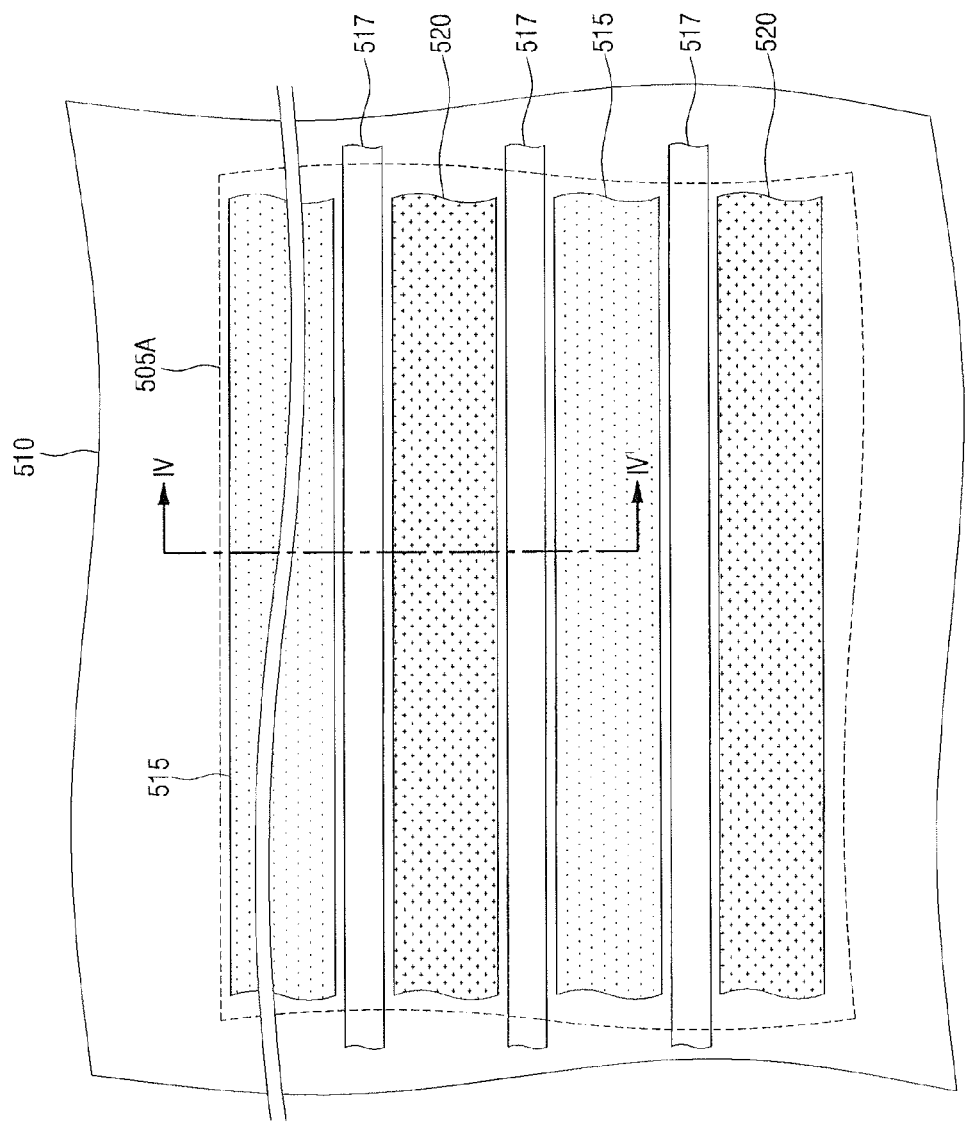

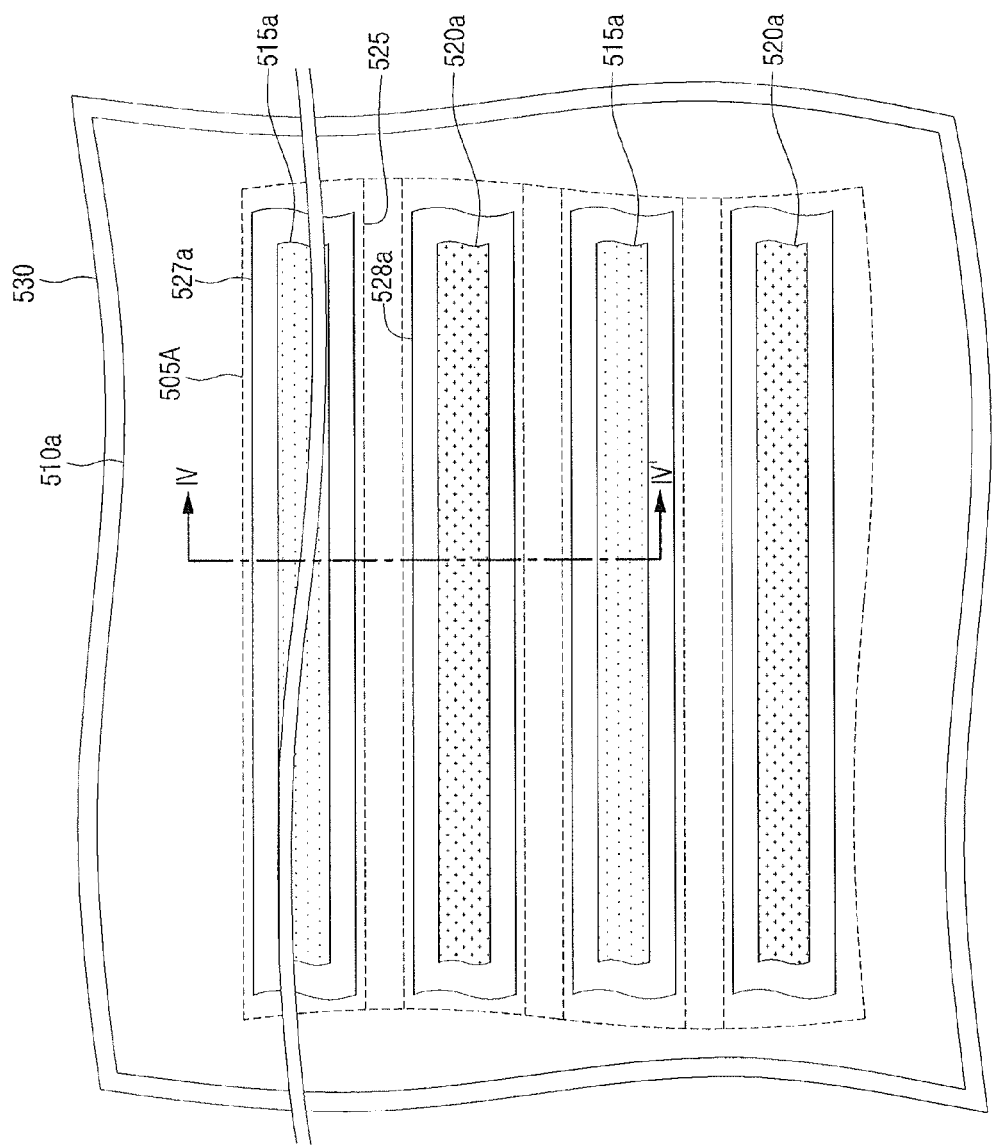

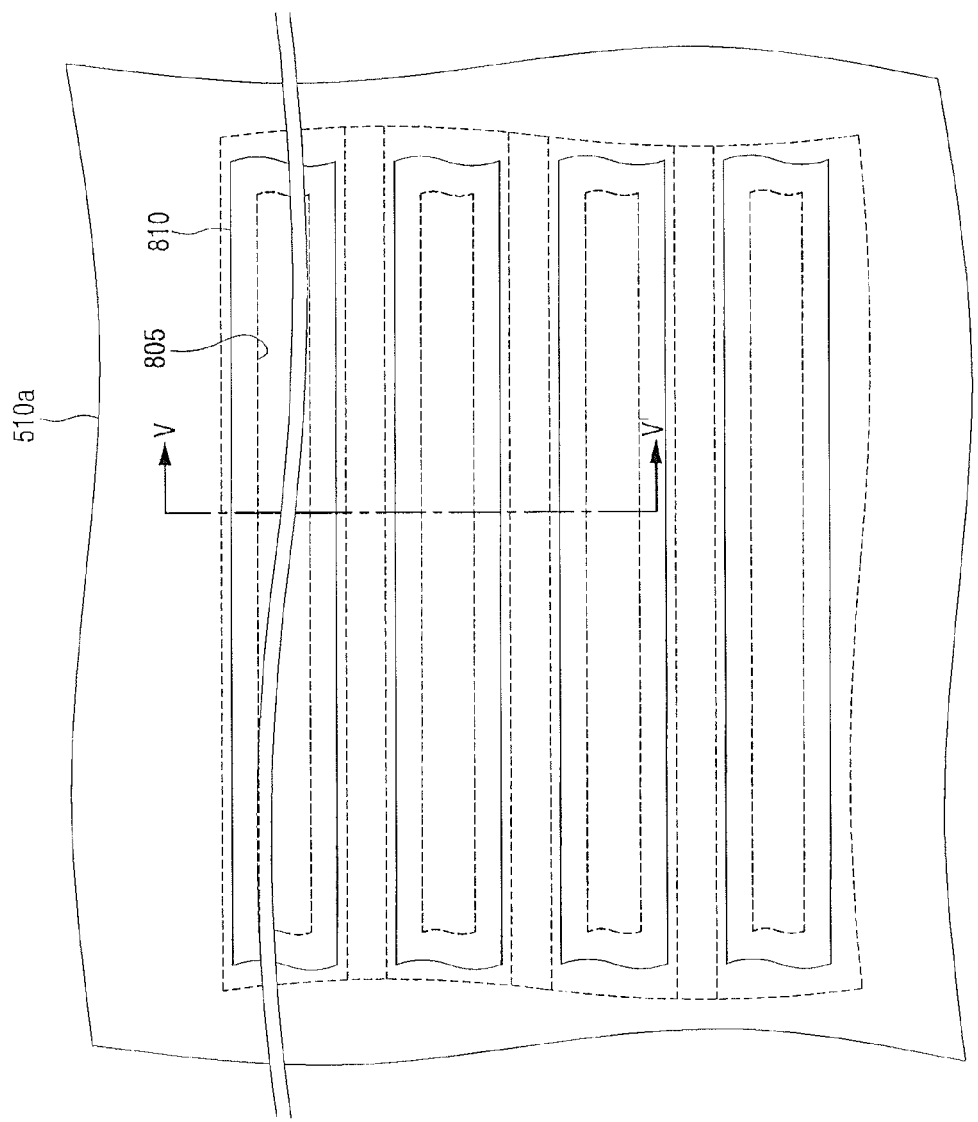

METHODS OF FABRICATING SEMICONDUCTOR DEVICES HAVING MULTIPLE CHANNEL TRANSISTORS AND SEMICONDUCTOR DEVICES FABRICATED THEREBY

RELATED APPLICATIONS

This application is a divisional application of U.S. patent application Ser. No. 11/486,343, filed on Jul. 13, 2006, which claims priority to Korean patent application number 10-2005-0105646, filed on Nov. 4, 2005, in the Korean Intellectual Property Office, the contents of which applications are incorporated herein in their entirety by reference.

BACKGROUND OF THE INVENTION

1. Field of the Invention

The present invention relates to a semiconductor device, and more particularly, to a method of fabricating a semiconductor device having multiple channel regions and a semiconductor device fabricated thereby.

2. Description of the Related Art

Semiconductor device widely employs discrete devices such as a field effect transistor (FET) as a switching device. On-current flowing through a channel between a source and a drain of the transistor determines the operating speed of the device. Typically, a gate electrode, and source and drain regions are formed in a device-forming region of a substrate, i.e., an active region, so that a planar-type transistor is formed. The planar-type transistor typically has a planar channel between its source and drain. On-current of the planar-type transistor is proportional to the width of the active region, and is inversely proportional to the distance between the source and drain, i.e., the gate length. Accordingly, in order to increase the operating speed of the device by increasing the on-current, the gate length should be decreased, and the width of the active region should be increased. However, as deep device integration increases, further increase in the width of the active region of planar devices becomes impossible in the planar-type transistor.

Recently, a phase change memory device has been proposed. A unit cell of the phase change memory device includes a switching device (i.e., a cell transistor) and a data storage element serially connected to the switching device. The data storage element has a lower electrode electrically connected to the switching device, and a phase change material layer contacting the lower electrode. In general, the lower electrode operates as a heater. When a write current (i.e., a program current) flows through the switching device and the lower electrode, a Joule heat is generated at an interface between the phase change material layer and the lower electrode. Such Joule heat transforms the phase change material layer into an amorphous state or crystalline state. The phase transition of the phase change material layer requires a large programming current of about 1 mA. Accordingly, the cell transistor should be designed to have current drivability enough to provide the write current. However, in order to enhance the current drivability of the cell transistor, an area occupied by the cell transistor should be increased. In particular, when the cell transistor is a planar-type Metal Oxide Semiconductor (MOS) transistor, the write current is directly associated with a channel width of the planar-type MOS transistor.

A technique for increasing the channel width of the MOS transistor is proposed in U.S. Pat. No. 6,872,647 B1 entitled "METHOD FOR FORMING MULTIPLE FINS IN A SEMICONDUCTOR DEVICE" to Yu et al., and incorporated herein by reference.

SUMMARY OF THE INVENTION

An embodiment of the present invention provides methods of fabricating a semiconductor device having a multiple channel transistor.

Another embodiment of the present invention provides methods of fabricating a semiconductor device having multiple channel transistors.

In one aspect, the present invention is directed to methods of fabricating multiple channel transistors comprising: forming an isolation region defining an active region within a semiconductor substrate; forming a plurality of preliminary semiconductor pillars within the active region, the preliminary semiconductor pillars being self-aligned with the active region and spaced apart from each other; etching at least a portion of each of the preliminary semiconductor pillars, thereby forming semiconductor pillars each having at least one recessed region; and forming at least one gate structure crossing the semiconductor pillars, the gate structure crossing the recessed regions.

In one embodiment, the step of forming the preliminary semiconductor pillars comprises: forming first and second hard masks on the active region, the first and second hard masks being self-aligned with the active region and spaced apart from each other; and etching the substrate between the first and second hard masks.

In another embodiment, the step of forming the first and second hard masks comprises: forming first hard masks on the active region, the first hard masks being self-aligned with the active region and spaced apart from each other, forming sacrificial spacers covering sidewalls of the first hard masks, forming a second hard mask between the first hard masks having the sidewalls covered by the sacrificial spacers, and removing the sacrificial spacers.

In another embodiment, the step of forming the semiconductor pillars comprises: isotropically etching the first and second hard masks and forming first and second hard mask patterns, forming a buffer insulating layer on the substrate having the first and second hard mask patterns, the buffer insulating layer exposing top surfaces of the first and second hard mask patterns; forming a first photoresist pattern having an opening crossing the first and second hard mask patterns on the substrate having the buffer insulating layer, sequentially etching the first and second hard mask patterns exposed by the first photoresist pattern, and the substrate below each of the first and second hard mask patterns to form the recessed regions, removing the first photoresist pattern and the remaining first and second hard mask patterns, and partially etching the buffer insulating layer to expose at least top surfaces of the semiconductor pillars.

In another embodiment, the methods further comprises after partially etching the buffer insulating layer, forming a second photoresist pattern crossing the active region and having an opening extending onto the isolation region, the second photoresist pattern having an opening exposing the recessed region, etching the remaining buffer insulating layer using the second photoresist pattern as an etch mask while partially etching the isolation region exposed by the second photoresist pattern, and removing the second photoresist pattern.

In another embodiment, a surface of the substrate disposed between the semiconductor pillars within the active region is higher than a bottom surface of the isolation region.

In another embodiment, the recessed regions have bottom surfaces higher than a bottom surface of the isolation region.

In another aspect, the present invention is directed to methods of fabricating multiple channel transistors comprising: forming an isolation region defining a cell array region within a semiconductor substrate; forming an isolation trench crossing the cell array region within the cell array region to define preliminary semiconductor pillars self-aligned with the cell array region and spaced apart from each other; etching at least a portion of each of the preliminary semiconductor pillars to form semiconductor pillars, each of the semiconductor pillars having at least one recessed region; forming an isolation insulating layer between the semiconductor pillars; and forming at least one gate structure crossing the semiconductor pillars and the isolation insulating layer, the gate structure crossing the recessed regions.

In one embodiment, the isolation trench has a bottom surface disposed on substantially the same level as a bottom surface of the isolation region.

In another embodiment, the step of forming the isolation trench comprises: forming first and second hard masks on the cell array region, the first and second hard masks being self-aligned with the cell array region and spaced apart from each other; and etching the substrate between the first and second hard masks.

In another embodiment, the step of forming the first and second hard masks comprises: forming first hard masks on the cell array region, the first hard masks being self-aligned with the cell array region and spaced apart from each other; forming sacrificial spacers covering sidewalls of the first hard masks; forming a second hard mask between the first hard masks having the sidewalls covered by the sacrificial spacers; and removing the sacrificial spacers.

In another embodiment, the step of forming the semiconductor pillars comprises: isotropically etching the first and second hard masks, thereby forming first and second hard mask patterns; forming a preliminary isolation insulating layer on the substrate having the first and second hard mask patterns, the preliminary isolation region exposing top surfaces of the first and second hard mask patterns; forming a first photoresist pattern crossing the cell array region and having an opening intersecting the first and second hard mask patterns; etching predetermined regions of the first and second hard mask patterns using the first photoresist pattern as an etch mask to expose predetermined regions of the preliminary semiconductor pillars; and etching the exposed predetermined regions of the preliminary semiconductor pillars.

In another embodiment, the step of forming the isolation insulating layer comprises: removing the remaining first and second hard mask patterns; and partially etching the preliminary isolation insulating layer to expose at least top surfaces of the semiconductor pillars.

In another embodiment, the recessed regions have bottom surfaces higher than a bottom surface of the isolation trench.

In another embodiment, the method further comprising: forming source and drain regions in the semiconductor pillars disposed at both sides of the gate structures; forming a first interlayer insulating layer on the substrate having the source and drain regions; and forming a plurality of parallel bit lines on the first interlayer insulating layer, wherein each of the bit lines crosses one of the source and drain regions while extending to overlap the isolation insulating layers disposed at both sides of the source and drain regions.

In another embodiment, the recessed regions have bottom surfaces disposed on substantially the same level as a bottom surface of the isolation region.

In another embodiment, the method further comprises, after forming the isolation insulating layer, forming a recessed region insulating layer filling the recessed regions, wherein the recessed region insulating layer is formed of a material layer having substantially the same etch rate as the isolation insulating layer, and disposed on substantially the same level as the isolation insulating layer.

In another embodiment, the method further comprising: when top surfaces of the recessed region insulating layer and the isolation insulating layer are disposed on substantially the same level as top surfaces of the semiconductor pillars after the recessed region insulating layer is formed, forming a second photoresist pattern crossing the cell array region and having an opening intersecting the recessed region insulating layer and the isolation insulating layer; partially etching the recessed region insulating layer and the isolation insulating layer using the second photoresist pattern as an etch mask; and removing the second photoresist patterns.

In another embodiment, the method further comprising: forming source and drain regions within the semiconductor pillars disposed at both sides of the gate structure; forming a first interlayer insulating layer on the substrate having the source and drain regions; and forming bit lines on the first interlayer insulating layer, wherein each of the bit lines crosses one of the source and drain regions while extending to overlap the recessed region insulating layer and the isolation insulating layer disposed at both sides of the source and drain regions.

In another embodiment, the method further comprising: forming a second interlayer insulating layer on the substrate having the gate structure; forming a contact structure penetrating the second interlayer insulating layer and connected to one of the semiconductor pillars disposed at both sides of the gate structure; and forming a capacitor or a non-volatile data storage element structure electrically connected to the contact structure on the second interlayer insulating layer.

In another aspect, the present invention is directed to methods of fabricating multiple channel transistors comprising: providing a semiconductor substrate having a first and second isolation regions, the first and second isolation regions defining an active region; forming a first semiconductor pillar having sidewalls in the active region, a portion of the sidewalls of the first semiconductor pillar in contact with the first isolation region; forming a second and a third semiconductor pillars in the active regions, the second and third semiconductor pillars being spaced apart from the first semiconductor pillar respectively, thereby forming a first recessed region between the first and second semiconductor pillars and a second recessed region between the second and third semiconductor pillars; forming a buffer insulating layer pattern in the second recessed region; forming a gate dielectric layer on the surface of the first semiconductor pillars, the second semiconductor pillars, the third semiconductor pillars, the first recessed region, and the buffer insulating layer pattern; and forming a gate electrode on the gate dielectric layer.

In one embodiment, the gate dielectric layer on the buffer insulating layer pattern has a thickness that is less than that of other portions.

In another embodiment, the method further comprising forming a fourth semiconductor pillar, the fourth semiconductor pillar in contact with the second isolation region and spaced apart from the third semiconductor pillar.

In another embodiment, the method further comprising forming at least one more semiconductor pillars between the third and fourth semiconductor pillars.

In another embodiment, the top surface of the buffer insulating layer pattern has same elevation with, or is at a same level as, the top surface of the first, second, and third semiconductor pillar.

In another embodiment, the top surface of the first, second, and third semiconductor pillars have higher elevation than the top surface of the first and second isolation regions.

In another embodiment, the bottom portion of the first and second recessed regions have substantially same elevation with the top of the first and second isolation regions.

In another embodiment, the top of the first, second, and third semiconductor pillars have same elevation with the top of the first and second isolation regions.

In another embodiment, the bottom of the buffer insulating layer pattern has substantially same elevation with the bottom of the first recessed region.

In another aspect, the present invention is directed to methods of fabricating multiple channel transistors comprising: providing a semiconductor substrate having a first and second isolation regions, the first and second isolation regions defining an active region; forming a first semiconductor pillar having sidewalls in the active region, a portion of the sidewalls of the first semiconductor pillar in contact with the first isolation region; forming a second and a third semiconductor pillars in the active regions, the second and third semiconductor pillars being spaced apart from the first semiconductor pillar respectively, thereby forming a first recessed region between the first and second semiconductor pillars and a second recessed region between the second and third semiconductor pillars; forming a first buffer insulating layer pattern in the first recessed region; forming a second buffer insulating layer pattern in the second recessed region; forming a gate dielectric layer on the surface of the first semiconductor pillars, the second semiconductor pillars, the third semiconductor pillars, the first buffer insulating layer pattern, and the second buffer insulating layer pattern; and forming a gate electrode on the gate dielectric layer.

In one embodiment, the top of the first and second buffer insulating layer pattern have lower elevation than the top of the first, second, and third semiconductor pillars.

In one embodiment, the bottoms of the first and second buffer insulating layer pattern have substantially same elevation with the bottom of the first and second isolation regions.

In another aspect, the present invention is directed to a semiconductor device having a multiple channel transistors comprising: a semiconductor substrate having a first and second isolation regions, the first and second isolation regions defining an active region; a first semiconductor pillar having sidewalls in the active region, a portion of the sidewalls of the first semiconductor pillar in contact with the first isolation region; a second and a third semiconductor pillars in the active regions, the second and third semiconductor pillars being spaced apart from the first semiconductor pillar respectively; a first recessed region between the first and second semiconductor pillars; a second recessed region between the second and third semiconductor pillars; a buffer insulating layer pattern in the second recessed region; a gate dielectric layer on the surface of the first semiconductor pillars, the second semiconductor pillars, the third semiconductor pillars, the first recessed region, and the buffer insulating layer pattern; and a gate electrode on the gate dielectric layer.

In one embodiment, the gate dielectric layer on the buffer insulating layer pattern has a thickness that is less than that of other portions.

In another embodiment, the device further comprises a fourth semiconductor pillar, the fourth semiconductor pillar in contact with the second isolation region and spaced apart from the third semiconductor pillar.

In another embodiment, the device further comprises further comprising at least one more semiconductor pillars between the third and fourth semiconductor pillars.

In another embodiment, the top surface of the buffer insulating layer pattern has same elevation with the top surface of the first, second, and third semiconductor pillar.

In another embodiment, the top surface of the first, second, and third semiconductor pillars have higher elevation than the top surface of the first and second isolation regions.

In another embodiment, the bottom portion of the first and second recessed regions have substantially same elevation with the top of the first and second isolation regions.

In another embodiment, the top of the first, second, and third semiconductor pillars have same elevation with the top of the first and second isolation regions.

In another embodiment, the bottom of the buffer insulating layer pattern has substantially same elevation with the bottom of the first recessed region.

In another aspect, the present invention is directed to a semiconductor device having a multiple channel transistors comprising: a semiconductor substrate having a first and second isolation regions, the first and second isolation regions defining an active region; a first semiconductor pillar having sidewalls in the active region, a portion of the sidewalls of the first semiconductor pillar in contact with the first isolation region; a second and a third semiconductor pillars in the active regions, the second and third semiconductor pillars being spaced apart from the first semiconductor pillar respectively; a first recessed region between the first and second semiconductor pillars; a second recessed region between the second and third semiconductor pillars; a first buffer insulating layer pattern in the first recessed region; a second buffer insulating layer pattern in the second recessed region; a gate dielectric layer on the surface of the first semiconductor pillars, the second semiconductor pillars, the third semiconductor pillars, the first buffer insulating layer pattern, and the second buffer insulating layer pattern; and a gate electrode on the gate dielectric layer.

In one embodiment, the top of the first and second buffer insulating layer pattern have lower elevation than the top of the first, second, and third semiconductor pillars.

In another embodiment, the bottom portions of the first and second buffer insulating layer pattern have substantially same elevation with the bottom of the first and second isolation regions.

BRIEF DESCRIPTION OF THE DRAWINGS

The foregoing and other objects, features and advantages of the invention will be apparent from the more particular description of a preferred embodiment of the invention, as illustrated in the accompanying drawings. The drawings are not necessarily to scale, emphasis instead being placed upon illustrating the principles of the invention.

FIGS. 1A to 1K are plan views illustrating methods of fabricating a semiconductor device in accordance with embodiments of the present invention.

FIGS. 2A to 2L are cross-sectional views illustrating methods of fabricating the semiconductor device in accordance with embodiments of the present invention.

FIGS. 4A to 4E are cross-sectional views illustrating methods of fabricating the semiconductor device in accordance with other embodiments of the present invention.

FIGS. 5A to 5H are plan views illustrating methods of fabricating a semiconductor device in accordance with still other embodiments of the present invention.

FIGS. 7A to 7D are plan views illustrating methods of fabricating a semiconductor device in accordance with yet other embodiments of the present invention.

DETAILED DESCRIPTION OF EMBODIMENTS OF THE INVENTION

Figure 1H:
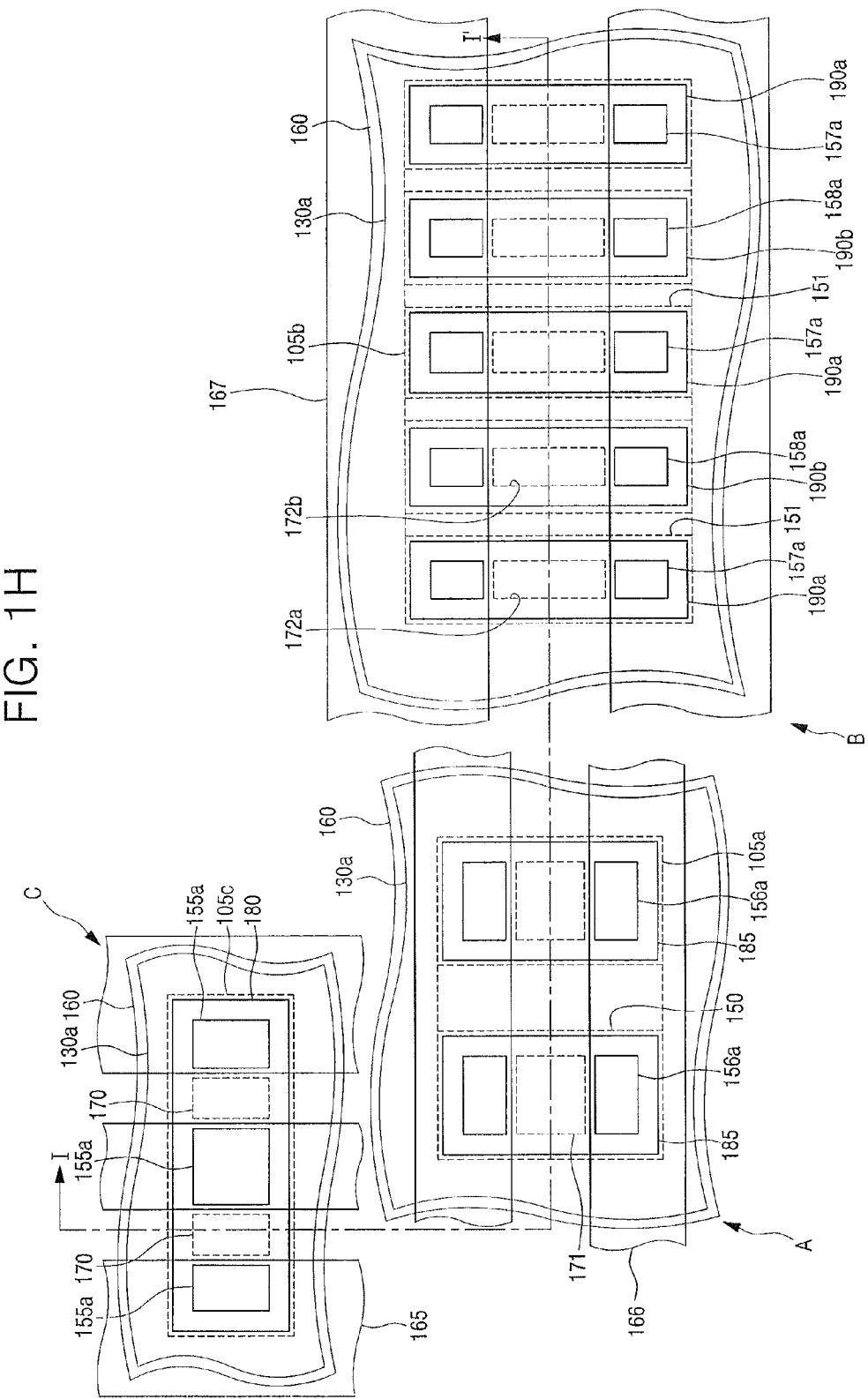

The present invention will now be described more fully hereinafter with reference to the accompanying drawings, in which preferred embodiments of the invention are shown. This invention may, however, be embodied in different forms and should not be construed as limited to the embodiments set fourth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 1K:
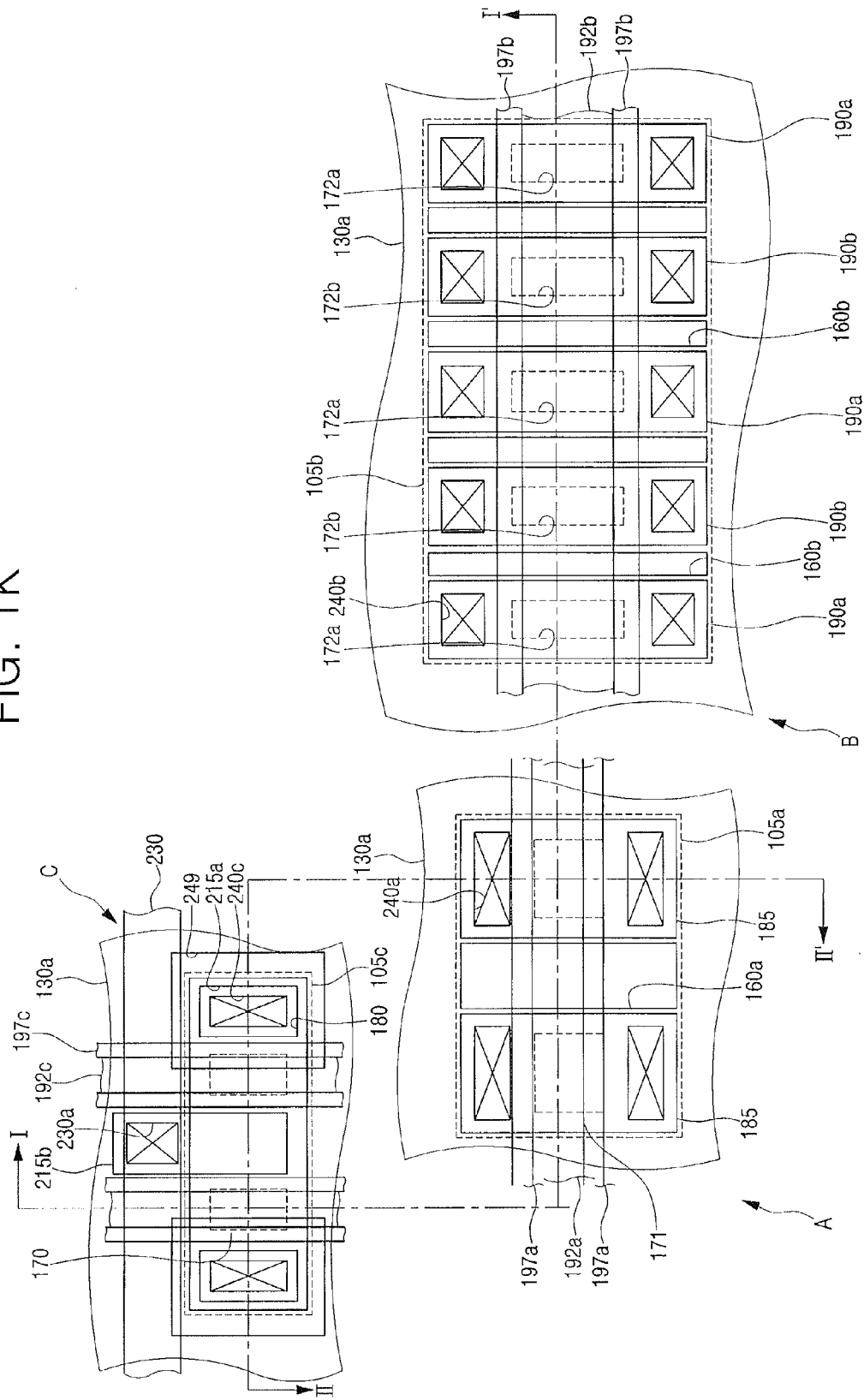
Figure 2A:
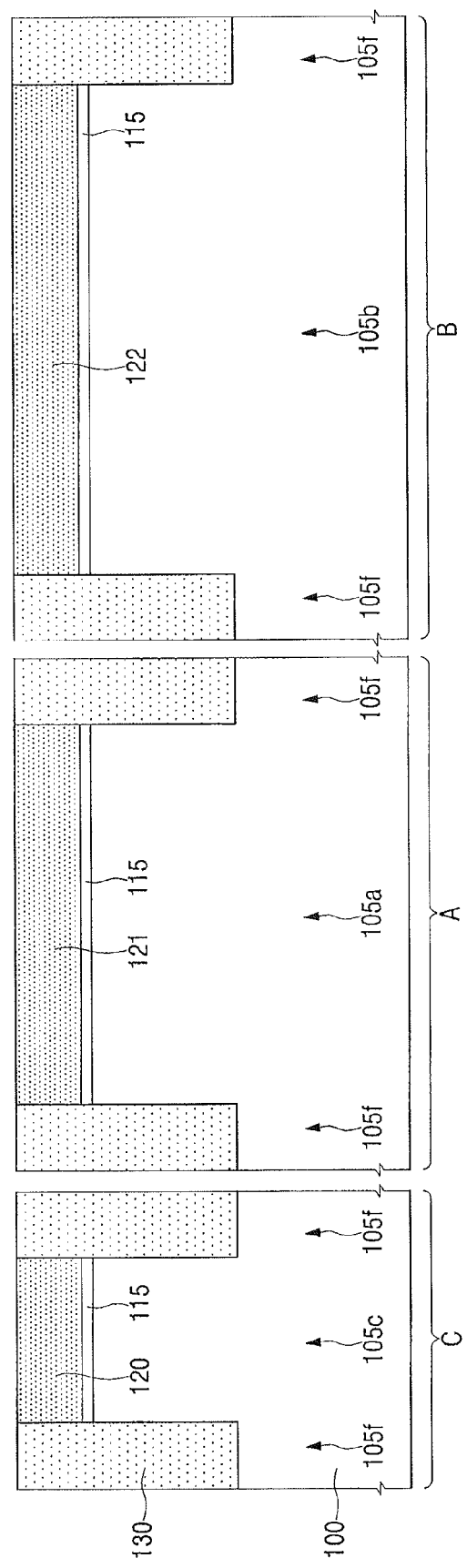
Figure 2B:
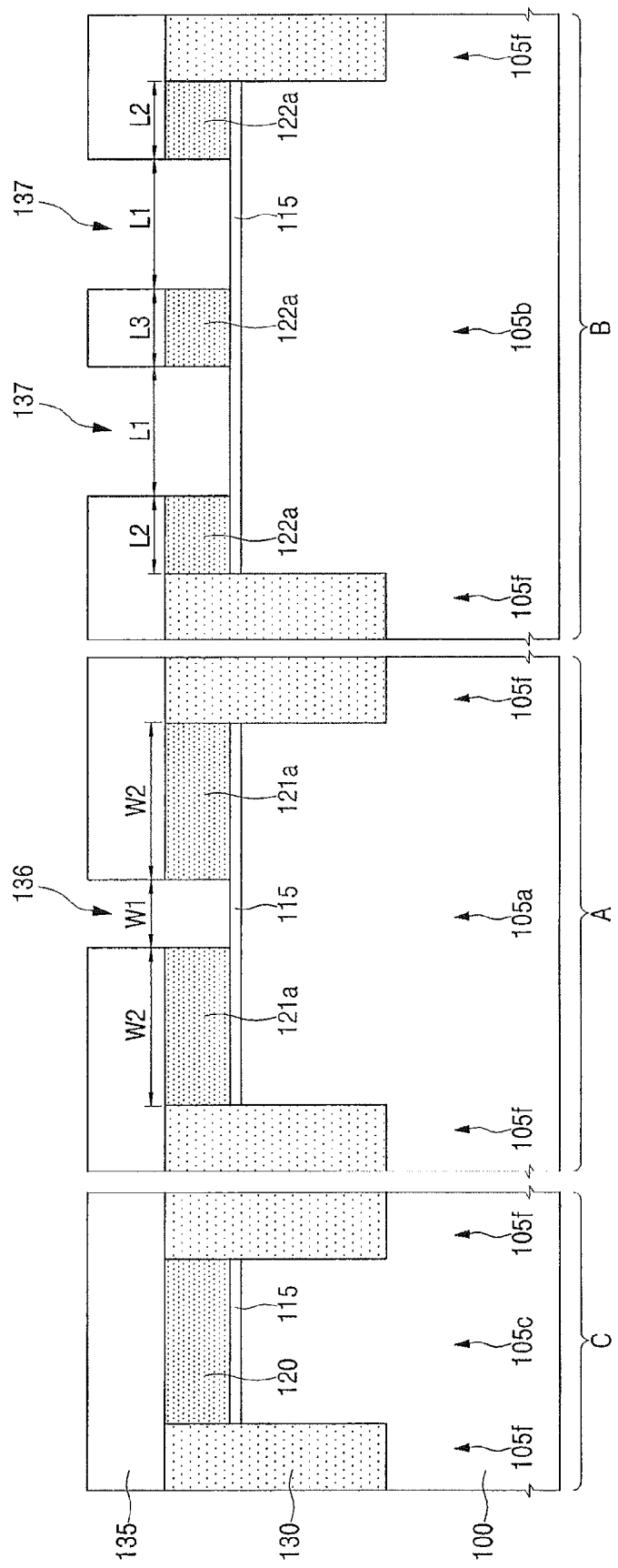
Figure 2D:
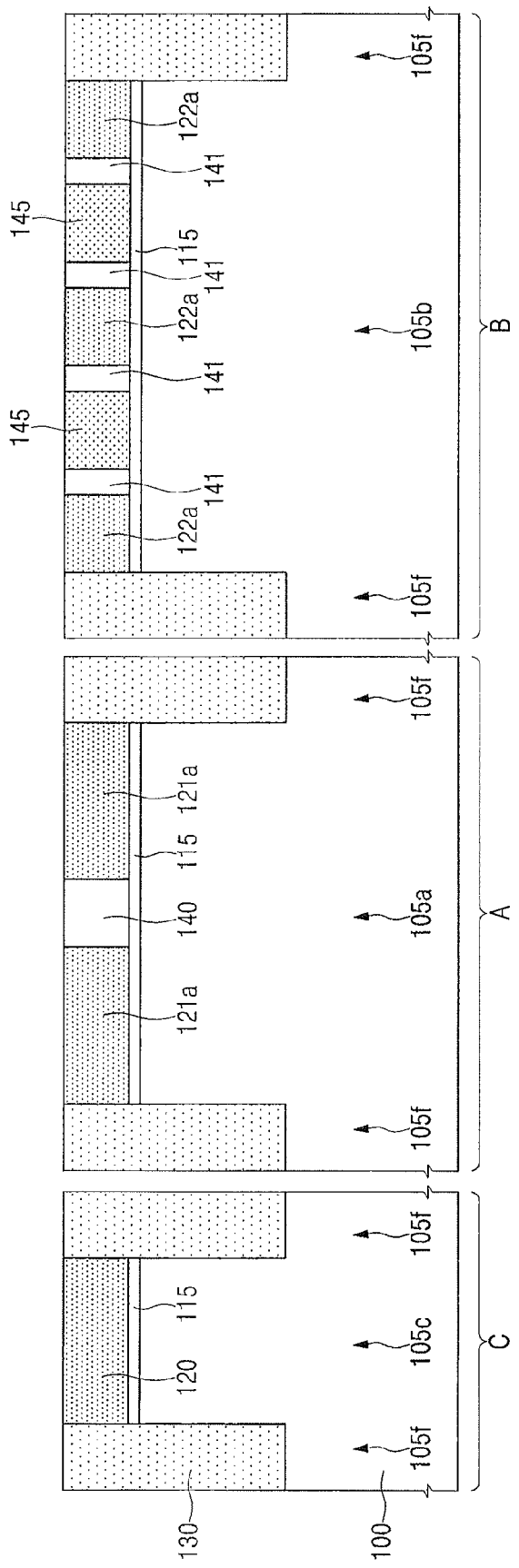
Figure 2E:
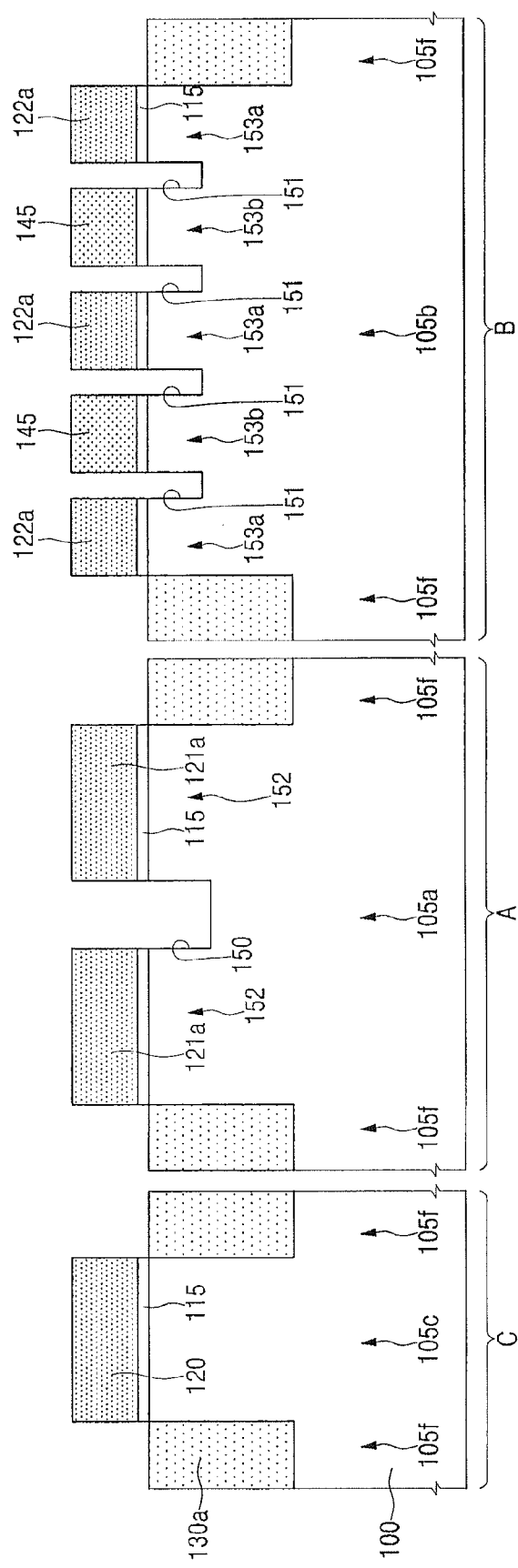
Figure 2F:
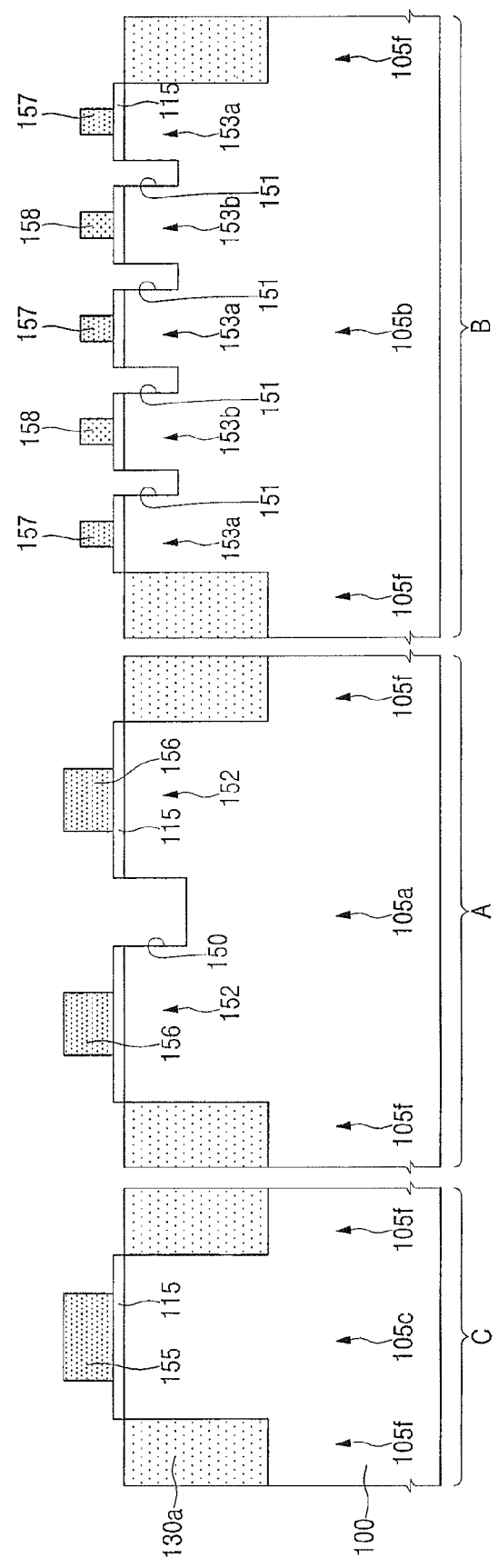
Figure 2G:
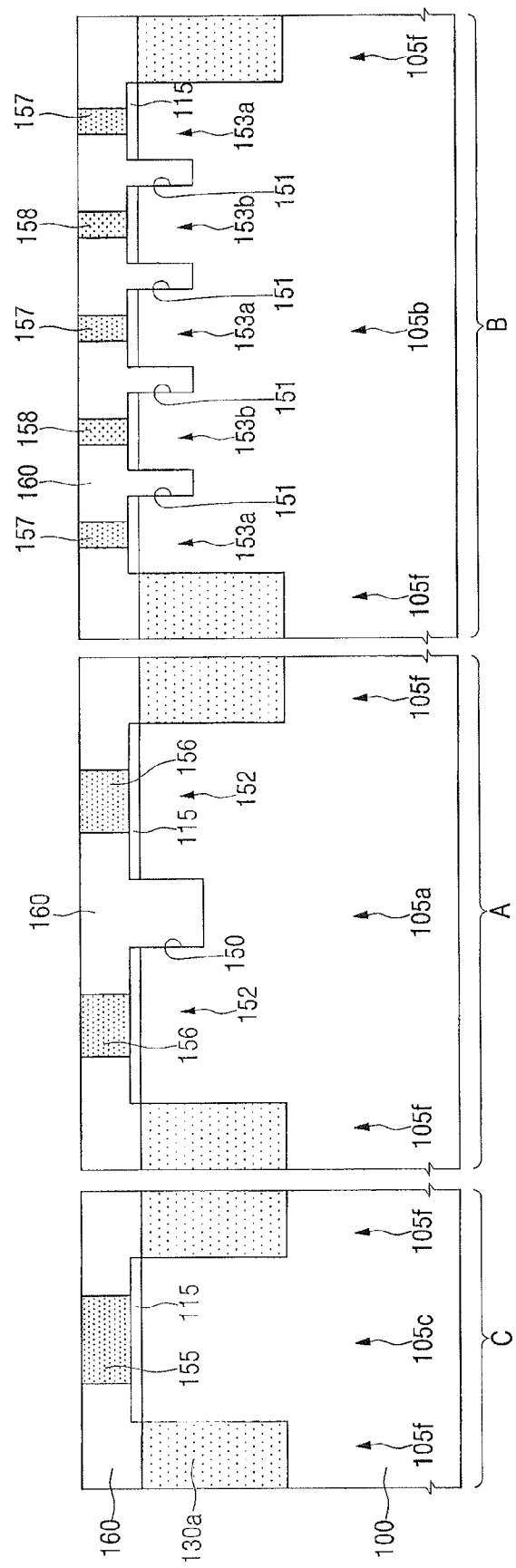
Figure 2I:
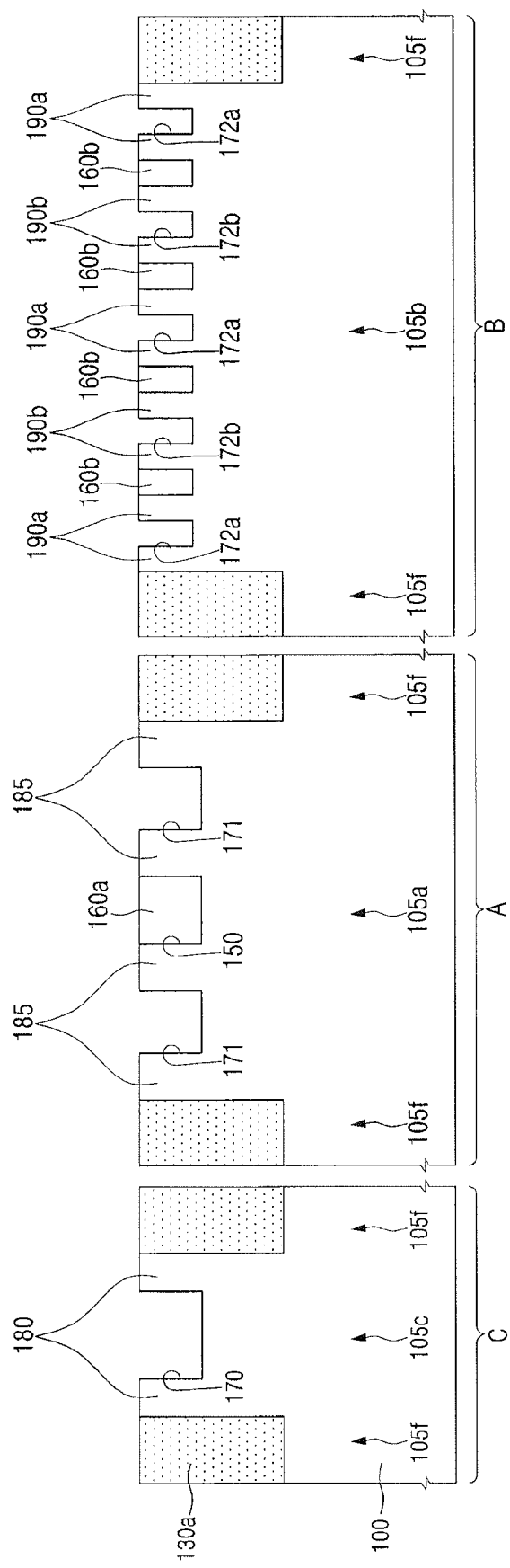
Figure 2J:
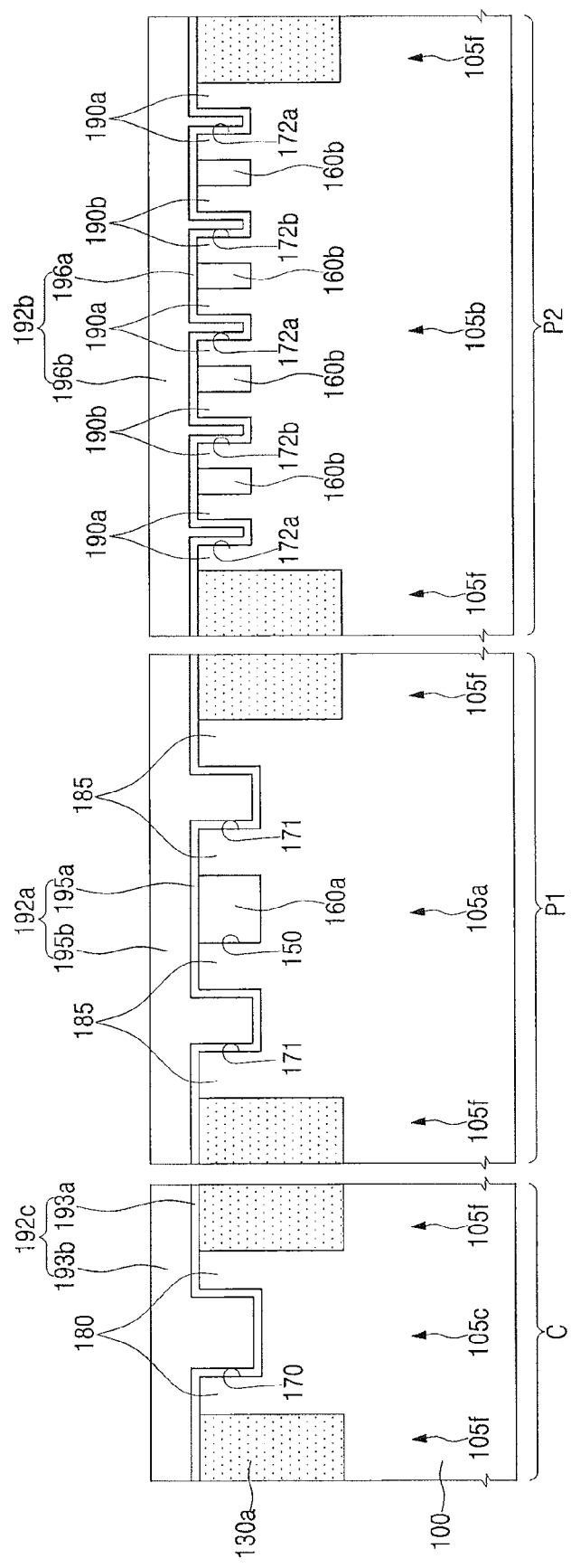
Figure 2K:
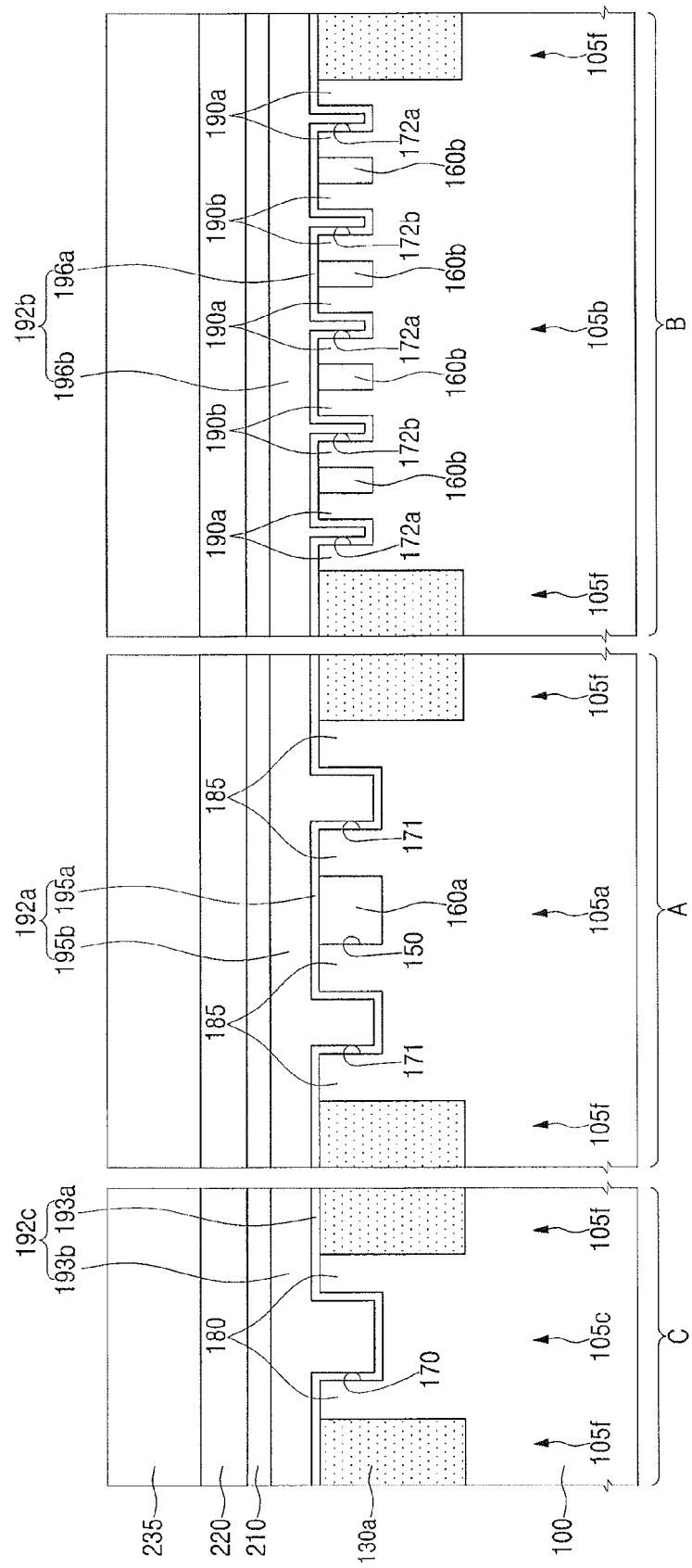
Figure 2L:
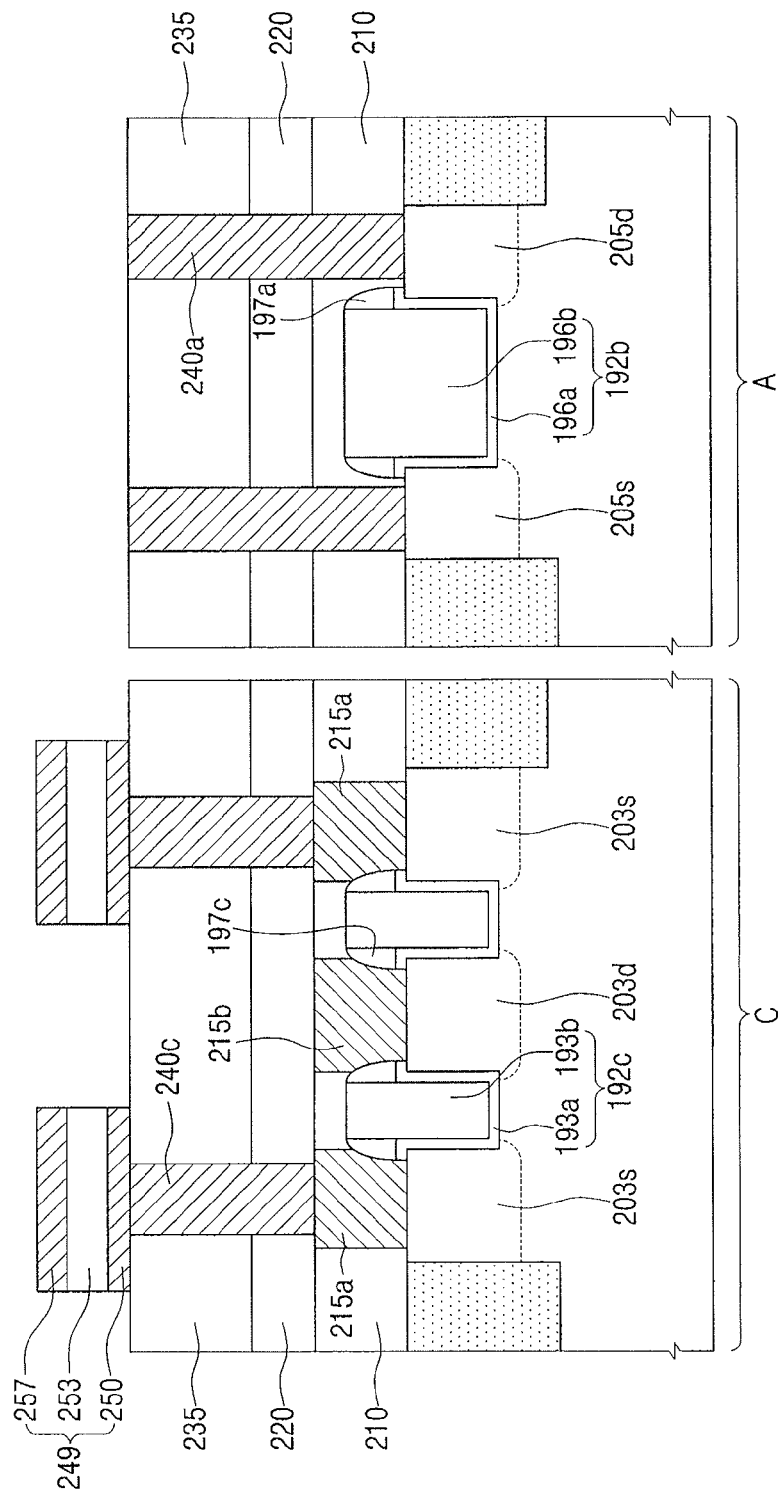

FIGS. 1A to 1K are plan views illustrating methods of fabricating a semiconductor device in accordance with embodiments of the present invention, and FIGS. 2A to 2L are cross-sectional views illustrating methods of fabricating the semiconductor device in accordance with embodiments of the present invention. FIGS. 2A to 2K are cross-sectional views taken along line I-I' of FIGS. 1A to 1K, respectively, and FIG. 2L is a cross-sectional view taken along line II-II' of FIG. 1K. Referring to FIGS. 1A to 1K and 2A to 2L, reference symbol "A" denotes a first circuit region, reference symbol "B" denotes a second circuit region, and reference symbol "C" denotes a third circuit region.

First, methods of fabricating a semiconductor device according to the embodiments of the present invention will be described with reference to FIGS. 1A to 1K and 2A to 2L.

Referring to FIGS. 1A and 2A, a substrate 100 having a first region and a second region adjacent to the first region is prepared. The first region may be an active region, and the second region may be a field region. The substrate 100 may be a semiconductor substrate. For example, the substrate 100 may be a single crystalline silicon substrate.

Specifically, the substrate 100 may have a first circuit region A, a second circuit region B, and a third circuit region C. A first active region 105a, a second active region 105b, and a third active region 105c which are defined by the field region 105f may be formed in the first circuit region A, the second circuit region B, and the third circuit region C, respectively.

A first preliminary hard mask 121 covering the first active region 105a, a second preliminary hard mask 122 covering the second active region 105b, and a third preliminary hard mask 120 covering the third active region 105c may be formed on the substrate 100. Each of the first preliminary hard mask 121, the second preliminary hard mask 122, and the third preliminary hard mask 120 may be formed of a nitride layer such as a silicon nitride layer.

In the meantime, before the first to third preliminary hard masks 121, 122, and 120 are formed, a pad insulating layer 115 may be formed in the substrate 110. The pad insulating layer 115 may be formed of a silicon oxide layer.

Subsequently, a first isolation region 130 is formed within the substrate of the field region 105f to define the first active region 105a, the second active region 105b, and the third active region 105c. The first isolation region 130 may be formed of a silicon oxide layer. The first isolation region 130 may have a top surface disposed on substantially the same level as top surfaces of the first preliminary hard mask 121, the second preliminary hard mask 122, and the third preliminary hard mask 120. The first isolation region 130 may be formed by a shallow trench isolation process.

Referring to FIGS. 1B and 2B, the first and second preliminary hard masks 121 and 122 may be patterned to form at least one first opening 136 crossing the first active region 105a and at least one second opening 137 crossing the second active region 105b. Specifically, a mask 135 is formed, which has at least one first preliminary opening crossing the first preliminary hard mask 121 and at least one second preliminary opening crossing the second preliminary hard mask 122. The mask 135 may be formed of a photoresist layer. The first preliminary opening may have a first width W1 smaller than a second width W2 of the first preliminary hard mask 121 covered by the mask 135. In addition, the second preliminary opening may have a third width L1 larger than fourth and fifth widths L2 and L3 of the second preliminary hard mask 122 covered by the mask 135. In this case, the fourth width L2 may be substantially equal to the fifth width L3.

Subsequently, the first and second preliminary hard masks 121 and 122 exposed by the respective first and second preliminary openings may be sequentially etched to form first and second hard masks 121a and 122a having first and second openings 136 and 137, respectively. As a result, as shown in FIG. 1B, the first opening 136 may have the first width W1, and the first hard mask 121a may have the second width W2. In addition, the second opening 137 may have the third width L1, and the second hard mask 122a may have the fourth and fifth widths L2 and L3. The first hard mask 121a may be self-aligned with the first active region 105a and spaced apart from the second active region 105b. In addition, the second hard mask 122a may be self-aligned with the second active region 105b and spaced apart from the first active region 105a In the meantime, the mask 135 formed on the second circuit region B may expose the second preliminary hard mask 122 by the second preliminary opening while the second preliminary opening extends onto the first isolation region 130 to expose the first isolation region 130 adjacent to the second preliminary hard mask 122. As a result, the second preliminary hard mask 122 may be etched while the isolation region 130 adjacent to the second preliminary hard mask 122 is partially etched, using the mask 135 as an etch mask. As a result, the second hard mask 122a may be formed, and a top surface of the first isolation region 130 adjacent to the substrate 100 exposed by the second hard mask 122a may have substantially the same level as a top surface of the substrate 100.

Referring to FIGS. 1C and 2C, a sacrificial mask 140 filling the first opening 136, and sacrificial spacers 141 covering sidewalls of the second hard mask 122a may be formed. As a result, a third opening 143 of which a width is reduced by thicknesses of the sacrificial spacers 141 may be formed within the second opening 137. Specifically, a conformal spacer insulating layer may be formed on the substrate having the first and second hard masks 121a and 122a. In this case, the spacer insulating layer may fill the first opening 136. Subsequently, the spacer insulating layer may be anisotropically etched to form the sacrificial spacers 141 covering sidewalls of the second hard mask 122a exposed by the second opening 137.

In the meantime, when the pad insulating layer 115 exposed by the second opening 137 is damaged while the sacrificial spacers 141 are formed, the substrate 100 may be thermally oxidized to reform the damaged portion of the pad insulating layer 115.

The sacrificial mask 140 and the sacrificial spacers 141 may be formed of a material layer having an etch selectivity with respect to the first and second hard masks 121a and 122a. For example, when the first and second hard masks 121a and 122a are formed of a silicon nitride layer, the sacrificial mask 140 and the sacrificial spacers 141 may be formed of a silicon oxide layer.

In the meantime, the sacrificial mask 140 and the sacrificial spacers 141 may be formed of a material layer having an etch selectivity with respect to the first isolation region 130, for example, a polysilicon layer. Accordingly, when the first and second hard masks 121a and 122a are formed of a silicon nitride layer, the sacrificial mask 140 and the sacrificial spacers 141 may be formed of a silicon oxide layer or a polysilicon layer.

When the sacrificial mask 140 and the sacrificial spacers 141 are formed of a silicon oxide layer, the first isolation region 130 may be formed of a high-density plasma (HDP) silicon oxide layer having dense film quality, and the sacrificial mask 140 and the sacrificial spacers 141 may be formed of a medium-temperature chemical vapor deposition (MT CVD) silicon oxide layer, which is less dense than the first isolation region 130.

Referring to FIGS. 1D and 2D, a fourth hard mask 145 may be formed to fill the third opening 143. The fourth hard mask 145 may be formed of a material layer which has an etch selectivity with respect to the sacrificial spacers 141 and has substantially the same etch rate as the second hard mask 122a. For example, when the sacrificial spacers 141 are formed of a silicon oxide layer and the second hard mask 122a is formed of a silicon nitride layer, the fourth hard mask 145 may be formed of a silicon nitride layer. Specifically, a mask insulating layer may be formed on the substrate having the sacrificial spacers 141 and then planarized until a top surface of the second hard mask 122a and top surfaces of the sacrificial spacers 141 are exposed, thereby forming the fourth hard mask 145.

Referring to FIGS. 1E and 2E, the sacrificial mask 140 and the sacrificial spacers 141 are removed using the first hard mask 121a, the second hard mask 122a, and the fourth hard mask 145 as etch masks. While the sacrificial mask 140 and the sacrificial spacers 141 are removed, the pad insulating layer 115 below the sacrificial mask 140 and the sacrificial spacers 141 may also be removed in the same process.

While the sacrificial mask 140 and the sacrificial spacers 141 are removed, the first isolation region 130 may be partially etched to form a second isolation region 130a, which has a top surface disposed lower than or on the same level as bottom surfaces of the first, second, and fourth hard masks 121a, 122a, and 145.

The substrates of the first and second active regions 105a and 105b are etched using the second isolation region 130a and the first and second hard masks 121a and 122a as etch masks to form a first trench 150 crossing the first active region 105a and a second trench 151 crossing the second active region 105b. The first and second trenches 150 and 151 may have bottom surfaces higher than the bottom surface of the second isolation region 130a. As a result, a first preliminary semiconductor pillar 152 spaced apart by the first trench 150 may be formed in the first active region 105a, and a second preliminary semiconductor pillar 153a and a third preliminary semiconductor pillar 153b which are spaced apart from each other by the second trench 151 may be formed in the second active region 105b. The second preliminary semiconductor pillar 153a may be formed below the second hard mask 121a, and the third preliminary semiconductor pillar 153b may be formed below the fourth hard mask 145.

A plurality of first preliminary semiconductor pillars 152 may be formed. The first preliminary semiconductor pillars 152 may be self-aligned with the first active region 105a and spaced apart from each other within the first active region 105a.

The second preliminary semiconductor pillar 153a and the third preliminary semiconductor pillar 153b may be self-aligned with the second active region 105b and spaced apart from each other within the second active region 105b.

The second trench 151 may have a width smaller than the minimum line width achievable by photolithography equipment. That is, the second trench may have a width equal to the thicknesses of the sacrificial spacers 141.

When the sacrificial mask 140 and the sacrificial spacers 141 are formed of a material layer having an etch selectivity with respect to the first isolation region 130, for example, a polysilicon layer, the sacrificial mask 140 and the sacrificial spacers 141 may be removed, and then the substrate below the sacrificial mask 140 and the sacrificial spacers 141 may be etched to form the first and second trenches 150 and 151. As a result, the first to third preliminary semiconductor pillars 152, 153a, and 153b may be formed. Subsequently, the first isolation region 130 may be partially etched to form the second isolation region 130a, which has a top surface disposed lower than or on the same level as the bottom surfaces of the first and second hard masks 121a and 122a.

Referring to FIGS. 1F and 2F, the first hard mask 121a of the first circuit region A is isotropically etched to form a first hard mask pattern 156 having a width narrower than the width of the first hard mask 121a while the second hard mask 122a and the fourth hard mask 145 of the second circuit region B are isotropically etched to form a second hard mask pattern 157 and a fourth hard mask pattern 158, respectively. Similarly, the third preliminary hard mask 120 of the third circuit region C is isotropically etched to form a third hard mask pattern 155. The isotropic etching may be simultaneously carried out. The isotropic etching may be carried out using a pull-back process.

Referring to FIGS. 1G and 2G, an insulating buffer layer may be formed on the substrate having the third hard mask pattern 155, the first hard mask pattern 156, the second hard mask pattern 157, and the fourth hard mask pattern 158. The insulating buffer layer may be formed of a silicon oxide layer. Subsequently, the insulating buffer layer may be planarized until the top surfaces of the third hard mask pattern 155, the first hard mask pattern 156, the second hard mask pattern 157, and the fourth hard mask pattern 158 are exposed, so that a buffer insulating layer 160 may be formed. Accordingly, the buffer insulating layer 160 may have a top surface disposed on substantially the same level as the top surfaces of the third hard mask pattern 155, the first hard mask pattern 156, the second hard mask pattern 157, and the fourth hard mask pattern 158. In addition, the buffer insulating layer 160 may fill the first and second trenches 151 and 152 while covering the second isolation region 130a, and predetermined regions of the active regions 105c, 105a, and 105b exposed by the third hard mask pattern 155, the first hard mask pattern 156, the second hard mask pattern 157, and the fourth hard mask pattern 158.

Referring to FIGS. 1H and 2H, a first photoresist pattern 166 having at least one first opening crossing the first hard mask pattern 156, a second photoresist pattern 167 having at least one second opening simultaneously crossing the second hard mask pattern 157 and the fourth hard mask pattern 158, and a third photoresist pattern 165 having at least one third opening crossing the third hard mask pattern 155 may be formed in the first circuit region A, the second circuit region B, and the third circuit region C, respectively. It is shown in FIG. 1H that the number of the third openings is two and the number of each of the first and second openings is one, however, the number of the openings may be determined according to the number of gate structures to be formed later.

The third hard mask pattern 155, the first hard mask pattern 156, the second hard mask pattern 157, and the fourth hard mask pattern 158 exposed by the respective photoresist patterns 165, 166, 167 may be etched while the pad insulating layer 115 and the substrate 100 disposed therebelow may be sequentially etched. As a result, a first recessed region 171 may be formed in the first active region 105a, a second recessed region 172a and a fourth recessed region 172b may be formed in the second active region 105b, and a third recessed region 170 may be formed in the third active region 105c. In addition, the first hard mask pattern 156 may remain in the first active region 105a to form a first remaining pattern 156a, the second and fourth hard mask patterns 157 and 158 may remain in the second active region 105b to form second and fourth remaining patterns 157a and 158a, and the third hard mask pattern 155 may remain in the third active region 105c to form a third remaining pattern 155a.

The first recessed region 171 may be formed within the first preliminary semiconductor pillar 152 to form a first semiconductor pillar 185. In addition, the second and fourth recessed regions 172a and 172b may be formed within the second preliminary semiconductor pillar 153a and the third preliminary semiconductor pillar 153b to form a second semiconductor pillar 190a and a fourth semiconductor pillar 190b, respectively. A third semiconductor pillar 180, which protrudes from the substrate and has the recessed third recessed region 170 in its central portion, may be formed in the third active region 105c. The first semiconductor pillar 185, which protrudes from the substrate and has the recessed first recessed region 171 in its central portion, may be formed in the first active region 105a. The second semiconductor pillar 190a which protrudes from the substrate and has the recessed second recessed region 172a in its central portion, and the fourth semiconductor pillar 190b which protrudes from the substrate and has the recessed fourth recessed region 172b in its central portion, may be formed in the second active region 105b. The second semiconductor pillar 190a and the fourth semiconductor pillar 190b may be spaced apart from each other and may be regularly arranged within the second active region 105b.

In the meantime, the number of the first semiconductor pillars 185 formed in the first active region 105a may be determined by the number of the first openings 136 of the mask 135 of the first active region 105a described with reference to FIGS. 1B and 2B. In addition, the total number of the second and fourth semiconductor pillars 190a and 190b formed in the second active region 105b may be determined by the number of the second openings 137 of the mask 135 of the second active region 105b described with reference to FIGS. 1B and 2B. In the meantime, the number of the first recessed region 171 may depend on the number of the first openings of the first photoresist pattern 166, the number of the second recessed region 172a and the fourth recessed region 172b may depend on the number of the second openings of the second photoresist pattern 167, and the number of the third recessed region 170 may depend on the number of the third openings of the third photoresist pattern 165. As a result, the number of each of the first to fourth recessed regions 171, 172a, 170, and 172b may be at least one.

Referring to FIGS. 1I and 2I, the photoresist patterns 165, 166, and 167 may be removed. Subsequently, the first remaining pattern 156a, the second and fourth remaining patterns 157a and 158a, and the third remaining pattern 155a, which remain below the photoresist patterns 165, 166, and 167, may be removed. Subsequently, the buffer insulating layer 160 may be etched until top surfaces of the semiconductor pillars 185, 190a, 190b, and 180 are exposed. As a result, the buffer insulating layer 160 may remain within the trenches. That is, the buffer insulating layer 160 may be used as a first buffer insulating layer pattern 160a remaining within the first trench 150 and a second buffer insulating layer pattern 160b remaining within the second trench 151.

In the meantime, the pad insulating layer 115 may be removed while the buffer insulating layer 160 is etched.

Referring to FIGS. 1J and 2J, at least one first gate structure 192a crossing the first semiconductor pillar 185 may be formed in the first circuit region A. At least one second gate structure 192b crossing the second semiconductor pillar 190a and the fourth semiconductor pillar 190b may be formed in the second circuit region B. At least one third gate structure 192c crossing the third semiconductor pillar 180 may be formed in the third circuit region C. The first gate structure 192a may cross inner walls of the first recessed region 171, the second gate structure 192b may cross inner walls of each of the second recessed region 172a and the fourth recessed region 172b, and the third gate structure 192c may cross inner walls of the third recessed region 170. The first gate structure 192a may be composed of a first gate dielectric layer 195a and a first gate electrode 195b, which are sequentially stacked, and the second gate structure 192b may be composed of a second gate dielectric layer 196a and a second gate electrode 196b, which are sequentially stacked. In addition, the third gate structure 192c may be composed of a third gate dielectric layer 193a and a third gate electrode 193b, which are sequentially stacked. The gate dielectric layers 195a, 196a, and 193a may be formed of a high-k dielectric layer or a thermal oxide layer. The gate electrodes 195b, 196b, and 193b may be formed of at least one layer selected from the group consisting of a polysilicon layer, a stacked layer of a polysilicon layer and a metal silicide layer, and a metal layer.

A first gate spacer 197a covering a sidewall of the first gate structure 192a, a second gate spacer 197b covering a sidewall of the second gate structure 192b, and a third gate spacer 197c covering a sidewall of the third gate structure 192c may be formed. The gate spacers 197a, 197b, and 197c may be formed of a nitride layer such as a silicon nitride layer.

Referring to FIGS. 1K, 2K, and 2L, first source and drain regions may be formed in the first active region 105a disposed at both sides of the first gate structure 192a, second source and drain regions 205s and 205d may be formed in the second active region 105b disposed at both sides of the second gate structure 192b, and third source and drain regions 203s and 203d may be formed in the third active region 105c disposed at both sides of the third gate structure 192c. As a result, a first transistor, a second transistor, and a third transistor may be formed in the first active region 105a, the second active region 105b, and the third active region 105c, respectively. As a result, the first transistor is formed, which has the top surface of the first semiconductor pillar and the inner walls of the first recessed region as a channel region, the second transistor is formed, which has the top surfaces of the second and fourth semiconductor pillars and the inner walls of the second and fourth recessed regions as channel regions, and the third transistor is formed, which has the top surface of the third semiconductor pillar and the inner walls of the third recessed region as a channel region. Accordingly, the first to third transistors may have multiple channel regions. As a result, MOS transistors having various increased channel widths may be formed within a limited area compared to the planar type MOS transistors. Furthermore, integration density of the semiconductor device employing the MOS transistors having such various channel widths may be enhanced.

A first interlayer insulating layer 210 may be formed to cover the gate structures 192a, 192b, and 192c. A first landing pad 215a and a second landing pad 215b may be formed through the first interlayer insulating layer 210 to contact the third source region 203s and the third drain region 203d of the third transistor, respectively. Subsequently, a second interlayer insulating layer 220 may be formed on the substrate having the landing pads 215a and 215b, and a bit line contact structure 230a may be formed through the second interlayer insulating layer 220 to contact the second landing pad 215b. Subsequently, a bit line 230 may be formed on the second interlayer insulating layer 220. A third interlayer insulating layer 235 may be formed on the substrate having the bit line 230, and a storage contact structure 240c may be formed through the third interlayer insulating layer 235 to contact the first landing pad 215a. In the meantime, a first contact structure 240a and a second contact structure 240b may be formed which sequentially penetrate the third, second, and first interlayer insulating layers 235, 220, and 210 of the first and second active regions 105a and 105b.

A data storage element structure 249 electrically connected to the storage contact structure 240c may be formed on the third interlayer insulating layer 225. The data storage element structure 249 may be composed of a lower electrode 250, a data storage element material layer 253, and an upper electrode 257, which are sequentially stacked. The data storage element material layer 253 may be formed of a dielectric layer or a resistor. Accordingly, the data storage element structure 249 may be composed of a capacitor or a non-volatile data storage element structure.

The present invention has been exemplarily described for a case that the third active region 105c is a cell active region of the semiconductor memory device, however, the first active region 105a or the second active region 105b may also be defined as the cell active region of the semiconductor memory device. Accordingly, each of the second and third transistors may be formed as cell transistors of the semiconductor memory device. Each of the first to third transistors may be used as transistors of peripheral circuits.

Next, methods of fabricating a semiconductor device according to other embodiments of the present invention will be described with reference to FIGS. 3A to 3D and 4A to 4E. In this case, FIGS. 3A to 3D are plan views illustrating methods of fabricating the semiconductor device, and FIGS. 4A to 4E are cross-sectional views taken along line III-III' of FIGS. 3A to 3C, respectively. Referring to FIGS. 3A to 3D and 4A to 4E, reference symbol "A" denotes a first circuit region, reference symbol "B" denotes a second circuit region, and reference symbol "C" denotes a third circuit region.

Figure 3A:
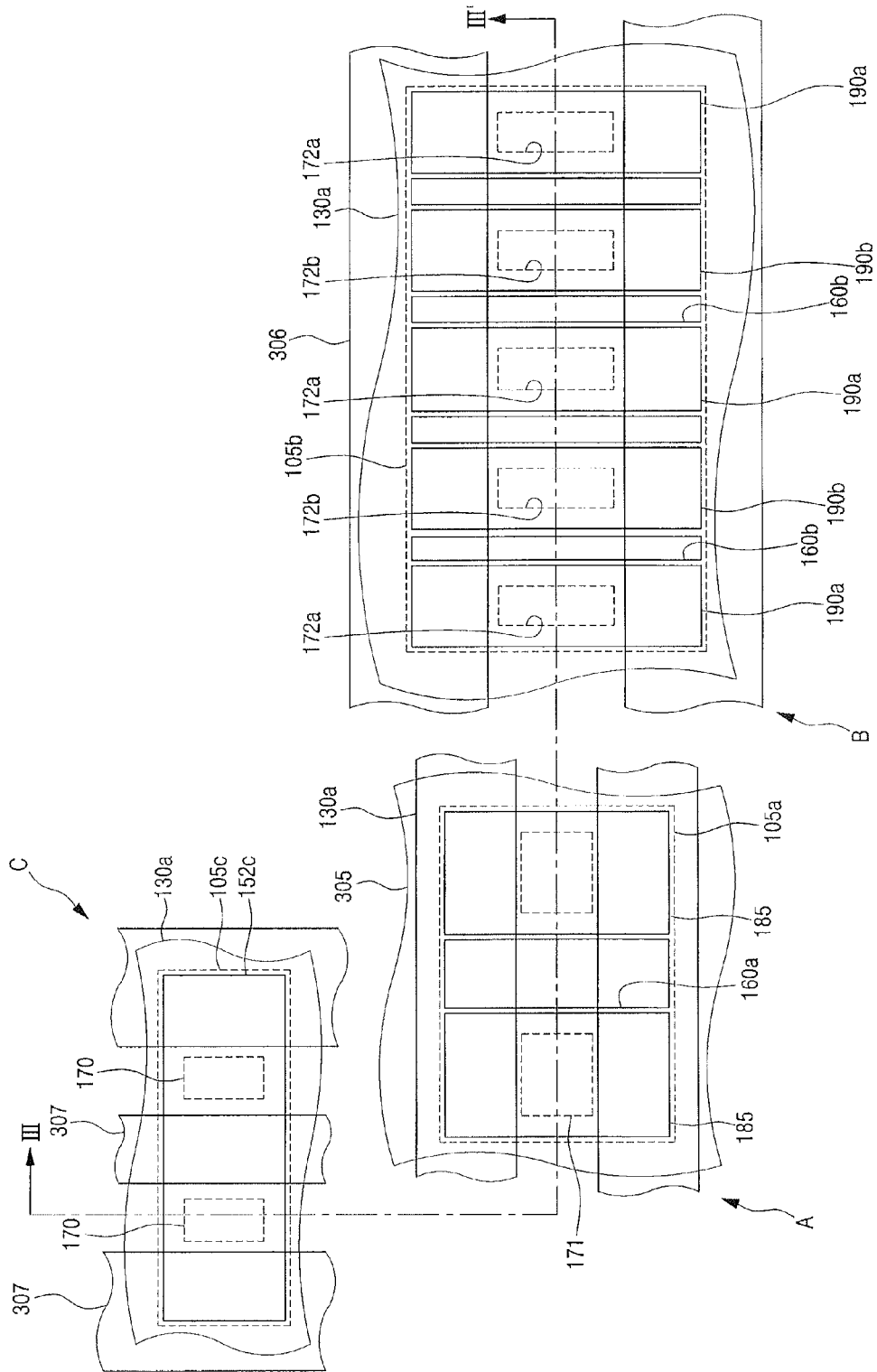
FIGS. 3A to 3D are plan views illustrating methods of fabricating a semiconductor device in accordance with other embodiments of the present invention.
Figure 4A:
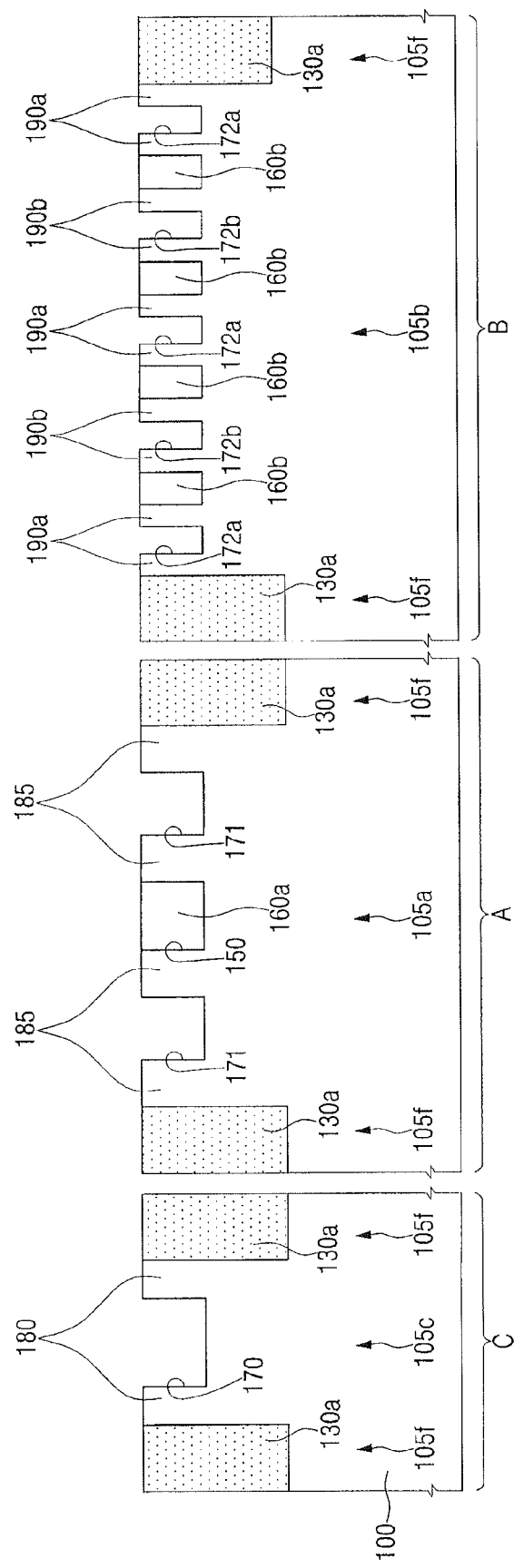

Referring to FIGS. 3A and 4A, a substrate 100 is first prepared, which has been subjected to the processes as described with reference to FIGS. 1A to 1I and 2A to 2I. Subsequently, a first photoresist pattern 305 having a first opening crossing the first semiconductor pillar 185, a second photoresist pattern 306 having a second opening simultaneously crossing the second and fourth semiconductor pillars 190a and 190b, and a third photoresist pattern 307 having a third opening crossing the third semiconductor pillar 180, may be formed in the first active region A, the second active region B, and the third active region C, respectively. The number of the openings of the photoresist patterns 305, 306, and 307 may be determined according to the number of the openings of the photoresist patterns 165, 166, and 167 described with reference to FIG. 1H, respectively. In addition, the photoresist patterns 305, 306, and 307 may be formed using substantially the same photo mask as the photo mask for forming the photoresist patterns 165, 166, and 167 described with reference to FIG. 1H. As a result, the openings of the photoresist patterns 305, 306, and 307 may be self-aligned with the recessed regions 171, 172a, 172b, and 170.

Figure 3B:
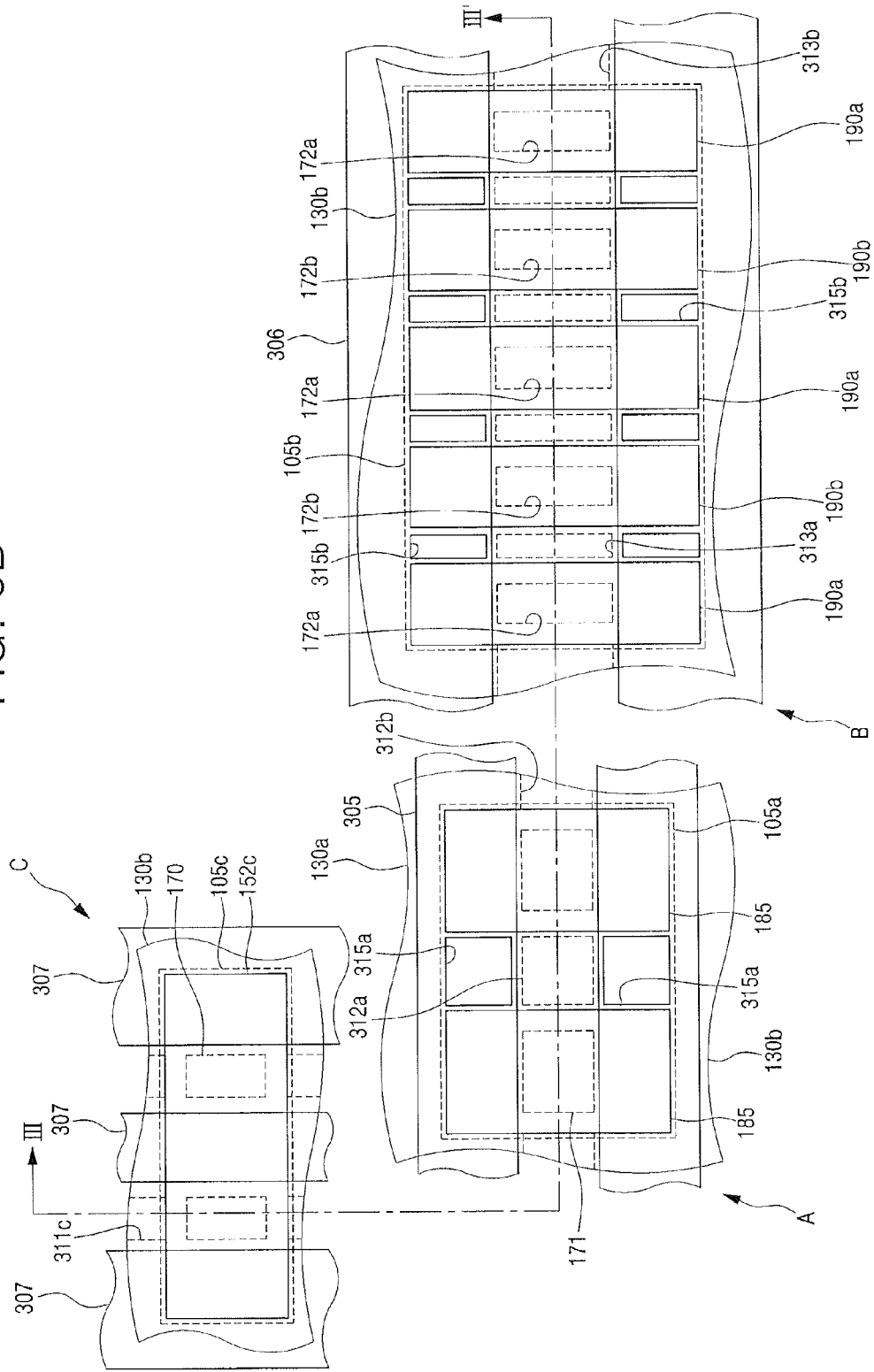
Figure 4B:
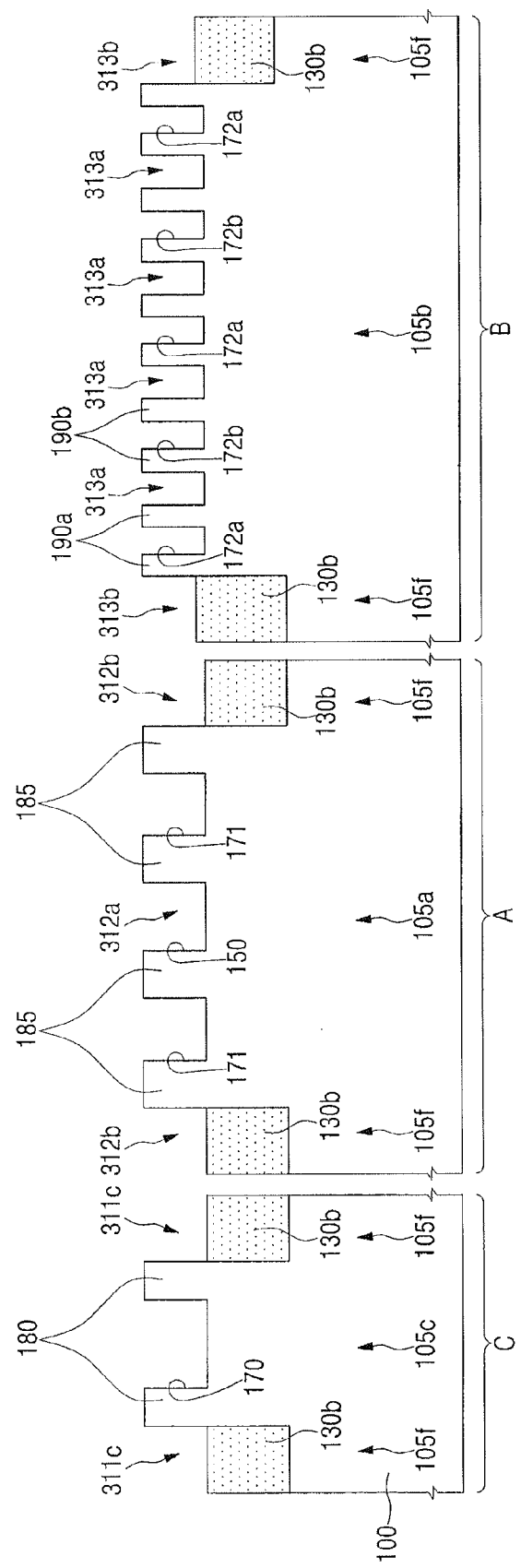

Referring to FIGS. 3B and 4B, the first buffer insulating layer pattern 160a exposed by the first photoresist pattern 305 and the second buffer insulating layer pattern 160b exposed by the second photoresist pattern 306 may be etched, so that a first trench portion 312a where the first trench 150 is exposed, and a first remaining buffer pattern 315a may be formed while a second trench portion 313a where the second trench 151 is exposed, and a second remaining buffer pattern 315b are formed. At the same time, top surfaces of the second isolation region 130a exposed by the first to third photoresist patterns 305, 306, and 307 may be partially etched while the first and second buffer insulating layer patterns 160a and 160b are etched. As a result, a third isolation region 130b may be formed, which is disposed on extending lines of the respective recessed regions 171, 172a, 172b, and 170, and has third trenches 311c, 312b, and 313b such that the top surfaces disposed on regions adjacent to the semiconductor pillars 185, 190a, and 180 are lower than the top surfaces of the semiconductor pillars 185, 190a, and 180 and the remainder of the top surfaces are disposed on substantially the same level as the top surfaces of the semiconductor pillars 185, 190a, and 180.

Figure 3C:
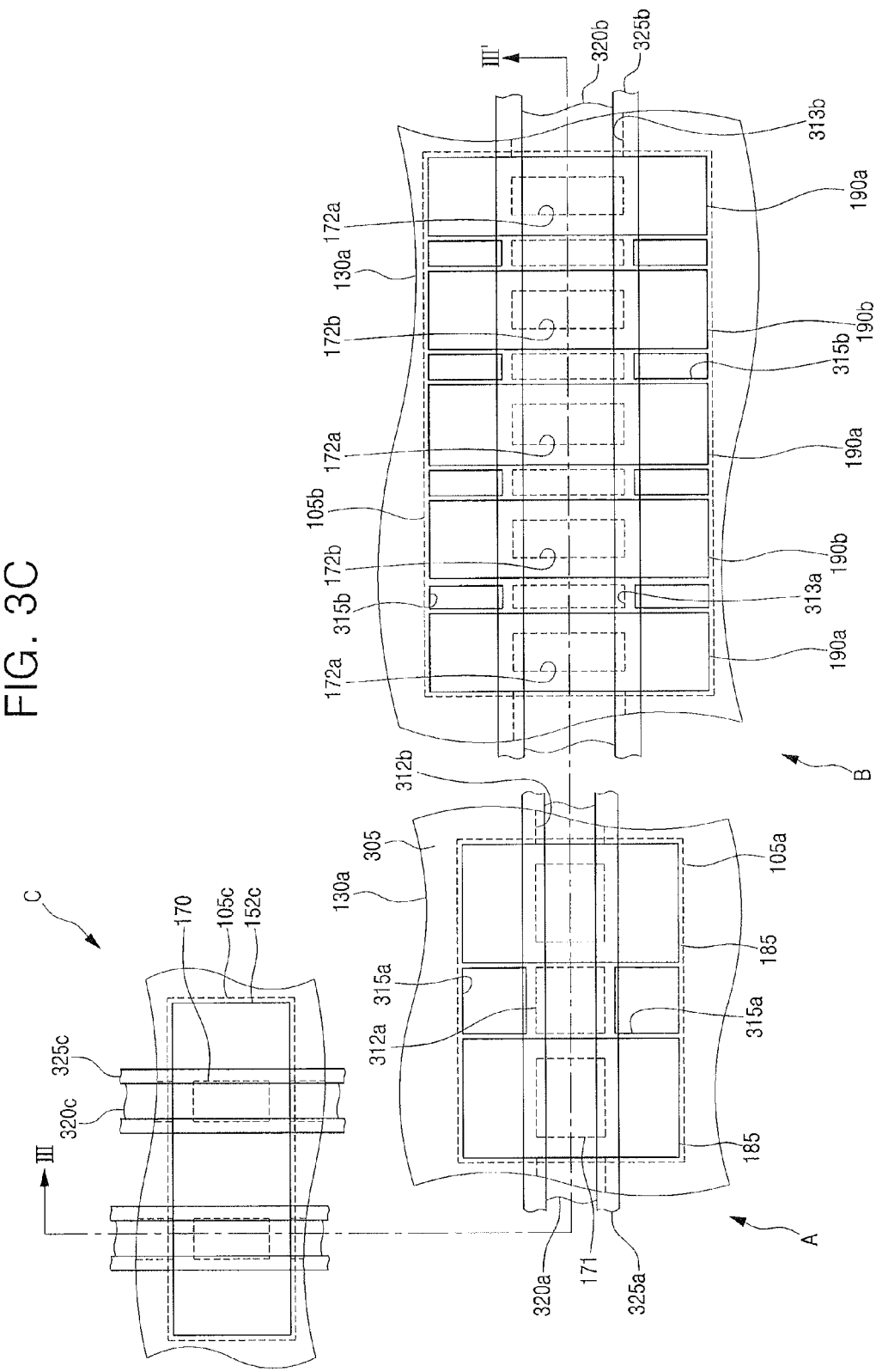
Figure 4C:
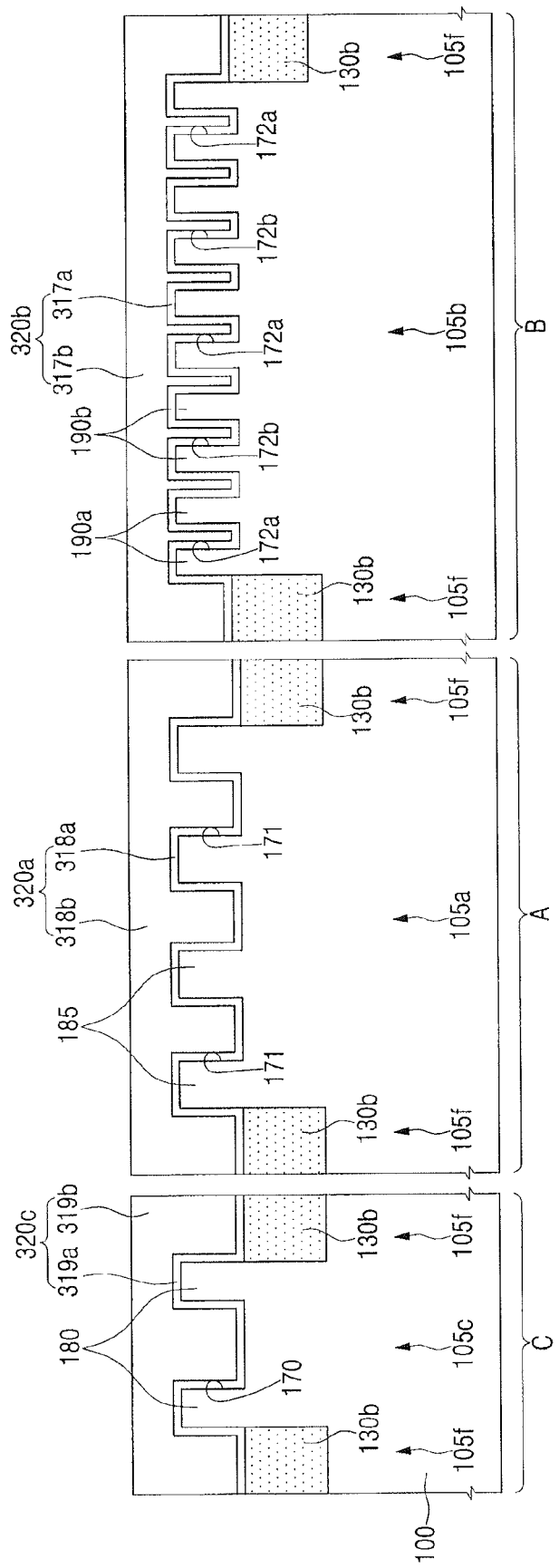

Referring to FIGS. 3C and 4C, the photoresist patterns 305, 306, and 307 may be removed. At least one first gate structure 320a may be formed to cross the first semiconductor pillar 185 in the first circuit region A. At least one second gate structure 320b may be formed to cross both the second semiconductor pillar 190a and the fourth semiconductor pillar 190b in the second circuit region B. At least one third gate structure 320c may be formed to cross the third semiconductor pillar 180 in the third circuit region C. In this case, the first gate structure 320a may cover outer sidewalls of the first semiconductor pillars 185, top surfaces of the first semiconductor pillars 185, inner walls of the first recessed regions 171, and the substrate between the first semiconductor pillars 185, i.e., the first trench portion 312a. The second gate structure 320b may cover outer sidewalls of the second and fourth semiconductor pillars 190a and 190b, top surfaces of the second and fourth semiconductor pillars 190a and 190b, inner walls of the second and fourth recessed regions 172a and 172b, and the substrate between the second and fourth semiconductor pillars 190a and 190b, i.e., the second trench portion 313a. The third gate structure 320c may cover the top surface and outer sidewalls of the third semiconductor pillar 180, and the third recessed region 170. The first gate structure 320a may be composed of a first gate dielectric layer 318a and a first gate electrode 318b, which are sequentially stacked, and the second gate structure 320b may be composed of a second gate dielectric layer 317a and a second gate electrode 317b, which are sequentially stacked. In addition, the third gate structure 320c may be composed of a third gate dielectric layer 319a and a third gate electrode 319b, which are sequentially stacked.

Subsequently, a first gate spacer 325a covering the sidewall of the first gate structure 320a, a second gate spacer 325b covering the sidewall of the second gate structure 320b, and a third gate spacer 325c covering the sidewall of the third gate structure 320c may be formed.

Figure 3D:
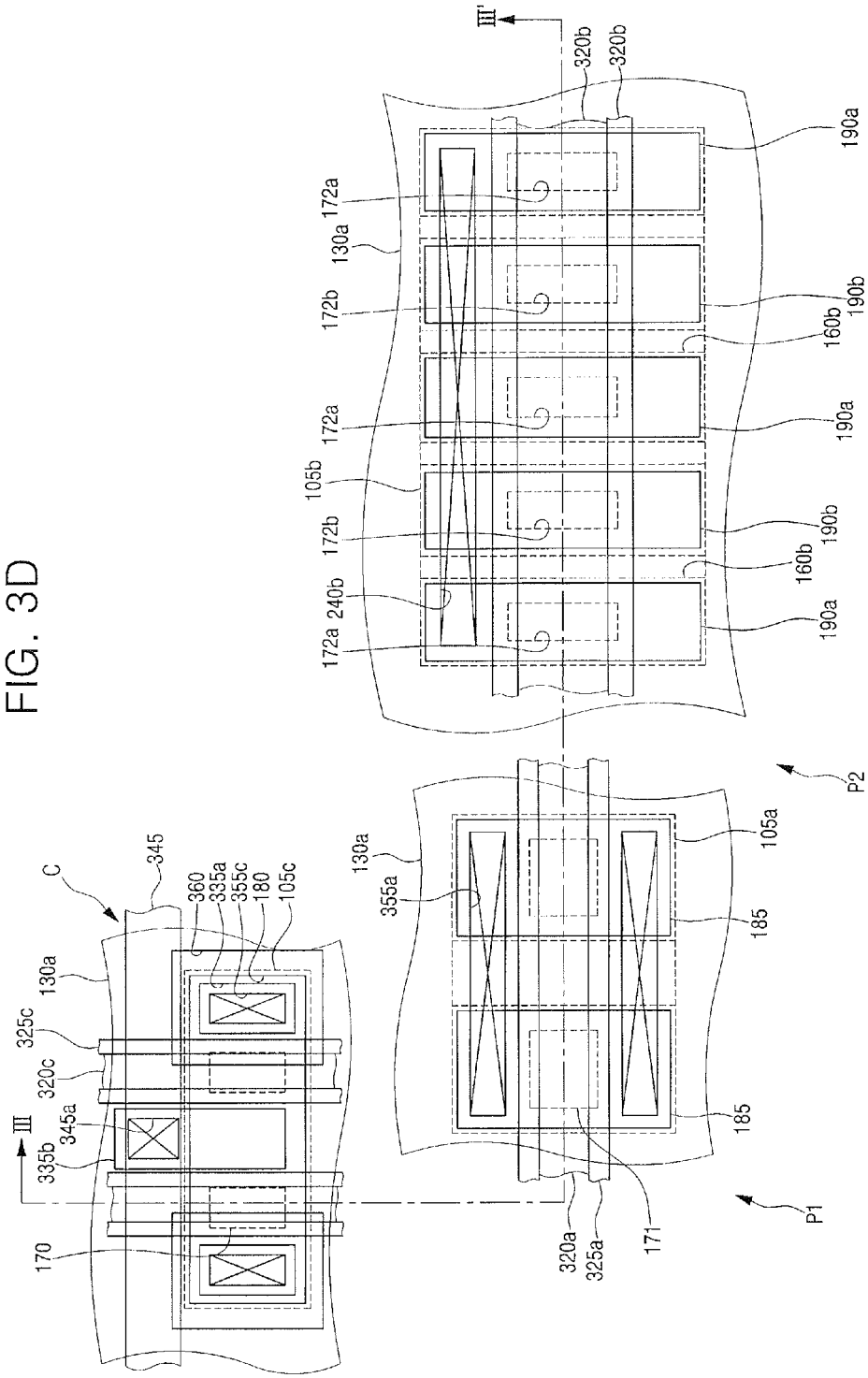
Figure 4E:
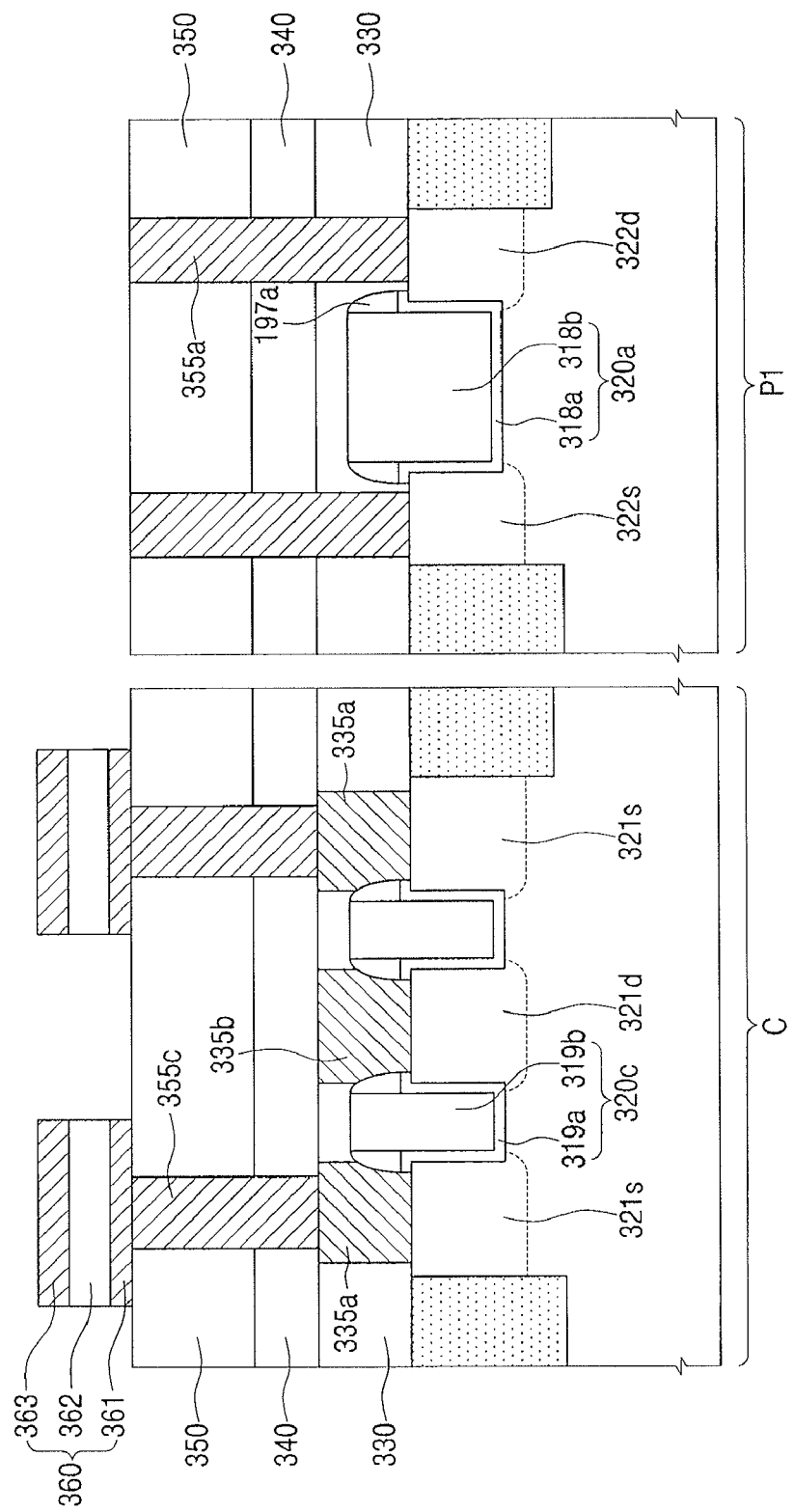

Subsequently, as shown in FIGS. 3D, 4D, 4E, source and drain regions may be formed in each of the first to third active regions 105a, 105b, and 105c, and upper layers, contacts, and storage devices formed by substantially the same method as the method described above with reference to FIGS. 1K, 2K, and 2L to form first to third transistors.

The first transistor formed in the first active region 105a may have top surfaces and outer sidewalls of the first semiconductor pillars 185, inner walls of the first recessed regions 171, and a channel region formed in the substrate between the first semiconductor pillars 185. The second transistor formed in the second active region 105b may have top surfaces and outer sidewalls of the second and fourth semiconductor pillars 190a and 190b, inner walls of the second and fourth recessed regions 172a and 172b, and a channel region formed in the substrate between the second and fourth semiconductor pillars 190a and 190b. The third transistor formed in the third active region 105c may have a top surface and an outer sidewall of the third semiconductor pillar 180, and a channel region formed in an inner wall of the third recessed region 170. Accordingly, a semiconductor device having transistors with an increased channel width compared to the planar type transistors may be formed. Such transistors having the increased channel width may have enhanced current drivability. Therefore, the operating speed of the semiconductor device having such transistors may be enhanced. Further, the integration density of the semiconductor device may be enhanced.

Each of the first to third transistors may be formed as cell transistors of the semiconductor memory device. Alternatively, each of the first to third transistors may also be used as transistors of the peripheral circuits.

In the meantime, the first to third transistors may be used for separate devices. In this case, when only the transistor formed in the first active region A is used for the semiconductor device, the processes of forming the first preliminary semiconductor pillars 152 may be simplified. That is, after the first hard mask 121a is formed, the process of forming the sacrificial mask 140 may be skipped, and the process of forming the first trench 150 may be carried out to form the first preliminary semiconductor pillars 152.

Alternatively, the photoresist patterns described with reference to FIGS. 3A and 4A may not be formed, and instead of the process of partially removing the buffer insulating layer patterns described with reference to FIGS. 3B and 4B, all of the buffer insulating layer patterns may be removed while the second isolation region may be partially etched, so that the third isolation region having top surfaces lower than the top surfaces of the semiconductor pillars may be formed. In this case, the subsequent processes may be substantially the same as the processes described with reference to FIGS. 3C and 4C.

Next, a method of fabricating a semiconductor device according to still other embodiments of the present invention will be described with reference to FIGS. 5A to 5H and 6A to 6H. In this case, FIGS. 5A to 5H are plan views illustrating methods of fabricating a semiconductor device in accordance with still other embodiments of the present invention, and FIG. 6A to 6H are cross-sectional views taken along line IV-IV' of FIGS. 5A to 5H, respectively.

Figure 5B:
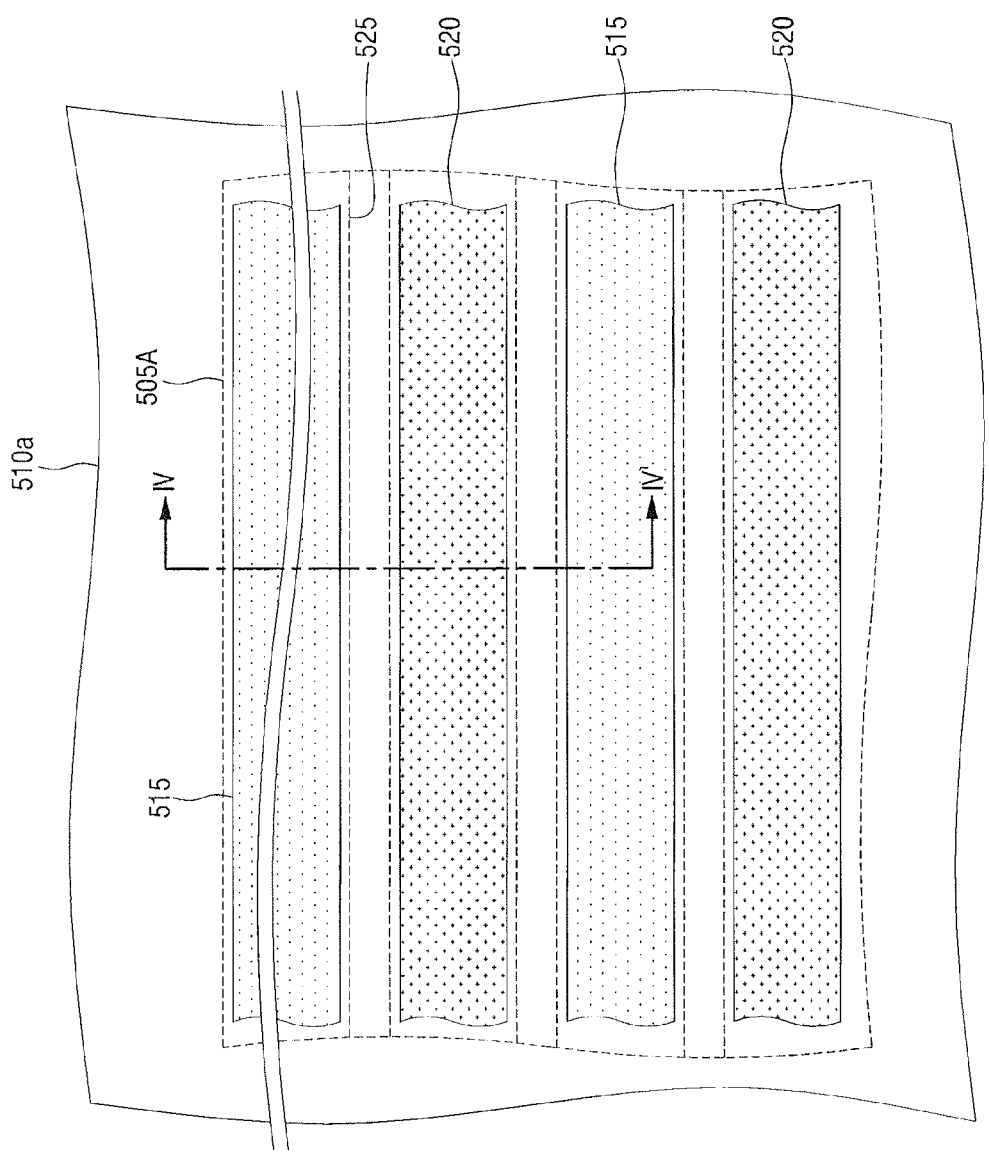
Figure 6A:
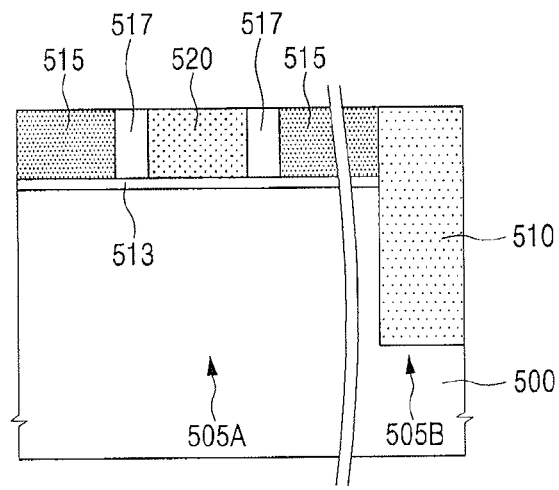
FIGS. 6A to 6H are cross-sectional views illustrating methods of fabricating the semiconductor device in accordance with still other embodiments of the present invention.

Referring to FIGS. 5A and 6A, a substrate 500 having a first region 505A and a second region 505B is prepared. The substrate 500 may be a semiconductor substrate. A preliminary hard mask is formed to cover the first region 505A. A pad insulating layer 513 may be formed before the preliminary hard mask is formed. A preliminary isolation region 510 is then formed in the second region 505B. The preliminary isolation region 510 may be formed by a trench isolation process. Subsequently, processes substantially similar or equal to the processes described with reference to FIGS. 1A to 1D and 2A to 2D may be employed to form a first hard mask 515 crossing the first region 505A, a second hard mask 520, and a sacrificial spacer 517 interposed between the first and second hard masks 515 and 520 in the first region 505A. For example, the first hard mask 515, the sacrificial spacer 517, and the second hard mask 520 may be formed by patterning the preliminary hard mask. Here, the first hard mask 515 may have at least one first opening crossing the first region 505A, the sacrificial spacer 517 covering a sidewall of the first hard mask 515 may be formed within the first opening to form a second opening crossing the first region 505A, and the second hard mask 520 may be formed to fill the second opening.

Alternatively, the first and second hard masks 515 and 520 may be formed by photolithography and etching processes instead of the process of using the sacrificial spacer 517. In this case, the sacrificial spacer 517 may be omitted when the photolithography and etching processes are employed to form the first and second hard masks 515 and 520.

Figure 6B:
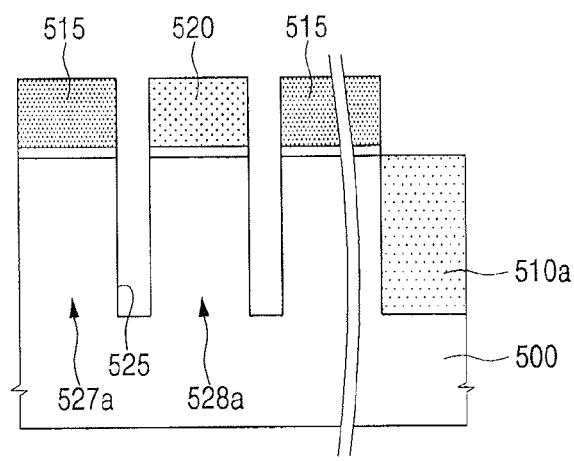

Referring to FIGS. 5B and 6B, the sacrificial spacer 517 and the substrate 500 is below the sacrificial spacer 517 are sequentially etched using the first and second hard masks 515 and 520 as etch masks to form an isolation trench 525 crossing the first region 505A within the substrate 500. As a result, first and second preliminary semiconductor pillars 527a and 528a may be formed in the first region 505A, which are divided by the isolation trench 525. The isolation trench 525 may have a bottom surface disposed on substantially the same level as the bottom surface of the preliminary isolation region 510.

Alternatively, when the sacrificial spacer 517 is formed of a material layer having an etch rate similar to that of the preliminary isolation region 510, the preliminary isolation region 510 may be partially etched while the sacrificial spacer 517 is removed, so that a first isolation region 510a may be formed. In this case, the first isolation region 510a may have a top surface disposed on substantially the same level as or lower than the bottom surfaces of the first and second hard masks 515 and 520.

Figure 6C:
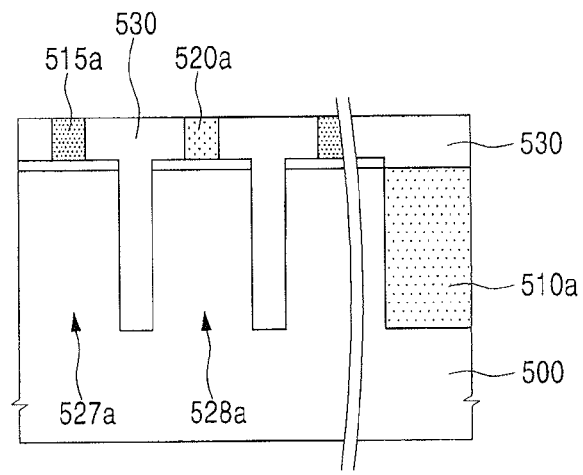

Referring to FIGS. 5C and 6C, at least sidewalls of the first and second hard masks 515 and 520 are isotropically etched to form a first hard mask pattern 515a having a width smaller than the width of the first hard mask 515, and a second hard mask pattern 520a having a width smaller than the width of the second hard mask 520. The isotropic etching may be carried out using a pull-back process. Subsequently, a preliminary isolation insulating layer 530 having a top surface disposed on substantially the same level as the top surfaces of the first and second hard mask patterns 515a and 520a is formed on the substrate having the first and second hard mask patterns 515a and 520a. The preliminary isolation insulating layer 530 may be formed of a silicon oxide layer having excellent gap fill characteristics.

Figure 5D:
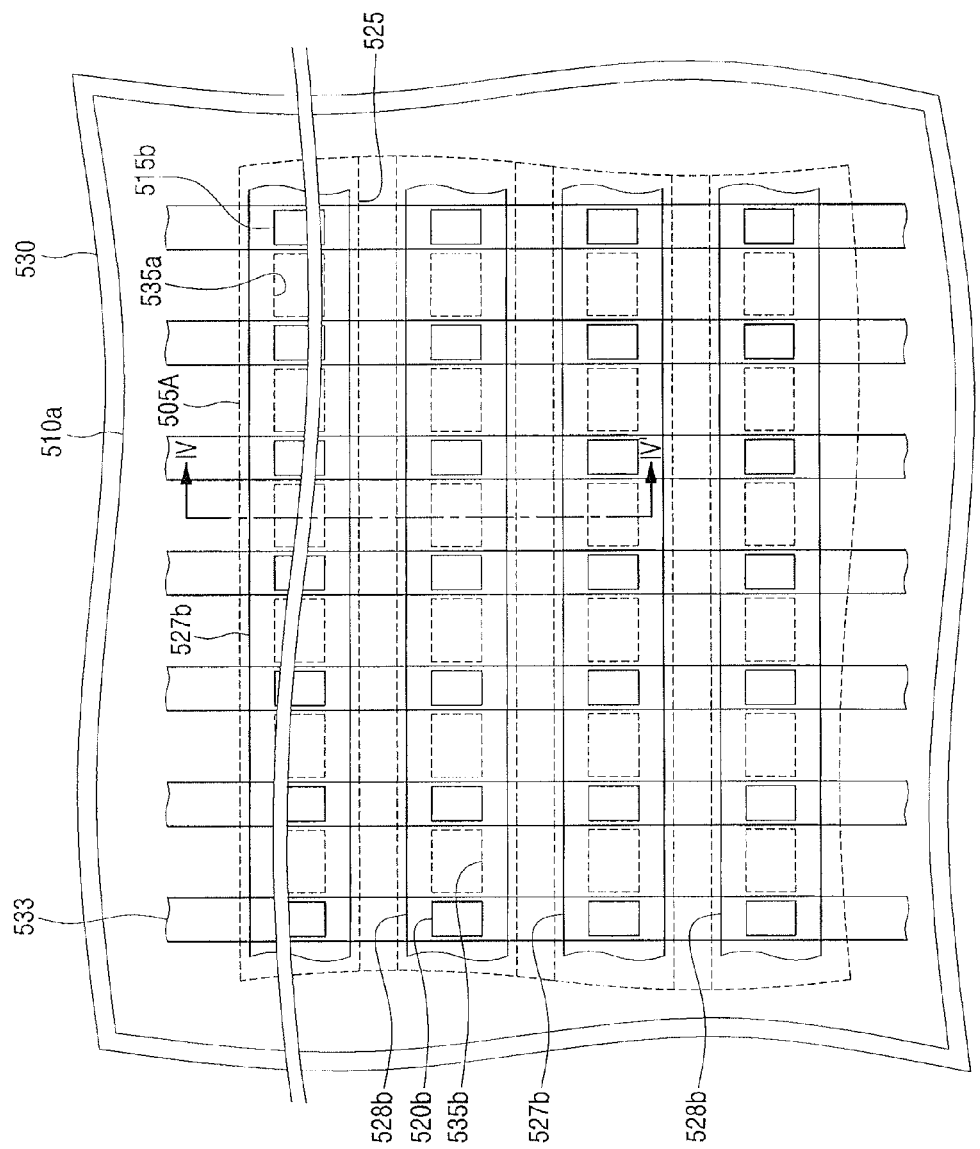
Figure 6D:
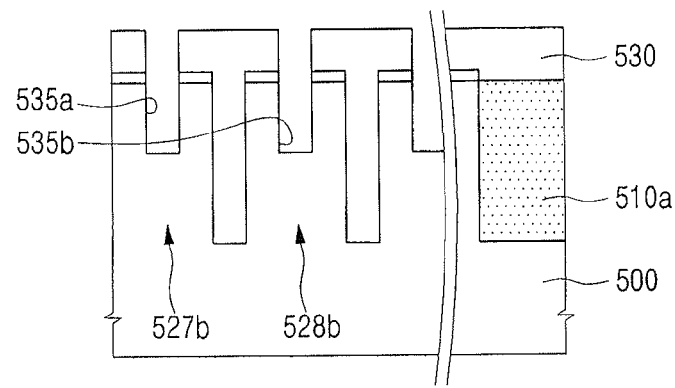

Referring to FIGS. 5D and 6D, a first photoresist pattern 533 having at least one opening crossing the first region 505A may be formed to cross the first and second hard mask patterns 515a and 520a on the substrate having the preliminary isolation insulating layer 530. The first and second hard mask patterns 515a and 520a may be etched while the pad insulating layer 513 and the substrate below the first and second hard mask patterns 515a and 520a are sequentially etched using the first photoresist pattern 533 as an etch mask. As a result, at least one first recessed region 535a may be formed in the first preliminary semiconductor pillar 527a to form a first semiconductor pillar 527b, and at least one second recessed region 535b may be formed in the second preliminary semiconductor pillar 528a to form a second semiconductor pillar 528b. The first and second recessed regions 535a and 535b may have bottom surfaces higher than the bottom surface of the first isolation region 510a. In addition, the first and second hard mask patterns 515a and 520a may remain to form first and second remaining patterns 515b and 520b, respectively.

Figure 5E:
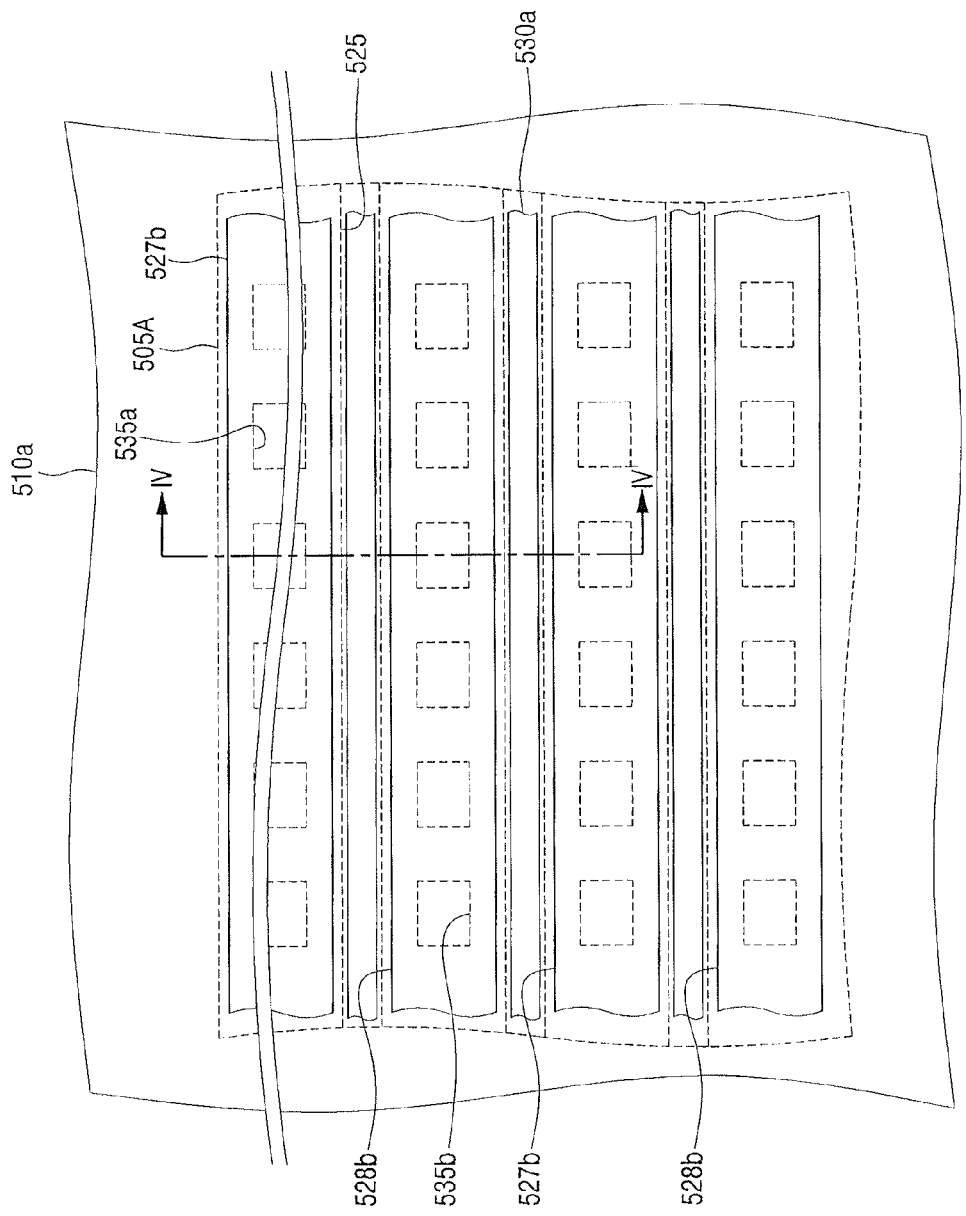
Figure 6E:
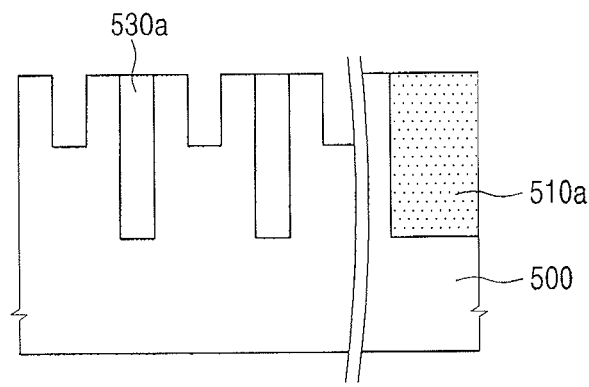

Referring to FIGS. 5E and 6E, the first photoresist pattern 533 may be removed. Subsequently, the first and second remaining patterns 515b and 520b may be removed. The preliminary isolation insulating layer 530 may be partially etched while the pad insulating layer 513 on the top surfaces of the first and second semiconductor pillars 527b and 528b are removed to expose the top surfaces of the first and second semiconductor pillars 527b and 528b. As a result, an isolation insulating layer 530a may be formed within the isolation trench 525.

Figure 5F:
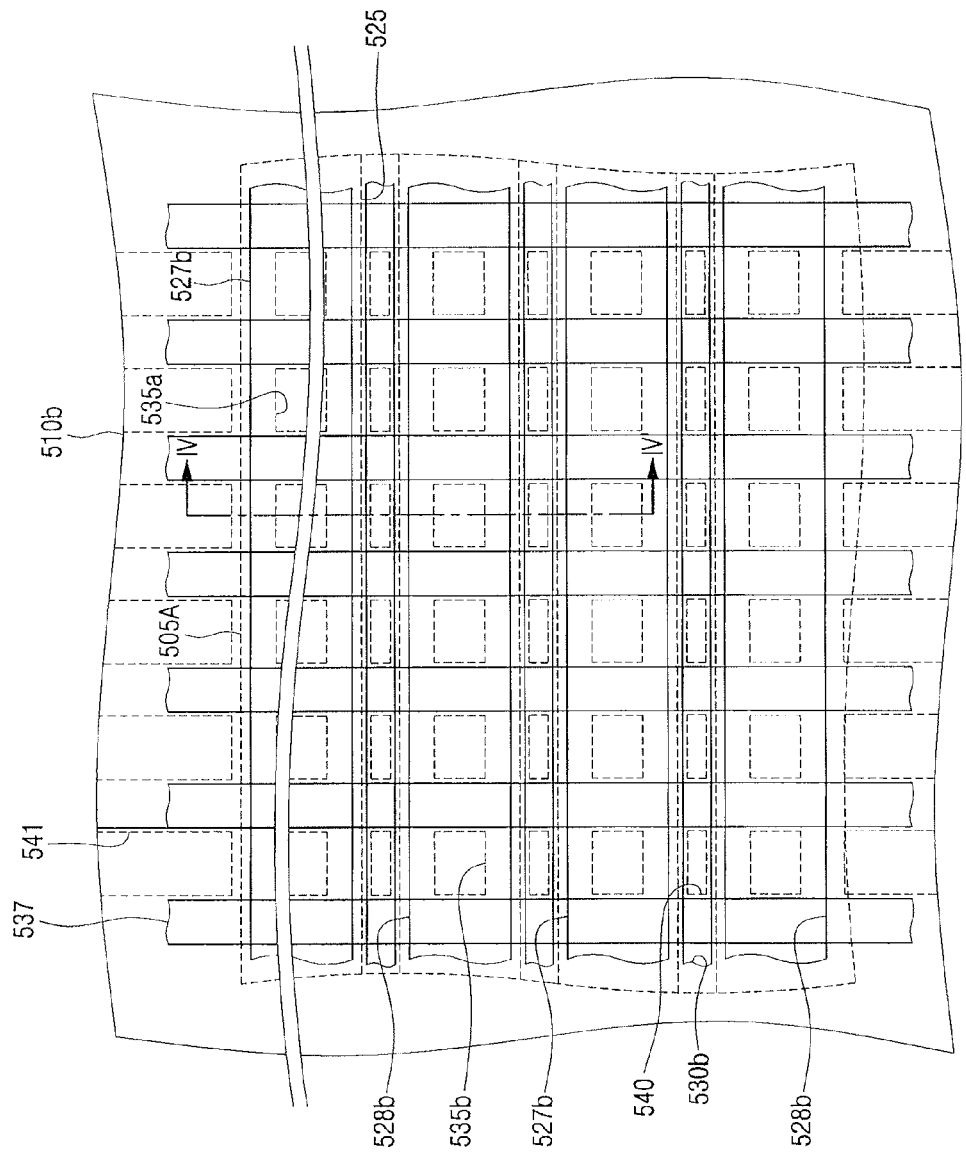
Figure 6F:
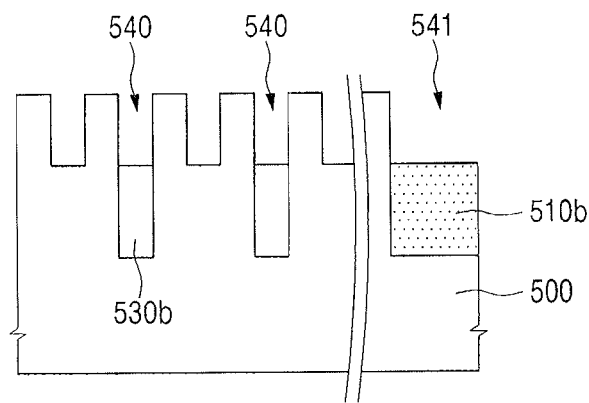

Referring to FIGS. 5F and 6F, a second photoresist pattern 537 having at least one opening crossing the first region 505A may be formed to cross the isolation insulating layer 530a on the substrate having the isolation insulating layer 530a. In this case, the opening of the second photoresist pattern 537 may be formed to expose the recessed regions 535a and 535b. In addition, the opening of the second photoresist pattern 537 may extend above the first isolation region 510a. In this case, the photo mask for forming the first photoresist pattern 533 described with reference to FIGS. 5D and 6D may be employed for the second photoresist pattern 537.

The isolation insulating layer 530a and the first isolation region 510a may be partially etched using the second photoresist pattern 537 as an etch mask. As a result, the top surface of the isolation insulating layer 530a exposed by the second photoresist pattern 537 may be formed lower than the top surfaces of the semiconductor pillars 527b and 528b to form an isolation insulating layer pattern 530b having a first trench region 540 exposing outer sidewalls of the semiconductor pillars 527b and 528b. And the top surface of the first isolation region 510a exposed by the second photoresist pattern 537 may be formed lower than the top surfaces of the semiconductor pillars 527b and 528b to form a second isolation region 510b having a second trench region 541 exposing outer sidewalls of the semiconductor pillars 527b and 528b.

Figure 5G:
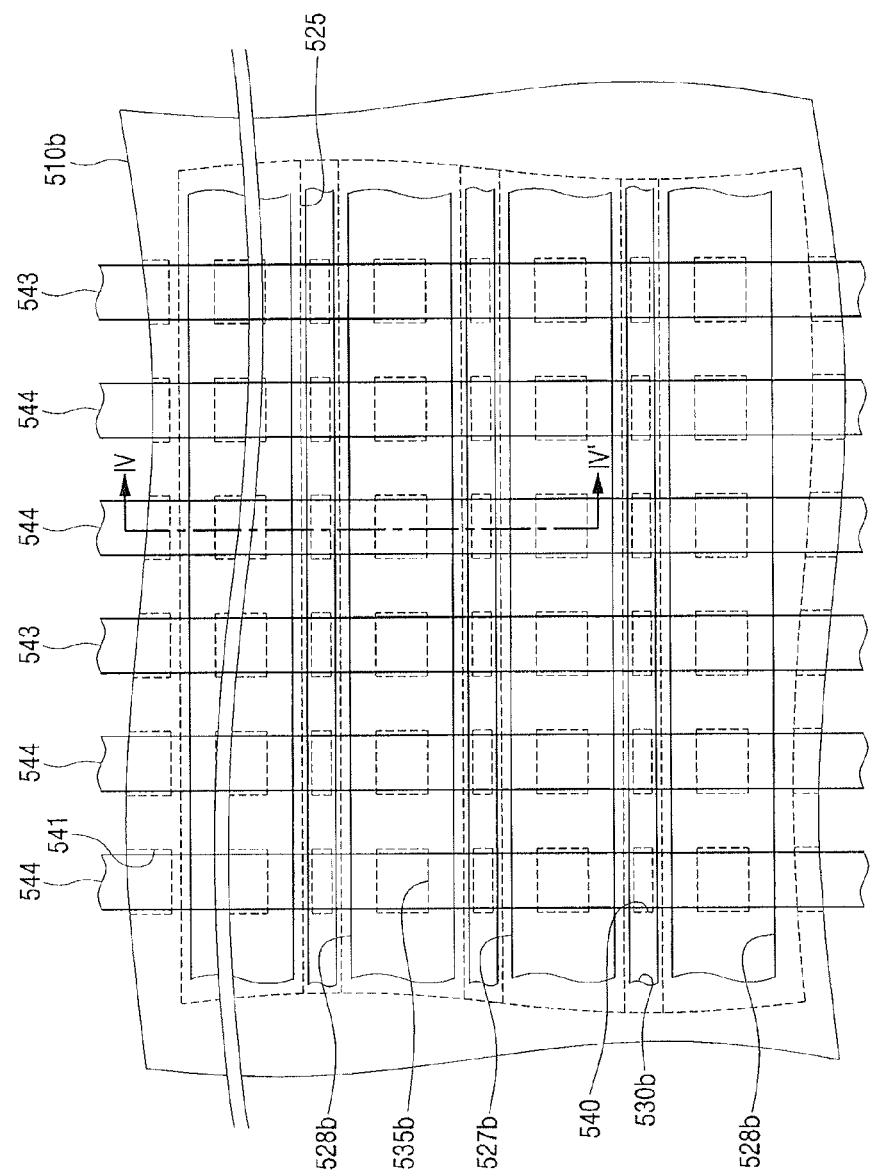
Figure 6G:
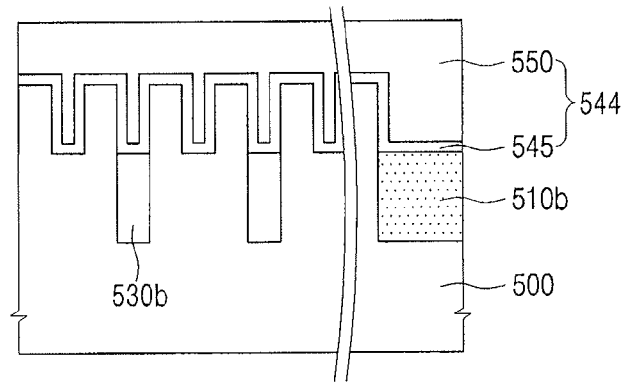

Referring to FIGS. 5G and 6G, the second photoresist pattern 537 may be removed. A plurality of parallel gate structures 544 and 543 are then formed to cross the first region 505A. Specifically, the gate structures 544 and 543 may be formed to simultaneously cross the first and second semiconductor pillars 527b and 528b while crossing the first and second recessed regions 535a and 535b. Source and drain regions may be formed in the semiconductor pillars 527b and 528b at both sides of the gate structures 544 and 543. As a result, transistors may be formed in each of the first and second semiconductor pillars 527b and 528b. Accordingly, a semiconductor device having transistors with an increased channel width compared to the planar type transistors may be formed. Such transistors having the increased channel width may have enhanced current drivability. Therefore, the operating speed of the semiconductor device having such transistors may be enhanced. Further, the integration density of the semiconductor device may be enhanced.

The gate structures 544 and 543 may be divided into the first gate structure 544 and the second gate structure 543. The first and second gate structures 544 and 543 are simultaneously formed, however, from a view point of a circuit, the second gate structure 543 may operate as a field gate for isolation and the first gate structure 544 may operate as an access gate for operating the device, i.e., a word line. When a first voltage is applied to the first gate structure 544, a second voltage different from the first voltage may be applied to the second gate structure 543. For example, when a positive voltage is applied to the first gate structure 544 to operate the device, a negative voltage may be applied to the second gate structure 543 so that the transistor including the first gate structure 544 may be suppressed from being affected by another adjacent transistor. Accordingly, when the second gate structures 543 are plural, each of the semiconductor pillars 527b and 528b formed between the second gate structures 543 may operate as a separate active region, and the first gate structure 544 formed between the second gate structures 543 may act as a gate of the access transistor. Accordingly, a pair of first gate structures 544 may be formed between a pair of second gate structures 543 to form cell transistors of the semiconductor memory device as shown in FIG. 5G. Each of the first and second gate structures 544 and 543 may be composed of a gate dielectric layer 545 and a gate electrode 550, which are sequentially stacked.

A gate spacer may be formed to cover both sidewalls of each of the gate structures 544 and 543.

Alternatively, the second gate structure 543 may be omitted. When the second gate structure 543 is omitted, a pair of access transistors may be formed in each of the semiconductor pillars 527b and 528b. That is, a pair of first gate structures 544 may be formed in each of the semiconductor pillars 527b and 528b.

Figure 5H:
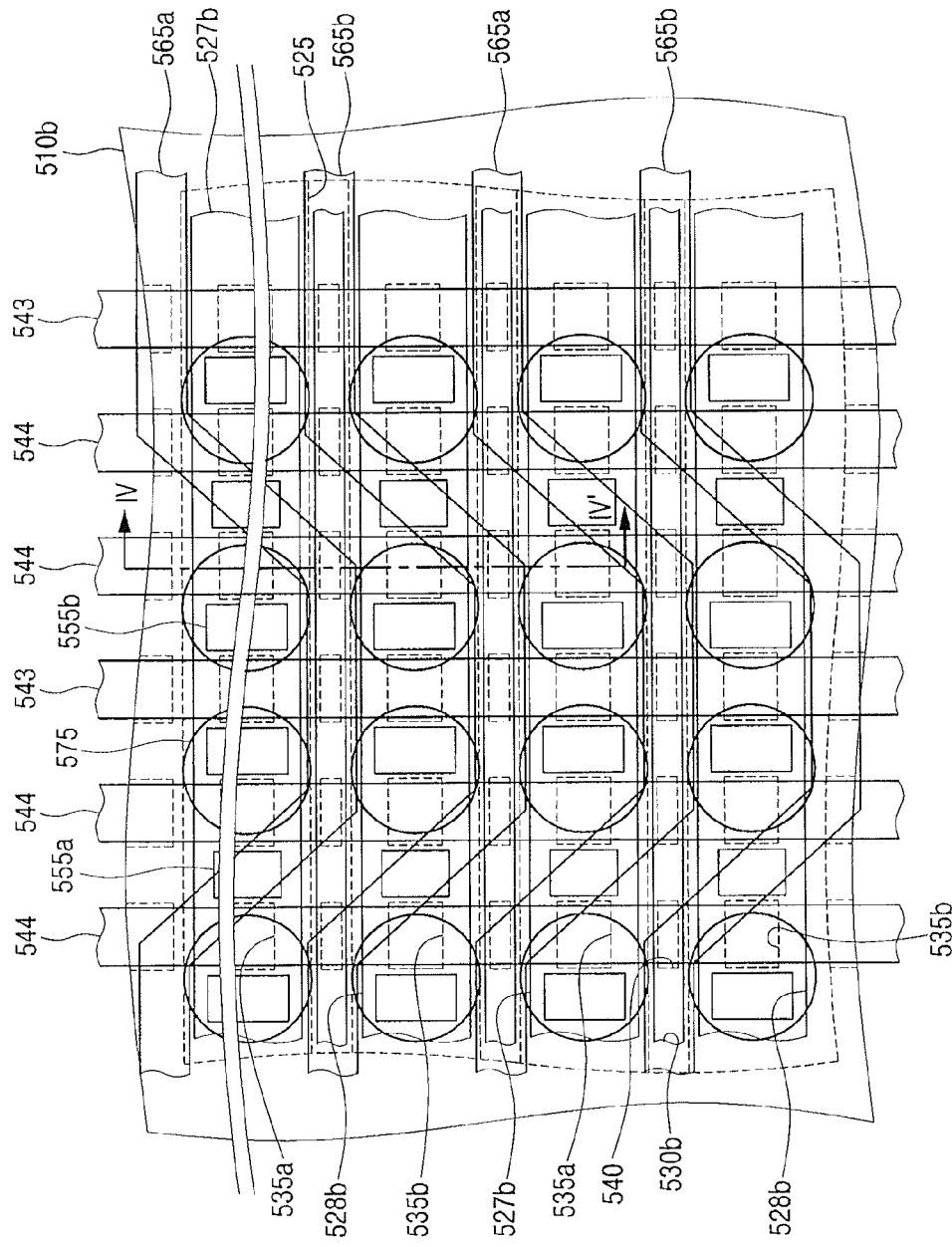
Figure 6H:
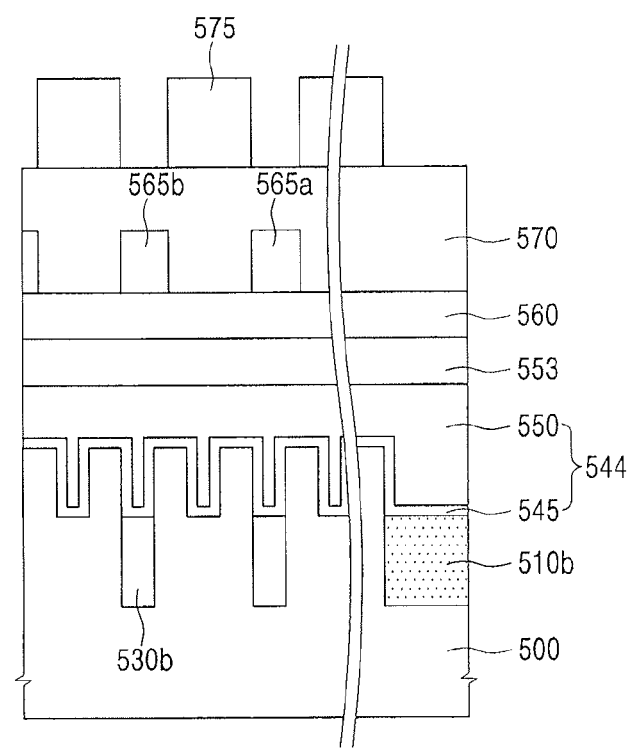

Referring to FIGS. 5H and 6H, a first interlayer insulating layer 553 may be formed on the substrate having the first and second gate structures 544 and 543. Subsequently, a first landing pad 555a and a second landing pad 555b may be formed, which penetrate the first interlayer insulating layer 553 and respectively contact the source and drain regions disposed at both sides of the first gate structure 544.

A second interlayer insulating layer 560 may be formed on the substrate having the landing pads 555a and 555b. A bit line contact structure may be formed through the second interlayer insulating layer 560 to be electrically connected to the first landing pad 555a. First and second bit lines 565a and 565b may be formed on the second interlayer insulating layer 560, which are in contact with the bit line contact structure. Specifically, the first bit line 565a may be formed, which overlaps the first isolation trench 525 over the first isolation trench 525 isolating the first semiconductor pillar 527b from the second semiconductor pillar 528b and diagonally crossing over the first semiconductor pillar 527b. In the same manner, the second bit line 565b may be formed, which overlaps the first isolation trench 525 over the first isolation trench 525 isolating the second semiconductor pillar 528b from the first semiconductor pillar 527b and diagonally crossing over the second semiconductor pillar 528b. The first and second bit lines 565a and 565b may be parallel to each other.

A third interlayer insulating layer 570 may be formed on the substrate having the bit lines 565a and 565b. Subsequently, a storage contact structure may be formed, which sequentially penetrates the third and second interlayer insulating layers 570 and 560 and contacts the second landing pad 555b. The storage contact structure may be formed of a conductive material layer. A data storage element structure 575 may be formed on the third interlayer insulating layer 570. The data storage element structure 575 may be a capacitor or a non-volatile data storage element structure. The non-volatile data storage element structure may include a resistor. That is, the non-volatile data storage element structure may include a lower electrode contacting the storage contact structure, a resistor contacting the lower electrode, and an upper electrode contacting the resistor.

Accordingly, a semiconductor device capable of being highly integrated while having an increased channel width as compared to the conventional planar type transistor may be fabricated. Further, highly integrated semiconductor memory devices using transistors with the increased channel width as cell transistors may be fabricated.

Next, a method of fabricating a semiconductor device according to yet other embodiments of the present invention will be described with reference to FIGS. 7A to 7D and 8A to 8D. FIGS. 7A to 7D are plan views illustrating methods of fabricating a semiconductor device in accordance with yet other embodiments of the present invention, and FIG. 8A to 8D are cross-sectional views taken along line V-V' of FIGS. 7A to 7D, respectively.

Figure 7B:
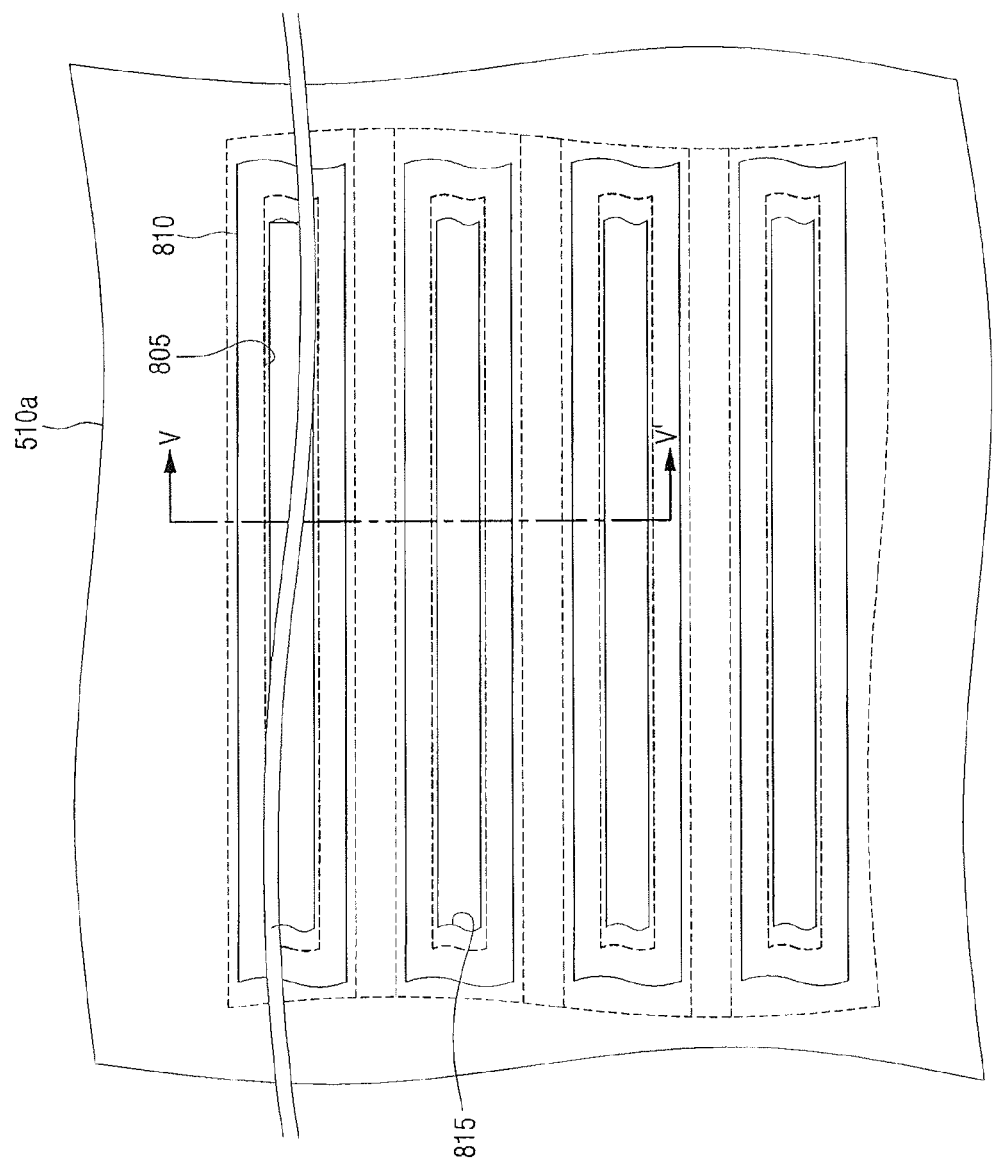
Figure 8A:
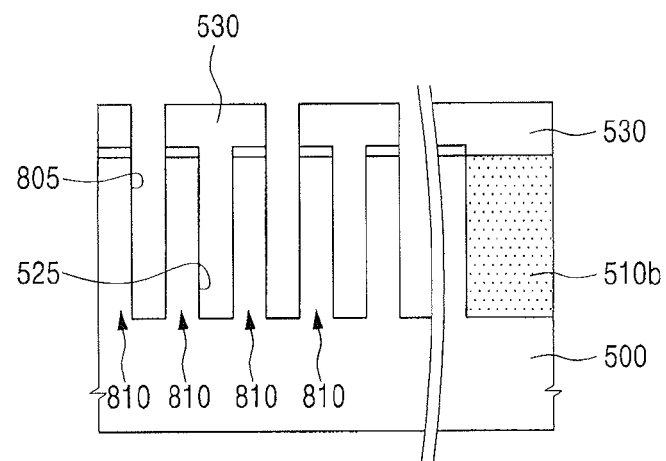
FIGS. 8A to 8D are cross-sectional views illustrating methods of fabricating the semiconductor device in accordance with yet other embodiments of the present invention.

Referring to FIGS. 7A and 8A, a substrate 500 is first prepared, which has been subjected to the processes described with reference to FIGS. 5A to 5C and 6A to 6C, i.e., which has been subjected to the processes of forming the preliminary isolation insulating layer 530. The preliminary isolation insulating layer 530 is used as an etch mask to remove the first hard mask pattern 515a and the second hard mask pattern 520a while the substrate below the first and second hard mask patterns 515a and 520a is etched to form recessed regions 805 in central portions of the respective first and second preliminary semiconductor pillars 527a and 528a. For example, a recessed region 805 may be formed within the first preliminary semiconductor pillar 527a, and another recessed region 805 may be formed within the second preliminary semiconductor pillar 528a. The recessed regions 805 may have bottom surfaces formed on substantially the same level as the bottom surfaces of the first isolation region 510a. Accordingly, semiconductor pillars 810 having the recessed regions 805 may be formed.

Figure 8B:
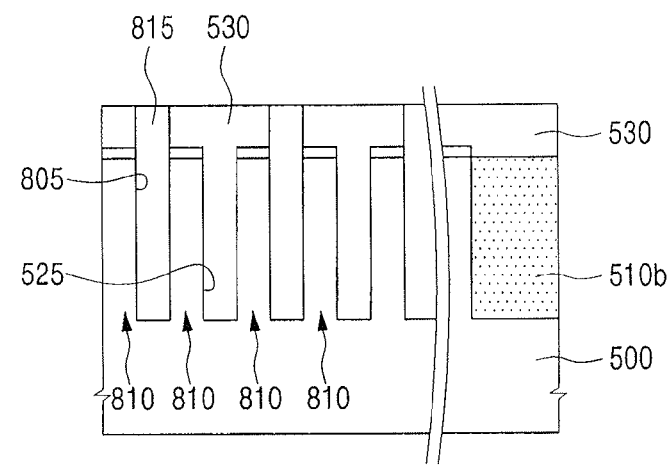

Referring to FIGS. 7B and 8B, a preliminary recessed region insulating layer 815 is formed to fill the recessed regions 805. For example, an insulating layer may be formed on the substrate having the recessed regions 805 and then planarized to form the preliminary recessed region insulating layer 815 having a top surface formed on substantially the same level as the top surface of the preliminary isolation insulating layer 530. In this case, the preliminary recessed region insulating layer 815 may be formed of a material layer having substantially the same etch rate as the preliminary isolation insulating layer 530. For example, when the preliminary isolation insulating layer 530 is formed of a silicon oxide layer, the preliminary recessed region insulating layer 815 may be formed of a silicon oxide layer.

Figure 7C:
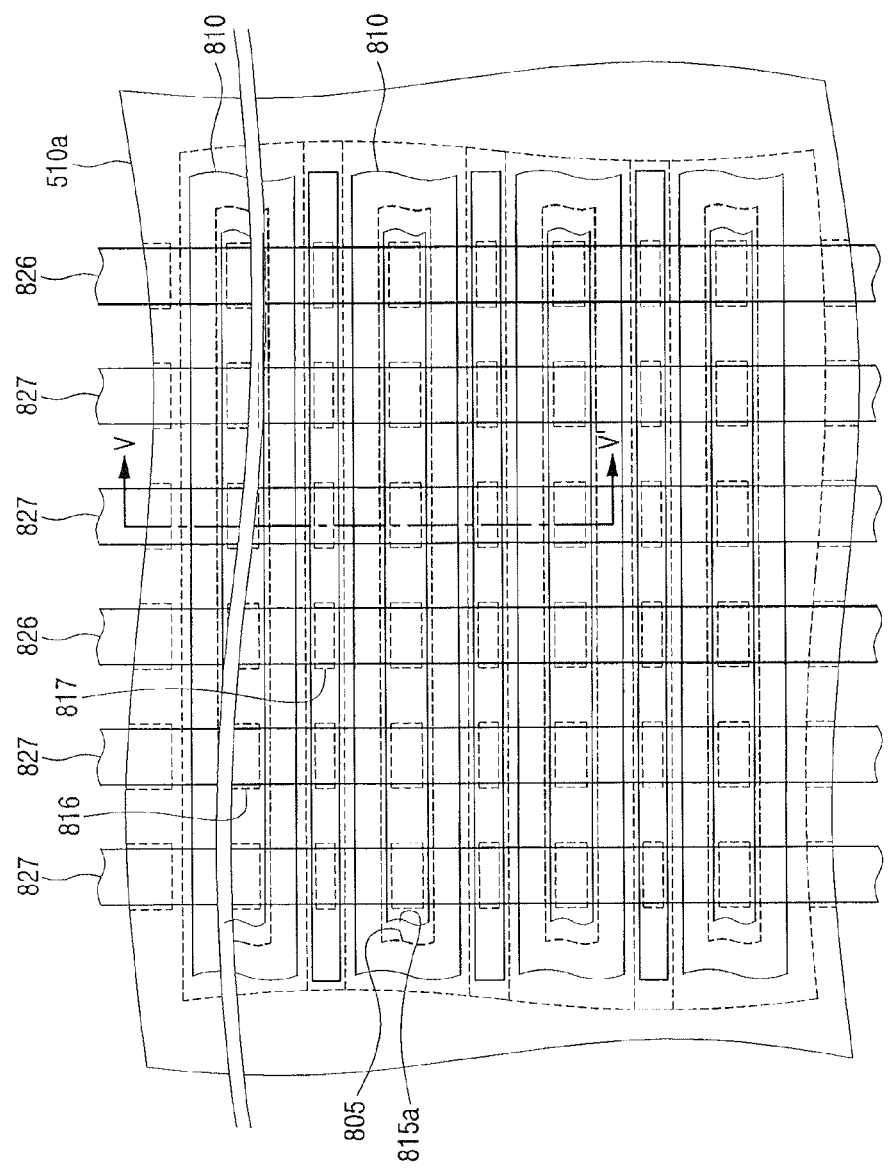
Figure 8C:
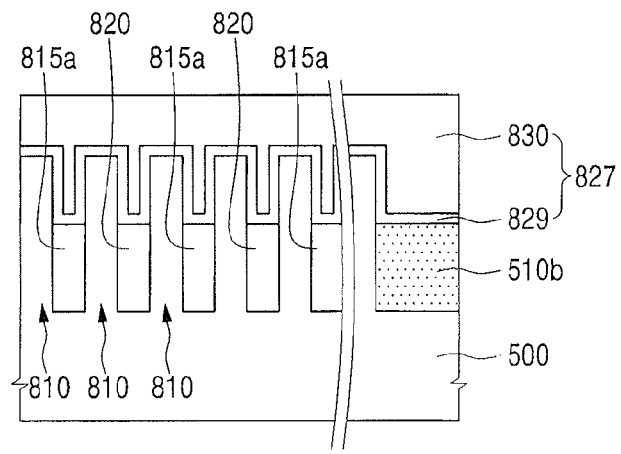

Referring to FIGS. 7C and 8C, the preliminary isolation insulating layer 530 and the preliminary recessed region insulating layer 815 are partially etched to form a recessed region insulating layer remaining within the recessed regions 805 and an isolation insulating layer remaining within the isolation trench 525, so that the top surfaces of the semiconductor pillars 810 are exposed. In this case, the pad insulating layer 513 remaining on the top surfaces of the semiconductor pillars 810 may be removed by etching while the preliminary isolation insulating layer 530 and the preliminary recessed region insulating layer 815 are partially etched. A photoresist pattern having openings crossing the semiconductor pillars 810 may be formed on the substrate having the recessed region insulating layer and the isolation insulating layer. Subsequently, the recessed region insulating layer and the isolation insulating layer may be partially etched using the photoresist pattern as an etch mask to form a recessed region insulating layer pattern 815a having a recessed region portion 816 where the top surface of the recessed region insulating layer is lowered, and an isolation insulating layer pattern 820 having a trench portion 817 where the top surface of the isolation insulating layer is lowered. Predetermined regions of the outer sidewalls of the semiconductor pillars 810 may be exposed by the recessed region portion 816 and the trench portion 817. In this case, the recessed region portion 816 and the trench portion 817 may have bottom surfaces higher than the bottom surface of the isolation region 510b. Subsequently, the photoresist pattern may be removed.

A plurality of parallel gate structures 827 and 826 are formed to cross the semiconductor pillars 810. Each of the gate structures 827 and 826 may be composed of a gate dielectric layer 829 and a gate electrode 830, which are sequentially stacked. Specifically, the gate structures 827 and 826 may be formed to simultaneously cross the semiconductor pillars 810 while simultaneously crossing the recessed region portion 816 and the trench portion 817. Source and drain regions may be formed in the semiconductor pillars 810 at both sides of the gate structures 827 and 826. As a result, transistors may be formed.

The gate structures 827 and 826 may be divided into the first gate structure 827 and the second gate structure 826. The first and second gate structures 827 and 826 are simultaneously formed, however, from a view point of a circuit, the second gate structure 826 may act as a field gate for isolation and the first gate structure 827 may act as an access gate for operating the device, i.e., a word line. For example, when a positive voltage is applied to the first gate structure 827 to operate the device, a negative voltage may be applied to the second gate structure 826 so that the transistor including the first gate structure 827 may be suppressed from being affected by another adjacent transistor.

Further, two transistors may be formed by one gate structure 827 crossing one semiconductor pillar 810. That is, the recessed region insulating layer pattern 815a having the recessed region portion 816 is formed in a central portion of the semiconductor pillar 810, so that fins facing each other of the semiconductor pillar 810 are spaced apart from each other. The fins are connected to form one semiconductor pillar 810, however, each of the fins disposed between the second gate structures 826 may act as one active region. Accordingly, two transistors having the fin structure are formed by one gate structure 827 crossing one semiconductor pillar 810, and each of the transistors having the fin structure may use a top surface and outer sidewalls of the fin as a channel region. Accordingly, a transistor having multiple channel regions may be formed and a highly integrated semiconductor device may also be implemented.

Figure 7D:
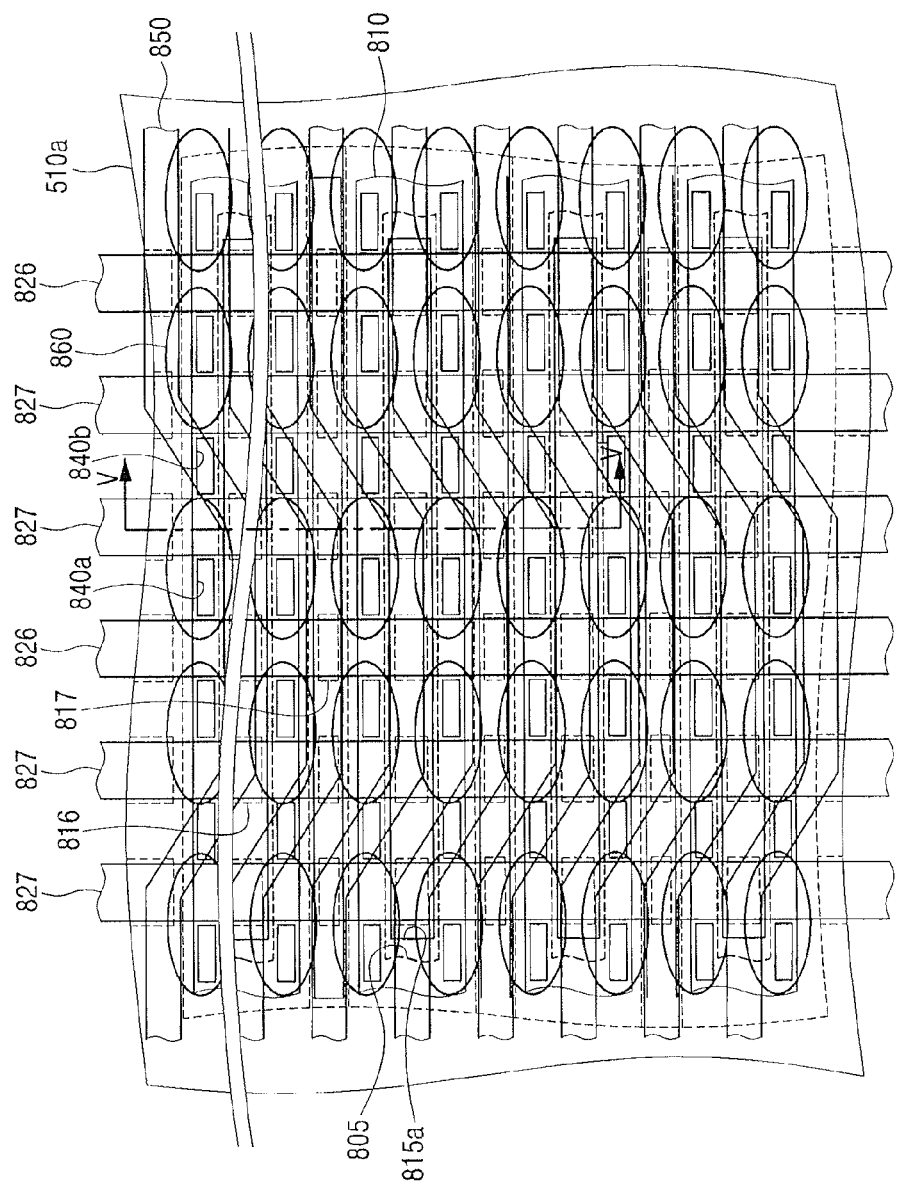
Figure 8D:
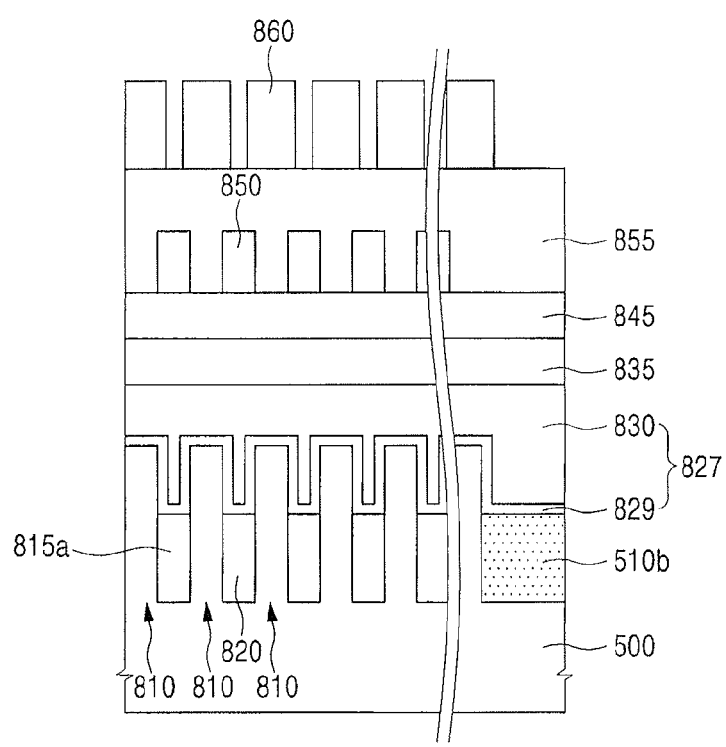

Referring to FIGS. 7D and 8D, a first interlayer insulating layer 835 is formed on the substrate having the gate structures 826 and 827. Subsequently, a first landing pad 840a and a second landing pad 840b may be formed, which penetrate the first interlayer insulating layer 835 and respectively contact the source and drain regions disposed at both sides of the first gate structure 827.

Subsequently, a second interlayer insulating layer 845 may be formed on the substrate having the landing pads 840a and 840b. A bit line contact structure may be formed through the second interlayer insulating layer 845 to be electrically connected to the second landing pad 840b. Bit lines 850 contacting the bit line contact structure may be formed on the second interlayer insulating layer 845 as shown in FIG. 7D.

A third interlayer insulating layer 855 may be formed on the substrate having the bit lines 850. Subsequently, a storage contact structure may be formed, which sequentially penetrates the third and second interlayer insulating layers 855 and 845 to and contact the first landing pad 840a. The storage contact structure may be formed of a conductive material layer. A data storage element structure 860 may be formed on the third interlayer insulating layer 855. The data storage element structure 860 may be a capacitor or a non-volatile data storage element structure. The non-volatile data storage element structure may include a resistor. That is, the non-volatile data storage element structure may include a lower electrode contacting the storage contact structure, a resistor contacting the lower electrode, and an upper electrode contacting the resistor. The resistor may refer to a resistant element having a variable resistance.

Next, a structure of a semiconductor device according to embodiments of the present invention will be described with reference to FIGS. 1K, 2K, and 2L.

Referring to FIGS. 1K, 2K, and 2L, a substrate 100 includes a first region and a second region adjacent to the first region. The substrate 100 may be a semiconductor substrate, for example, a silicon substrate. The first region may be an active region, and the second region may be a field region. Specifically, the substrate 100 may include a first circuit region A, a second circuit region B, and a third circuit region C. A first active region 105a defined by a field region 105f, a second active region 105b defined by the field region 105f, and a third active region 150c defined by the field region 105f, may be formed in the first circuit region A, the second circuit region B, and the third circuit region C, respectively. A second isolation region 130a is formed in the field region 105f. The second isolation region 130a may be a trench isolation region.

A plurality of first semiconductor pillars 185 are disposed in the first circuit region A, which protrude from the substrate 100 and respectively have at least one recessed region 171 in its central portion. The first semiconductor pillars 185 may be self-aligned with the first active region 105a and spaced apart from each other within the first active region 105a. The recessed region 171 may have a bottom surface higher than a bottom surface of the isolation region 130a. The first semiconductor pillars 185 may be spaced apart from each other by a first trench 150 disposed between the first semiconductor pillars 185. The first trench 150 may have a bottom surface higher than the bottom surface of the isolation region 130a. A first buffer insulating layer pattern 160a filling the first trench 150 may be interposed between the first semiconductor pillars 185. At least one first gate structure 192a may be disposed, which crosses the first semiconductor pillars 185 and the first recessed region 171. The first gate structure 192a may cover across inner walls of the first recessed region 171 and top surfaces of the first semiconductor pillars 185. Source and drain regions 205s and 205d may be disposed in the first semiconductor pillars 185 at both sides of the first gate structure 192a. As a result, first transistors having top surfaces of the first semiconductor pillars 185 and inner walls of the first recessed regions 185 as channel regions may be disposed in the first circuit region A.

In the same manner, second and fourth semiconductor pillars 190a and 190b protruding from the substrate 100 may be disposed in the second circuit region B. The second and fourth semiconductor pillars 190a and 190b may be self-aligned with the second active region 105b and spaced apart from each other within the second active region 105b. At least one second recessed region 172a may be disposed in a central portion of the second semiconductor pillar 190a, and at least one fourth recessed region 172b may be disposed in the fourth semiconductor pillar. The second and fourth recessed regions 172a and 172b may have bottom surfaces higher than the top surface of the isolation region 130a. At least one second gate structure 192b is disposed, which crosses the second and fourth semiconductor pillars 190a and 190b. The second gate structure 192b may cover across inner walls of the second and fourth recessed regions 172a and 172b. Source and drain regions may be disposed in the second and fourth semiconductor pillars 190a and 190b at both sides of the second gate structure 192b. As a result, second transistors may be disposed in the second circuit region B, which have the top surfaces of the second and fourth semiconductor pillars 190a and 190b and the inner walls of the second and fourth recessed regions 172a and 172b as channel regions.

A semiconductor pillar 180 may be disposed in the third circuit region C, which protrudes from the substrate of the third active region 105c and has at least one recessed third recessed region 170 in its central portion. At least one third gate structure 192c may be disposed, which crosses the semiconductor pillar 180 and the third recessed region 170. Source and drain regions 203s and 203d may be disposed in the third semiconductor pillar 180 at both sides of the third gate structure 192c. As a result, third transistors may be disposed in the third circuit region C, which have a top surface of the third semiconductor pillar 180 and a inner wall of the third recessed region 170 as a channel region. As such, the first to third transistors may have an increased channel width as compared to planar-type transistors.

In the meantime, the first to third transistors may be used as cell transistors of the semiconductor memory device. In this case, a description is exemplarily given for the case that the third transistor is a cell transistor of the semiconductor memory device.

A pair of third gate structures 192c crossing the third semiconductor pillar 180 may be disposed. A pair of third recessed regions 170 may be disposed in a central portion of the third semiconductor pillar 180 intersecting the third gate structures 192c. Source and drain regions may be formed in the third semiconductor pillar 180 disposed at both sides of the third gate structures 192c.

The second isolation region 130a may have a top surface disposed on substantially the same level as top surfaces of the semiconductor pillars 185, 190a, 190b, and 180.

A first interlayer insulating layer 210 may be disposed on the substrate having the third gate structures 192c. First and second landing pads 215a and 215b may be disposed in the first interlayer insulating layer 210, which are formed by a typical self-aligned contact process. A second interlayer insulating layer 220 may be disposed on the substrate having the first interlayer insulating layer 210. A bit line 230 may be disposed on the second interlayer insulating layer 220. A bit line contact structure 230a may be disposed through the second interlayer insulating layer 220 disposed between the bit line 230 and the second landing pad 215b so that the bit line 230 and the second landing pad 215b are electrically connected to each other. A third interlayer insulating layer 235 may be disposed on the substrate having the bit line 230. A storage contact structure 240c may be disposed through the third and second interlayer insulating layers 235 and 220 to be electrically connected to the first landing pad 215a. A data storage element structure 249 may be disposed on the third interlayer insulating layer 235. The data storage element structure 249 may be composed of a lower electrode 250, a data storage element material layer 253, and an upper electrode 257, which are sequentially stacked. The data storage element material layer 253 may be a dielectric layer or a resistor. Accordingly, the data storage element structure 249 may be a capacitor or a non-volatile data storage element structure.

Next, a structure of a semiconductor device according other embodiments of the present invention will be described with reference to FIGS. 3C and 4C. In this case, the structure is similar to the structure described with reference to FIGS. 1K, 2K, and 2L, however, has a more increased channel width. Specifically, the third isolation region 130b formed in the field region 105f, unlike the second isolation region 130a described with reference to FIGS. 1K, 2K, and 2L, may have top surfaces lower than the top surfaces of the semiconductor pillars 185, 190a, 190b, and 180 at least in regions disposed on extended lines of the first recessed regions 171 and adjacent to the first semiconductor pillars 185, regions disposed on extended lines of the second and fourth recessed regions 172a and 172b and adjacent to the second and fourth semiconductor pillars 190a and 190b, and regions disposed on an extended line of the third recessed region 170 and adjacent to the third semiconductor pillars 180 as shown in FIGS. 3C and 4C. A first gate structure 320a crossing the first semiconductor pillars 185, a second gate structure 320b crossing the second and fourth semiconductor pillars 190a and 190b, and a third gate structure 320c crossing the third semiconductor pillar 180 may be disposed. In this case, the first gate structure 320a covers across top surfaces and outer sidewalls of the first semiconductor pillars 185, inner walls of the first recessed regions 171, and the substrate between the first semiconductor pillars 185, the second gate structure 320b covers across top surfaces and outer sidewalls of the second and fourth semiconductor pillars 190a and 190b, inner walls of the second and fourth recessed regions 172a and 172b, and the substrate between the second and fourth semiconductor pillars 190a and 190b, and the third gate structure 320c covers across top surfaces and outer sidewalls of the third semiconductor pillars 180, and an inner wall of the third recessed region 170. Source and drain regions may be disposed within the semiconductor pillars at both sides of the gate structures. As a result, a first transistor, a second transistor, and a third transistor having fin structures may be disposed in the first circuit region A, the second circuit region B, and the third circuit region C, respectively. Accordingly, transistors having the fin structure of additionally increased channel widths may be provided.

Next, a structure of a semiconductor device according to still other embodiments of the present invention will be described with reference to FIGS. 5H and 6H.

Referring to FIGS. 5H and 6H, a substrate 500 includes a first region 505A and a second region 505B. The substrate 500 may be a semiconductor substrate. An isolation region 510b may be disposed in the second region 505B. First and second semiconductor pillars 527b and 528b are disposed in the first region 505A, which are self-aligned with the first region 505A and spaced apart from each other. In this case, at least one recessed first recessed region 535a may be disposed in a central portion of the first semiconductor pillar 527b, and at least one recessed second recessed region 535b may be disposed in a central portion of the second semiconductor pillar 528b. The recessed regions 535a and 535b may have bottom surfaces at a level that is higher than a bottom surface of the isolation region 510b. The first semiconductor pillar 527b and the second semiconductor pillar 528b may be disposed parallel to each other, and an isolation insulating layer pattern 530b may be disposed between the first semiconductor pillar 527b and the second semiconductor pillar 528b. A bottom surface of the isolation insulating layer pattern 530b may be disposed on substantially the same level as the bottom surface of the isolation region 510b.

Top surfaces of the isolation region 510b and the isolation insulating layer pattern 530b disposed on extended lines of the first and second recessed regions 535a and 535b may be lower than the top surfaces of the semiconductor pillars 527b and 528b. Gate structures 544 and 543 may be disposed across the first and second semiconductor pillars 527b and 528b while crossing the first and second recessed regions 535a and 535b. The gate structures 544 and 543 are preferably plural in number and parallel to each other. Source and drain regions may be disposed in the semiconductor pillars 527b and 528b at both sides of the gate structures 544 and 543. As a result, transistors may be disposed in the first semiconductor pillar 527b by the number of the gate structures 544 and 543 crossing the first semiconductor pillar 527b, and transistors may be disposed in the second semiconductor pillar 528b by the number of the gate structures 544 and 543 crossing the second semiconductor pillar 528b.

The gate structures 544 and 543 may be divided into the first gate structure 544 and the second gate structure 543. From the view point of a circuit, the second gate structure 543 may operate as a field gate for isolation, and the first gate structure 544 may serve as an access gate for operating the device, i.e., a word line. For example, when a positive voltage is applied to the first gate structure 544 to operate the device, a negative voltage may be applied to the second gate structure 543 so that a transistor including the first gate structure 544 may be suppressed from being affected by another adjacent transistor. Accordingly, when the second gate structures 543 are plural, each to of the semiconductor pillars 527b and 528b disposed between the second gate structures 543 may act as a separate active region, and the first gate structure 544 disposed between the second gate structures 543 may act as a gate of the access transistor. Accordingly, a pair of first gate structures 544 may be formed between a pair of second gate structures 543 to form cell transistors of the semiconductor memory device as shown in FIG. 5H.

A first interlayer insulating layer 553 may be disposed on the substrate having the first gate structure 544. Subsequently, a first landing pad 555a and a second landing pad 555b may be disposed, which penetrate the first interlayer insulating layer 553 and contact source and drain regions disposed at both sides of the first gate structure 544, respectively. A second interlayer insulating layer 560 may be disposed on the substrate having the landing pads 555a and 555b. A preliminary bit line contact structure may be disposed through penetrates the second interlayer insulating layer 560 to be electrically connected to the first landing pad 555a. The first landing pad 555a and the preliminary bit line contact structure may constitute a bit line contact structure.

First and second bit lines 565a and 565b may be disposed on the second interlayer insulating layer 560, which are in contact with the bit line contact structure. Specifically, the first bit line 565a may cross over the first semiconductor pillar 527b while it covers across the bit line contact structure to overlap an upper region between the first semiconductor pillar 527b and the second semiconductor pillar 528b. In the same manner, the second bit line 565b may cross over the second semiconductor pillar 528b while it covers across the bit line contact structure to overlap an upper region between the second semiconductor pillar 528b and the first semiconductor pillar 527b. In this case, the first and second bit lines 565a and 565b may be disposed parallel to each other.

A third interlayer insulating layer 570 may be disposed on the substrate having the bit lines 565a and 565b. Subsequently, a storage contact structure may be disposed, which sequentially penetrates the third and second interlayer insulating layers 570 and 560 and contacts the second landing pad 555b. A data storage element structure 575 may be disposed on the third interlayer insulating layer 570. The data storage element structure 575 may be a capacitor or a non-volatile data storage element structure. The non-volatile data storage element structure may include a resistor. That is, the non-volatile data storage element structure may include a lower electrode contacting the storage contact structure, a resistor contacting the lower electrode, and an upper electrode contacting the resistor.

Next, a structure of a semiconductor device according to yet other embodiments of the present invention will be described with reference to FIGS. 7D and 8D.

Referring to FIGS. 7D and 8D, a substrate 500 includes a first region and a second region. The substrate 500 may be a semiconductor substrate. An isolation region 510b may be disposed in the second region. Semiconductor pillars 810 protruding from the substrate 500 are disposed in the first region. In this case, at least one recessed region 805 may be disposed in central portions of the semiconductor pillars 810, respectively. The recessed region 805 may have a bottom surface disposed on substantially the same level as a bottom surface of the isolation region 510b.

An isolation insulating layer pattern 820 may be disposed between the semiconductor pillars 810. A bottom surface of the isolation insulating layer pattern 820 may be disposed on substantially the same level as the bottom surface of the isolation region 510b. A recessed region insulating layer pattern 815a may be disposed within the recessed region 805.

The isolation insulating layer pattern 820 may have a trench portion 817 of which the top surface is relatively lower as compared to its peripheral portions. That is, the top surface of the isolation insulating layer pattern 820 in the trench portion 817 may be lower than the top surfaces of the semiconductor pillars 810. The recessed region insulating layer pattern 815a may have a recessed region portion 816 of which the top surface is lowered compared to its peripheral portions. That is, the top surface of the isolation insulating layer pattern 820 in the recessed region portion 816 may be lower than the top surfaces of the semiconductor pillars 810.

First and second gate structures 827 and 826 crossing the semiconductor pillars 810 may be disposed. In this case, the gate structures 827 and 826 may cross the recessed region portion 816 and the trench portion 817. As a result, transistors each having a fin structure may be disposed in the semiconductor pillars 810. In addition, transistors each having a fin structure using top surfaces and outer sidewalls of the semiconductor pillars 810 as channel regions may be provided, and a highly integrated semiconductor device may also be implemented.

From a view point of a circuit, the second gate structure 826 may operate as a field gate for isolation, and the first gate structure 827 may serve as an access gate for operating the device, i.e., a word line. A description thereof is the same as the description described with reference to FIGS. 5H and 6H, so that the description thereof will be skipped. Alternatively, the second gate structure 826 may be omitted.

Two transistors may be disposed by one gate structure 827 crossing one semiconductor pillar 810. That is, the recessed region insulating layer pattern 815a having the recessed region portion 816 is formed in the central portion of one semiconductor pillar 810, so that fins facing each other of the semiconductor pillar 810 are spaced apart from each other. That is, the fins facing each other are connected to constitute one semiconductor pillar 810, however, each of the fins disposed between the second gate structures 826 may act as an active region. Accordingly, two transistors having the fin structure may be provided by one gate structure 827 crossing one semiconductor pillar 810, and each of the transistors having the fin structure may use a top surface and outer sidewalls of the fin as a channel region. Accordingly, a semiconductor device having transistors with further increased channel widths than the planar-type transistors may be provided. That is, transistors having multiple channel regions may be provided. Such transistors having the multiple channel regions may have enhanced current drivability. As a result, the operating speed of the semiconductor device having such transistors may be enhanced. Further, the integration density of the semiconductor device may be enhanced.

A first interlayer insulating layer 835 may be disposed on the substrate having the gate structures 826 and 827. A first landing pad 840a and a second landing pad 840b may be disposed, which penetrate the first interlayer insulating layer 835 and contact the source and drain regions at both sides of the first gate structure 827, respectively. A second interlayer insulating layer 845 may be disposed on the substrate having the landing pads 840a and 840b. A preliminary bit line contact structure may be disposed through the second interlayer insulating layer 845 to be electrically connected to the second landing pad 840b. The second landing pad 840b and the preliminary bit line contact structure may constitute a bit line contact structure.

Bit lines 850 contacting the bit line contact structure may be disposed on the second interlayer insulating layer 845. The bit lines 850 may be disposed in a zigzag shape, which overlaps the recessed region insulating layer pattern 815a and the isolation insulating layer pattern 820 while covering across the bit line contact structure.

A third interlayer insulating layer 855 may be formed on the substrate having the bit lines 850. Subsequently, a storage contact structure may be disposed, which sequentially penetrates the third and second interlayer insulating layers 855 and 845 and contacts the first landing pad 840a. A data storage element structure 860 may be formed on the third interlayer insulating layer 855. The data storage element structure 860 may be a capacitor or a non-volatile data storage element structure. The non-volatile data storage element structure may include a resistor. That is, the non-volatile data storage element structure may include a lower electrode contacting the storage contact structure, a resistor contacting the lower electrode, and an upper electrode contacting the resistor. The resistor may refer to a resistance element having a variable resistance.

According to the present invention as described above, methods of fabricating semiconductor devices having multiple channel transistors and the semiconductor devices fabricated thereby may be provided so that the current drivability of the semiconductor device may be enhanced. In addition, the integration density of the semiconductor device may be enhanced. Further, the multiple channel transistors are employed for cell transistors of the semiconductor memory device, so that the operating speed of the semiconductor memory device may be enhanced and the integration density may also be enhanced.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set fourth in the following claims.

What is claimed is:

1. A semiconductor device having a multiple channel transistor comprising:

a semiconductor substrate having first and second isolation regions, the first and second isolation regions defining an active region;

a first semiconductor pillar having sidewalls in the active region, a portion of the sidewalls of the first semiconductor pillar in contact with the first isolation region;

second and third semiconductor pillars in the active regions, the second and third semiconductor pillars being spaced apart from the first semiconductor pillar respectively;

a first recessed region between the first and second semiconductor pillars;

a second recessed region between the second and third semiconductor pillars;

a buffer insulating layer pattern in the second recessed region, wherein a top surface of the buffer insulating layer pattern is at substantially a same level as top surfaces of the second and third semiconductor pillars;

a gate dielectric layer on the surface of the first semiconductor pillar, the second semiconductor pillar, the third semiconductor pillar, the first recessed region, and the buffer insulating layer pattern; and a gate electrode on the gate dielectric layer.

2. The semiconductor device according to claim 1, wherein the gate dielectric layer on the buffer insulating layer pattern has a thickness that is less than that of other portions.

3. The semiconductor device according to claim 1, further comprising a fourth semiconductor pillar, the fourth semiconductor pillar in contact with the second isolation region and spaced apart from the third semiconductor pillar.

4. The semiconductor device according to claim 3, further comprising at least one more semiconductor pillar between the third and fourth semiconductor pillars.

5. The semiconductor device according to claim 1, wherein the top portion of the buffer insulating layer pattern is at a same level as that of the top surface of the first, second, and third semiconductor pillars.

6. The semiconductor device according to claim 1, wherein the top portions of the first, second, and third semiconductor pillars are at a level that is higher than the top surface of the first and second isolation regions.

7. The semiconductor device according to claim 6, wherein the bottom portions of the first and second recessed regions are at a level that is substantially the same as that of the top of the first and second isolation regions.

8. The semiconductor device according to claim 1, wherein the top portions of the first, second, and third semiconductor pillars are at a level that is substantially the same as that of the top of the first and second isolation regions.

9. The semiconductor device according to claim 1, wherein the bottom portion of the buffer insulating layer pattern are at a level that is substantially the same as that of the bottom of the first recessed region.

10. A semiconductor device having a multiple channel transistor comprising:

a semiconductor substrate having first and second isolation regions, the first and second isolation regions defining an active region;

a first semiconductor pillar having sidewalls in the active region, a portion of the sidewalls of the first semiconductor pillar in contact with the first isolation region;

second and third semiconductor pillars in the active regions, the second and third semiconductor pillars being spaced apart from the first semiconductor pillar respectively;

a first recessed region between the first and second semiconductor pillars;

a second recessed region between the second and third semiconductor pillars;

a first buffer insulating layer pattern in the first recessed region;

a second buffer insulating layer pattern in the second recessed region;

a gate dielectric layer on the surface of the first semiconductor pillar, the second semiconductor pillar, the third semiconductor pillar, the first buffer insulating layer pattern, and the second buffer insulating layer pattern; and a gate electrode on the gate dielectric layer, wherein bottom surfaces of the first and second buffer insulating layer patterns are at a level that is substantially the same as bottom surfaces of the first and second isolation regions.

11. The semiconductor device according to claim 10, wherein the top portions of the first and second buffer insulating layer patterns are at a level that is lower than the top of the first, second, and third semiconductor pillars.

12. The semiconductor device according to claim 11, wherein the bottom portions of the first and second buffer insulating layer patterns are at a level that is substantially the same as that of the bottom of the first and second isolation regions.

13. A semiconductor device having a multiple channel transistor comprising:

a semiconductor substrate having first through fourth isolation regions, the first and second isolation regions defining a first active region and the third and fourth isolation regions defining a second active region;

a first semiconductor pillar having sidewalls in the first active region, a portion of the sidewalls of the first semiconductor pillar in contact with the first isolation region;

a second semiconductor pillar in the first active region, the second semiconductor pillar being spaced apart from the first semiconductor pillar;

a first recessed region between the first and second semiconductor pillars;

a third semiconductor pillar having sidewalls in the second active region, a portion of the sidewalls of the third semiconductor pillar in contact with the third isolation region;

a fourth semiconductor pillar in the second active region, the fourth semiconductor pillar being spaced apart from the third semiconductor pillar;

a second recessed region between the third and fourth semiconductor pillars;

a gate dielectric layer on the surface of the first semiconductor pillar, the second semiconductor pillar, the third semiconductor pillar, the fourth semiconductor pillar, the first recessed region, and the second recessed region; and a gate electrode on the gate dielectric layer, wherein a width of the first recessed region is different than a width of the second recessed region.

14. The semiconductor device according to claim 13, further comprising:

a first buffer insulating layer pattern in the first recessed region; and a second buffer insulating layer pattern in the second recessed region.

15. The semiconductor device according to claim 14, wherein the gate dielectric layer is on the first and second buffer insulating layer patterns.

16. The semiconductor device according to claim 15, wherein the gate dielectric layer on the first and second buffer insulating layer patterns has a thickness that is less than that of other portions on the first through fourth semiconductor pillars.

17. The semiconductor device according to claim 13, further comprising at least one more semiconductor pillar between the third and fourth semiconductor pillars.

18. The semiconductor device according to claim 13, wherein top surfaces of the first and second buffer insulating layer patterns are at a same level as that of top surfaces of the first through fourth semiconductor pillars.

19. The semiconductor device according to claim 13, wherein top surfaces of the first and second semiconductor pillars are at a level that is higher than top surfaces of the first and second isolation regions.

20. The semiconductor device according to claim 13, wherein the top surfaces of the first and second semiconductor pillars are at a level that is substantially the same as that of top surfaces of the first and second isolation regions.

* * * * *